United States Patent [19]

Duncan

[11] Patent Number: 5,617,327
[45] Date of Patent: Apr. 1, 1997

[54] METHOD FOR ENTERING STATE FLOW DIAGRAMS USING SCHEMATIC EDITOR PROGRAMS

[75] Inventor: Robert G. Duncan, Castroville, Calif.

[73] Assignee: Xilinx, Inc., San Jose, Calif.

[21] Appl. No.: 100,521

[22] Filed: Jul. 30, 1993

[51] Int. Cl.$^6$ ............................................. G06F 17/50
[52] U.S. Cl. .................................. 364/489; 364/488
[58] Field of Search ................................. 364/488, 489, 364/490, 491, 578

[56] References Cited

U.S. PATENT DOCUMENTS

| | | | |
|---|---|---|---|
| 4,827,427 | 5/1989 | Hyduke | 364/489 |
| 4,922,432 | 5/1990 | Kobayashi et al. | 364/490 |
| 4,967,367 | 10/1990 | Piednoir | 364/489 |
| 4,970,664 | 11/1990 | Kaiser et al. | 364/521 |
| 5,051,938 | 9/1991 | Hyduke | 364/578 |
| 5,084,824 | 1/1992 | Lam et al. | 364/490 |
| 5,164,911 | 11/1992 | Juran et al. | 364/578 |
| 5,197,016 | 3/1993 | Sugimoto et al. | 364/490 |
| 5,210,699 | 5/1993 | Harrington | 364/488 |
| 5,220,512 | 6/1993 | Watkins et al. | 364/489 |
| 5,222,030 | 6/1993 | Dangelo et al. | 364/489 |
| 5,258,919 | 11/1993 | Yamanouchi et al. | 364/489 |
| 5,278,769 | 1/1994 | Bair et al. | 364/490 |
| 5,301,318 | 4/1994 | Mittal | 395/600 |

FOREIGN PATENT DOCUMENTS 1445914  8/1976  United Kingdom ............... 364/490

OTHER PUBLICATIONS

"On the Integration of a CAD System for IC Design" by E. M. da Costa, European Conference on Electronic Design Automation, 26–30 Mar. 1984, pp. 40–45.

"SYLAM: An Adaptive Symbolic Layout System" by C. Landrault et al, European Conference on Electronic Design Automation, 26–30 Mar. 1984, pp. 97–101.

"A Front End Graphic Intergace to the First Silicon Complier" by J. H. Nash et al, European Conference on Electronic Design Automation, 26–30 Mar. 1984, pp. 120–124.

Workview, Schematic Design User's Guide, Version C, May 1991, available from ViewLogic Systems, Inc., Marlboro, MA.

*Primary Examiner*—Vincent N. Trans
*Attorney, Agent, or Firm*—Edel M. Young; Michael J. Mallie

[57] ABSTRACT

A system and method for entering a circuit design into a computer using a schematic capture package. The schematic capture package is modified to include a library of state flow components represented by symbols which can be connected to produce a desired representation of the circuit design. The system allows a circuit design to be displayed on a video terminal using both state flow diagram and the schematic diagram symbols, with terminals of the state flow symbols connecting to terminals of the schematic symbols. The state flow diagram using state flow symbols is combined with a schematic diagram including schematic symbols to generate a netlist representing the combined circuit.

18 Claims, 32 Drawing Sheets

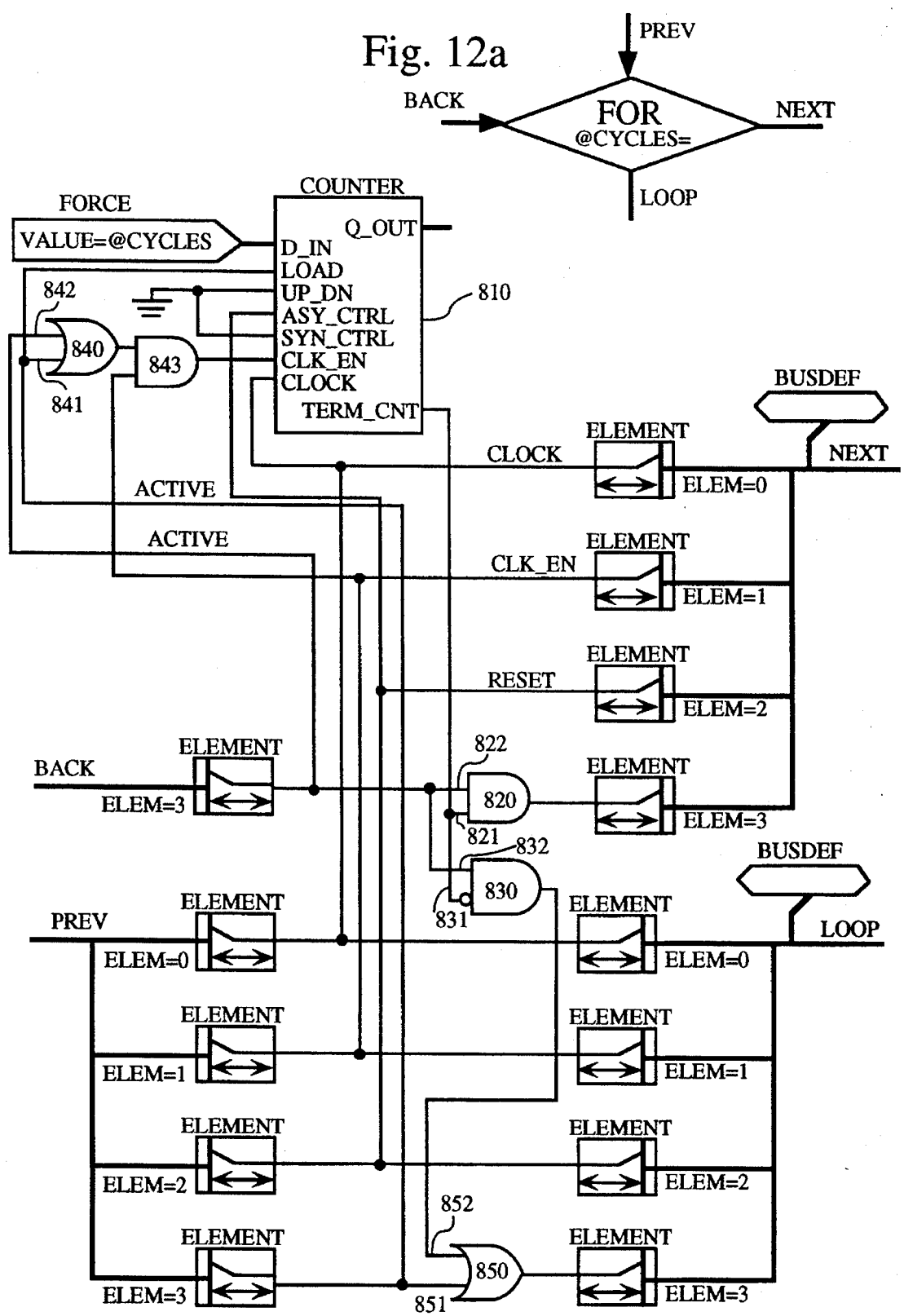

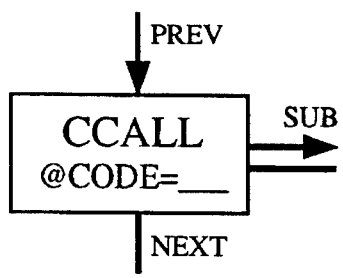
Fig. 25a
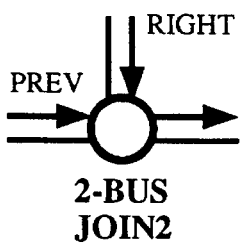
Fig. 25b
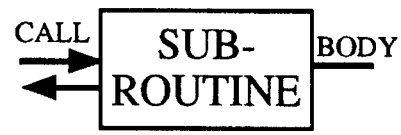
Fig. 25c
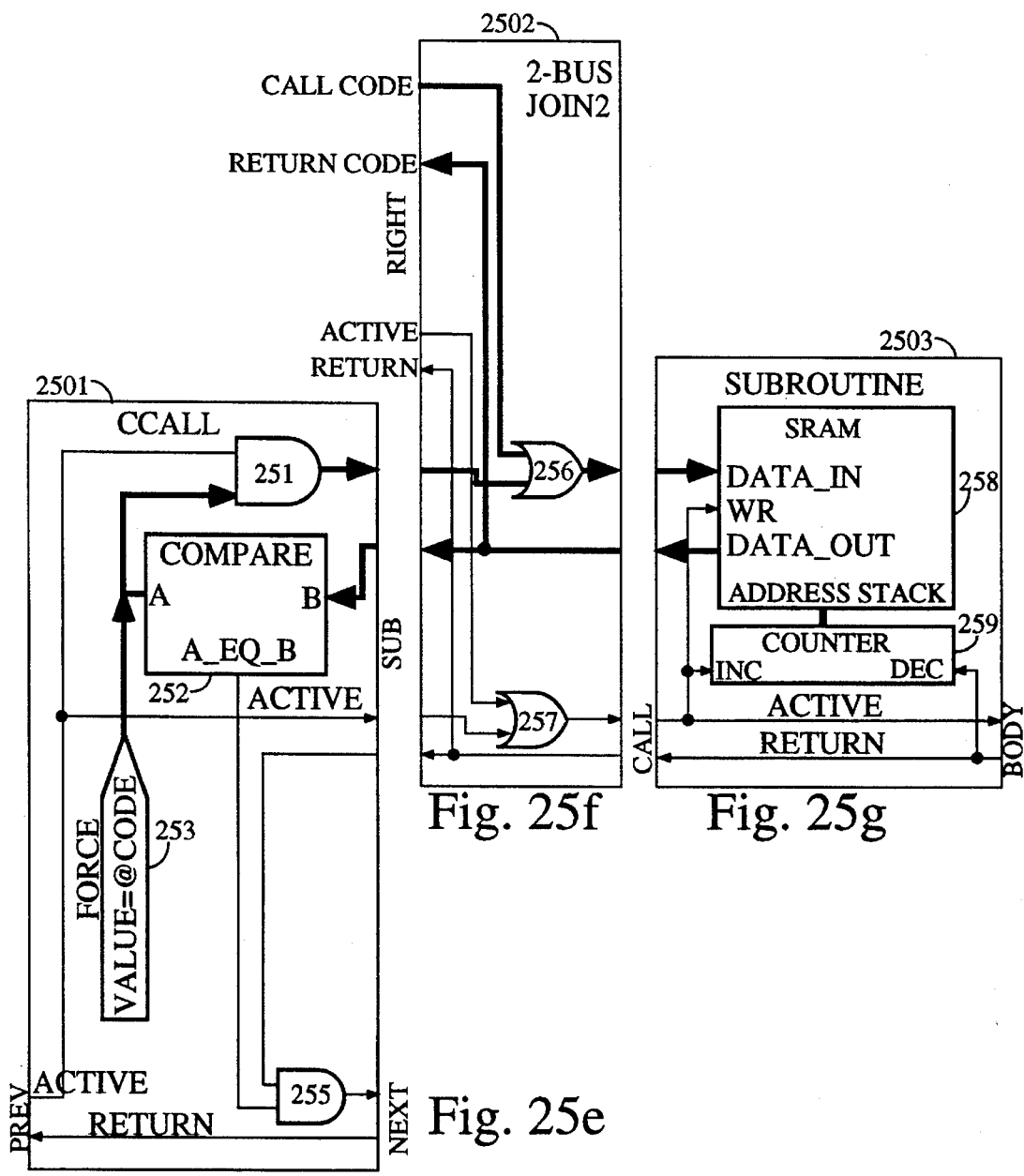
Fig. 25f
Fig. 25e
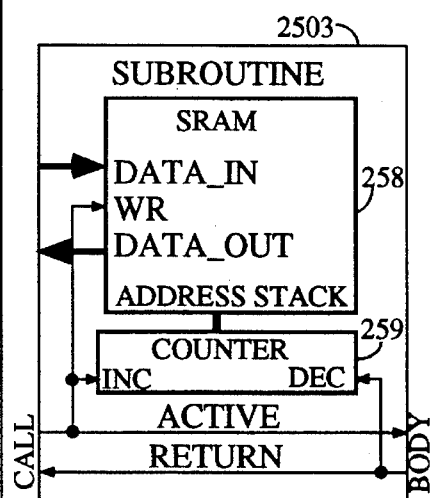
Fig. 25g

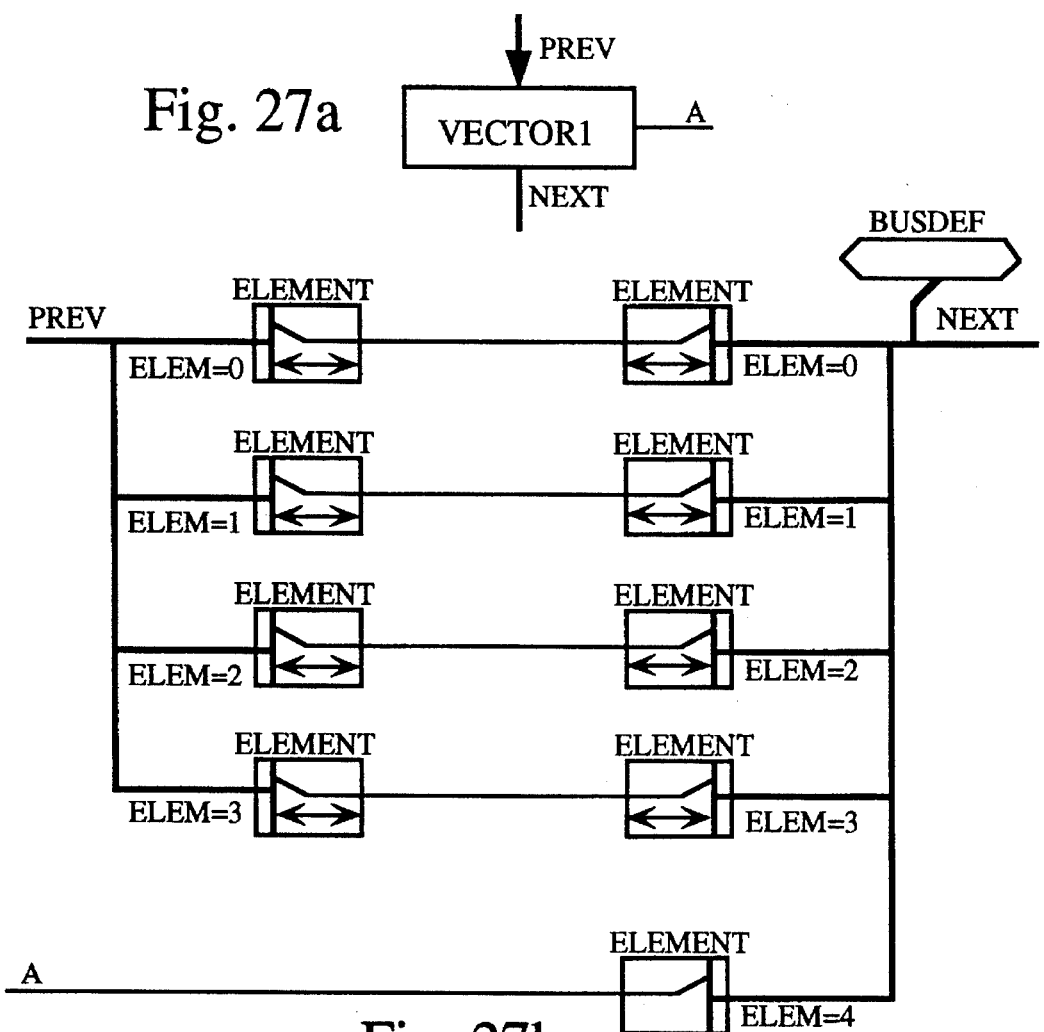
Fig. 27a
Fig. 27b
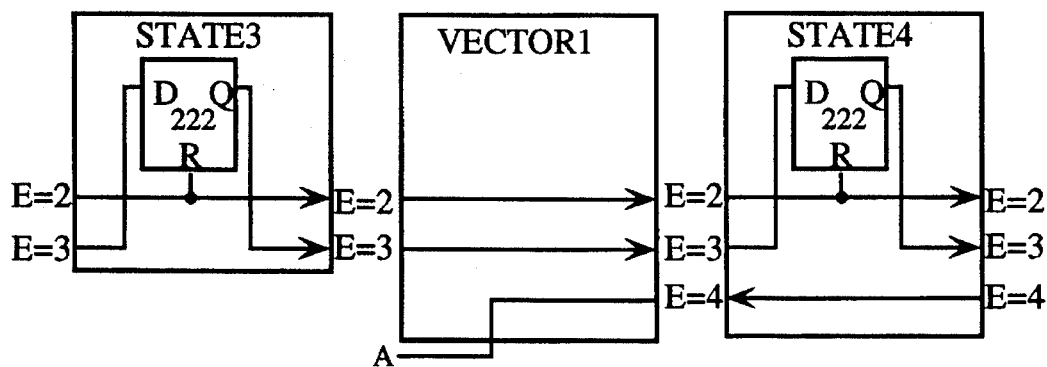
Fig. 27c

Fig. 27d
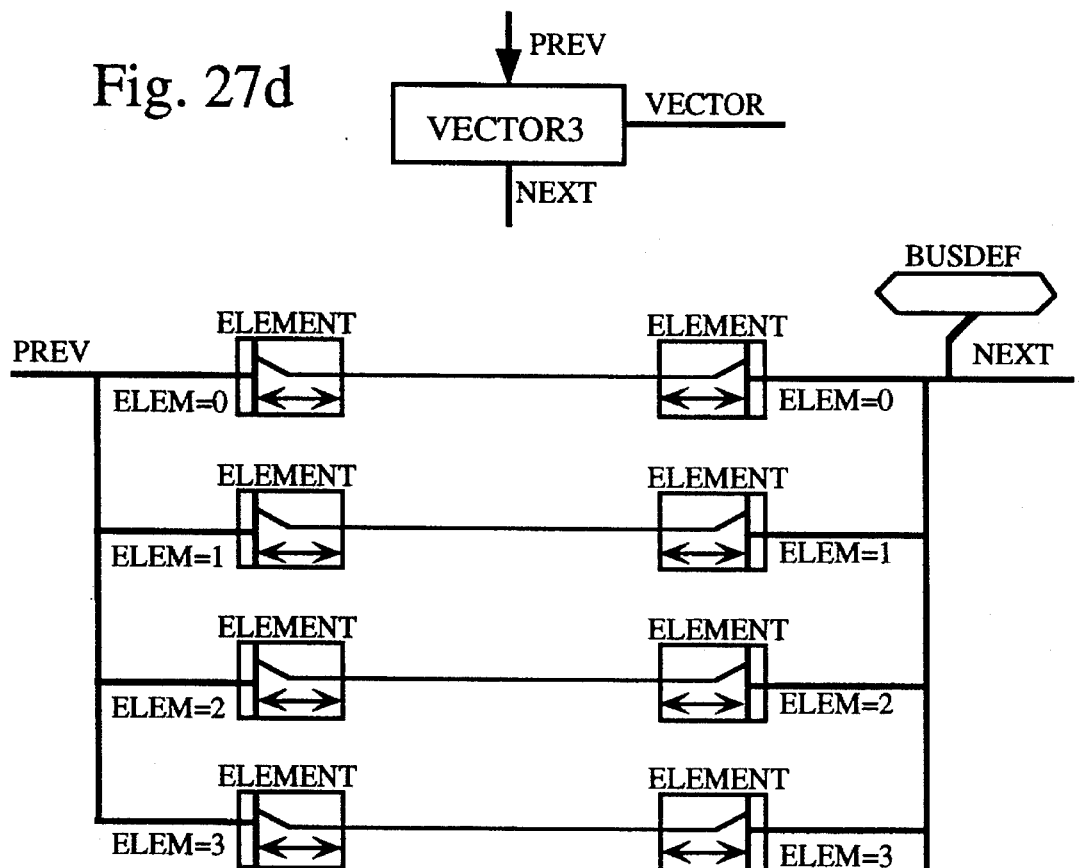
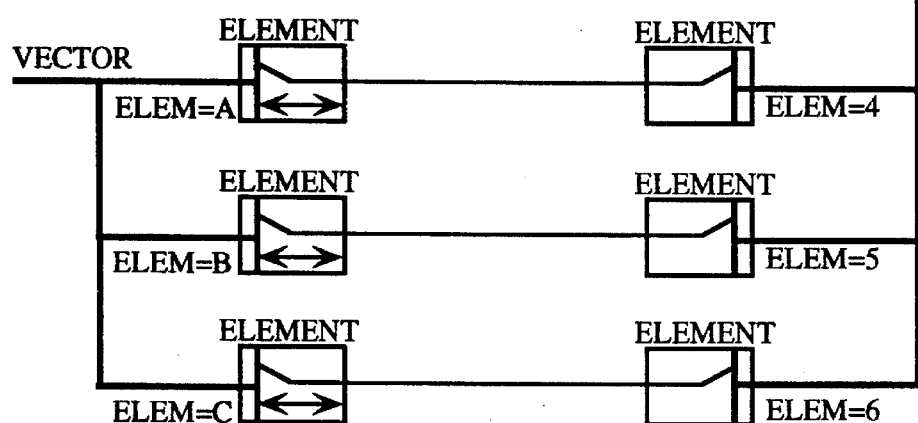
Fig. 27e

METHOD FOR ENTERING STATE FLOW DIAGRAMS USING SCHEMATIC EDITOR PROGRAMS

FIELD OF THE INVENTION

The present invention relates to computer-aided design methods for programming programmable integrated circuits, and more particularly to a system for entering a circuit design which includes both schematic diagrams and state flow diagrams into a computer.

BACKGROUND OF THE INVENTION

State Machines

State machines are sequential logic systems whose output signals are a function of previous and present input signals, in contrast to combinatorial logic systems whose output signals are a function of present input signals alone. State machines typically include one or more storage elements and occupy a plurality of states which are determined by input signals and the contents of the one or more storage elements. State machines "move" sequentially between the states (that is, one state becomes inactive and another state becomes active) in response to the input signals and transition rules established by combinatorial logic, which defines a logic "path" between the states. State machines are typically incorporated into circuits which also include other combinatorial logic and sequential logic circuitry, and frequently serve as controllers.

FIG. 1 shows a bubble flow diagram of a state machine which includes seven states, STATE 1 to STATE 7. The state machine receives input signals A through E. As indicated in FIG. 1, the state machine remains in STATE 1 until one of two transition rules is satisfied: (1) if input signal A is high, B is high, and C is low, the state machine moves into STATE 4; (2) if input signal A is high, B is low and C is high, the state machine moves into STATE 2. Similarly, the state machine remains in STATE 4 until input signal A is high, B is high and C is low. From STATE 2, the state machine enters STATE 3 if input signal D is high, or enters STATE 4 if input signal D is low. The other transition rules resulting in movements between states are also indicated.

State machines are commonly implemented in programmable logic devices. Programmable logic devices include programmable array logic devices (PALs) and field programmable gate arrays (FPGAs).

The state of a typical state machine is defined by the states (high or low output signals) of a set of flip-flops which are part of the state machine. In PALs, which have wide combinatorial logic circuitry but relatively few flip-flops, state machines are typically implemented using a highly encoded system wherein the output signals of all of the flip-flops define the active state of the state machine. For example, four flip-flops are used to define 16 separate states of a 16-state machine. Another scheme, call one-hot encoding (OHE), is frequently used to implement state machines in FPGAs, which contain numerous flip-flops but limited fan-in capability. In OHE, each state is represented by a single flip-flop. Thus, 16 flips are used to define 16 separate states. As suggested by the name OHE, only one flip-flop associated with the state machine need be in a logical "1" (hot) state to represent the active state of the state machine. OHE requires a larger number of flip-flops than are required in the highly encoded systems implemented in PAL devices, but offers higher performance (speed) because there are fewer levels of logic between the flip-flops.

Design Entry Methods

Circuit design engineers typically employ one or more computer-aided engineering (CAE) software programs to generate and test their circuit designs. Circuit designs are entered into computer memory using one of several design entry methods. Typical CAE programs include some form of netlist generator for producing netlists from circuit designs. A netlist is a listing of the components and interconnections of the circuit design which is usable either to produce a custom IC or to configure a programmable logic device.

The design entry methods used for entering circuit designs into computer memory include equations, truth tables, waveforms (timing diagrams), schematic diagrams, state (flow) diagrams and hardware description languages. Equations are groups of Boolean logic equations which describe the logic functions of a circuit. Truth tables are tabulations indicating the relation of all output logic levels of a circuit to all possible combinations of input logic levels. Waveforms or timing diagrams are graphical representations of the relationships between input signals and corresponding output signals of a circuit. Schematic diagrams are descriptions of the physical components and interconnections of a circuit. Finally, flow diagrams ("flowcharts") are functional descriptions of the logic functions of a circuit.

Schematic Diagrams

Schematic diagrams are considered by many circuit designers to be the most intuitive method of circuit design entry. Schematic diagram software programs (referred to herein as "schematic capture packages") allow a circuit design to be entered into computer memory in the form of schematic diagram comprising circuit component symbols connected by signal paths (interconnection lines). A circuit designer can "read" a schematic diagram displayed on a video screen and understand the interrelationships of the circuit components without a specialized knowledge of the schematic capture package.

As shown in FIG. 2, a schematic capture package 1000 typically includes several software tools including a component generator 1010, a schematic editor 1020, a display generator 1030 and a netlist generator 1040. A netlist is a computer memory file including a list of components (logic gates, flip flops, etc.) and interconnections between the components which represent a circuit design. The component generator 1010 allows a user to define and store schematic components in a schematic component library 1015. A schematic component is comprised of two parts: a schematic symbol which is displayed on a video monitor, and an underlying circuit design which defines the function of the schematic component. Schematic components are recognized by the schematic capture package as representing the functions of their underlying circuit designs. After a schematic component library 1015 is generated, the schematic editor 1020 is used to copy schematic components from the library and to connect the schematic components to form a circuit design which is stored in a schematic diagram file 1025. During the process of forming a schematic diagram, the display generator 1030 reads the schematic diagram file 1025 and generates a schematic diagram on a video display 1035. After completion of the schematic diagram, the netlist generator 1040 reads the schematic diagram file 1025 and converts the circuit design into a netlist 1050. Netlist 1040 differs from schematic diagram 1025 in form. The schematic diagram is a graphical illustration easily recognized by a user, while the netlist is a list of components and the lines which interconnect them, and is easily manipulated by a computer.

FIGS. 3(a) to 3(d) are provided to illustrate how the component generator 1010 (FIG. 2) is used to simplify the production of schematic diagrams. FIG. 3(a) shows a low-level schematic diagram of a multiplexer (MUX). The low-level schematic diagram is drawn at the "transistor level"; that is, the schematic diagram is comprised of individual logic element symbols representing discrete transistors. FIG. 3(b) shows a middle-level schematic diagram of the MUX. The middle-level diagram is drawn at the "gate level"; that is, related groups of transistors are represented by symbols commonly recognized by circuit designers as AND gates 1110 and 1120, and an OR gate 1130. Note that the input signals IN1 and IN2, the select signal SEL and the output signal OUT of the low-level diagram of FIG. 3(a) are identified in the middle-level diagram of FIG. 3(b). FIG. 3(c) shows a high-level symbol 1150 representing the MUX of FIGS. 11(a) and 11(b). The high-level symbol 1150 represents the MUX as a trapezoid having input terminals IN1, IN2, SEL and OUT. When the high-level symbol 1150 is entered into a schematic diagram, as shown in FIG. 3(d), the high-level symbol 1150 will be recognized by a schematic capture package as being comprised of the circuit shown in FIG. 3(a).

The process of defining high-level components in terms of lower-level schematic diagrams using the component generator 1010 (FIG. 2) is known as "hierarchy". Hierarchy greatly reduces the time necessary to generate a circuit diagram because it allows the circuit designer a short-hand method of entering commonly-known or repeatedly-used circuit structures. Further, the higher-level symbols, such as the MUX symbol of FIG. 3(c), are well known; therefore, circuit designers need not design at the transistor level, which is time-consuming and tedious. Schematic capture programs typically provide a library of commonly-used schematic components. In addition, schematic component libraries are provided by programmable logic device manufacturers. Also, a library may be supplemented by schematic components generated by the user.

The schematic editor 1020 of a schematic capture package 1000 is a user's schematic diagram production tool. With the schematic editor 1020, the user accesses the schematic component library 1040 and copies the schematic components into a schematic diagram file 1025. The user draws signal lines between the input and output terminals of the schematic components to produce a representation of a desired circuit design. As the user enters the schematic components and interconnecting lines into computer memory, the computer generates a graphic representation of the schematic diagram on a video display terminal 1035 in which the symbols representing the schematic components are shown along with interconnection lines representing conductive signal paths for transmitting signals between the schematic components. The user "reads" the displayed schematic diagram by looking at the signal paths and schematic components shown on display terminal 1035. The user then modifies or adjusts the circuit design by modifying the schematic diagram file 1025 based on feedback provided from display terminal 1035.

Finally, after a user is satisfied with having entered a circuit design into the computer using the schematic editor 1020, the netlist generator 1030 reads the schematic diagram file 1025 and converts the circuit design into a netlist 1050.

A presently available schematic capture package is Workview™, which is available from ViewLogic Systems, Inc., having a principle place of business at Marlboro, Mass.

A disadvantage of prior art schematic capture packages is that when a circuit design includes a state machine, the schematic diagram of the state machine, which must be entered by the user, typically fails to intuitively present the logic defining the state machine.

Flow Diagrams

Flow diagrams (flowcharts) are considered by many circuit designers to be the most intuitive design entry method for entering state machine descriptions into computer memory. Flow diagrams are graphical and/or text based descriptions which illustrate the paths between the states of a state machine.

FIG. 4 shows an example of a flow diagram of a four-state machine. In FIG. 4, the rounded rectangles 41 through 44 indicate individual states and the diamonds 45, 46 indicate decision branches controlled by test signals (not shown). Linking the states and decision branches are arrows 51 through 56 indicating flow paths. The state machine moves from state to state along the flow paths as directed by the decision branches of the flow diagram.

Kobayashi et al. U.S. Pat. No. 4,922,432 teaches a CAE flow diagram program which allows a circuit designer to enter a state machine as a flow diagram comprised of blocks representing states, diamonds representing decision branches, and arrows indicating the logic paths linking the states and decision branches. Associated with one or more of the states is a textual description of logic controlled by that state. In addition, each decision branch identifies a logic equation stored in memory.

However, Kobayashi et al. does not display the combinatorial and sequential logic circuitry which is associated with the state machine. That is, although a user can understand the logic of the state machine, the user cannot easily understand the relationships between the state machine and the related circuit design. Specifically, for applications in which the state machine is a small part of the overall circuit design, it can be difficult for the circuit designer to comprehend the overall circuit design.

Another disadvantage of the above-mentioned flow diagram program is that it requires a user to learn a new design entry format which is incompatible with a schematic capture package. Circuit designers who are familiar with schematic capture packages may find the new format difficult to learn. Further, because the flow diagram program is incompatible with schematic capture packages, a user must purchase both the flow diagram program and a schematic capture package in order to enter circuit designs in both the schematic diagram format and the flow diagram format. These programs are typically expensive.

SUMMARY OF THE INVENTION

The present invention overcomes the disadvantages of the prior art by providing a method and a system wherein a schematic capture package includes state components having associated symbols which can be arranged into a state flow diagram. The state flow diagram can be located on the same graphic display as a circuit diagram, and connected with schematic symbols of the schematic diagram. This improves the ability of a user to enter and edit a circuit design for use in producing a custom IC or to configure a programmable logic device because state machine information can be entered in a flow diagram format.

In one embodiment of the invention, the state flow components include START, STATE, IF and JOIN components which are connected by a flow bus. The START and STATE components include ACTIVE output signal lines which can be connected to schematic components to provide information regarding the active state of a state machine. The IF component includes a TEST input line which can receive a signal from a schematic component to direct the flow of the state machine along one of two flow bus segments. The JOIN component combines signals from two or more flow bus segments. In addition to the above-mentioned state flow components, additional higher-level components can be defined by the user.

In another embodiment, the components include START, STATE, IF, JOIN2, JOIN3, PAUSE, FOR, CALL, RETURN, STOP, and SPAWN. The PAUSE component can replace a specified number of STATE symbols. The user enters the number in a space provided on the symbol. The PAUSE symbol thus saves chip hardware. The FOR symbol is used to create iterative FOR loops and also includes a cycle number. The CALL symbol calls a subroutine and the RETURN symbol returns from the call. The SPAWN symbol provides a splitting point for a state machine with multiple active branches. When a SPAWN symbol is used, the system no longer has the characteristic of having only one state active at one time. With a state machine having multiple active branches, care must be taken to assure that the separate branches do not corrupt the integrity of each other.

In yet another embodiment, the components further include ACTIVATE and TAP symbols. The ACTIVATE symbol induces a state to become active in response to an event external to the state diagram. Like the SPAWN symbol, the ACTIVATE symbol may cause a state machine to have more than one active state at one time. The complement to the ACTIVATE symbol is the TAP symbol. The TAP symbol generates a signal for controlling a part of the system external to the state diagram.

In other embodiments additional symbols or combinations of symbols are provided. If it is desired to provide additional state machine symbols, it is not necessary to write new software except to the extent of creating a new symbol and its underlying circuit, and adding this to the existing library.

As another feature of the invention, a set of components having invalid state elimination logic is included. These symbols force certain states to become inactive in response to particular states becoming active, thus overcoming invalid states which may result from power glitches or other unexpected phenomena.

A system incorporating the present invention includes a schematic editor program which accesses a library containing one or more state flow symbols, each having an active output terminal, and one or more schematic symbols. The state flow symbols can be arranged to form a state flow diagram whose logic is easily comprehended by a user. The input or output terminal of at least one state flow symbol is connected to at least one schematic symbol to produce a single graphical representation of a circuit design.

BRIEF DESCRIPTION OF THE DRAWINGS

These and other features, aspects, and advantages of the present invention will become better understood with regard to the following description, appended claims and accompanying drawings.

FIG. 10b shows an equivalent schematic diagram for the display of FIG. 10a.

FIG. 11c shows use of the PAUSE component in the UART example of FIG. 10a.

FIGS. 12a and 12b show a symbol and equivalent circuit for a FOR component in accordance with the present invention.

FIGS. 25a through 25f show symbols and circuits for a coded CALL or CCALL component, a 2-BUS JOIN2 component and a SUBROUTINE component which are used together.

FIGS. 27a and 27b show a VECTOR1 component and its equivalent circuit. FIG. 27c shows a simplified circuit diagram of the VECTOR1 component used to connect a STATE3 component with a STATE4 component.

FIGS. 27d and 27e show a VECTOR3 component and its equivalent circuit.

DETAILED DESCRIPTION OF THE DRAWINGS

Figure 1:
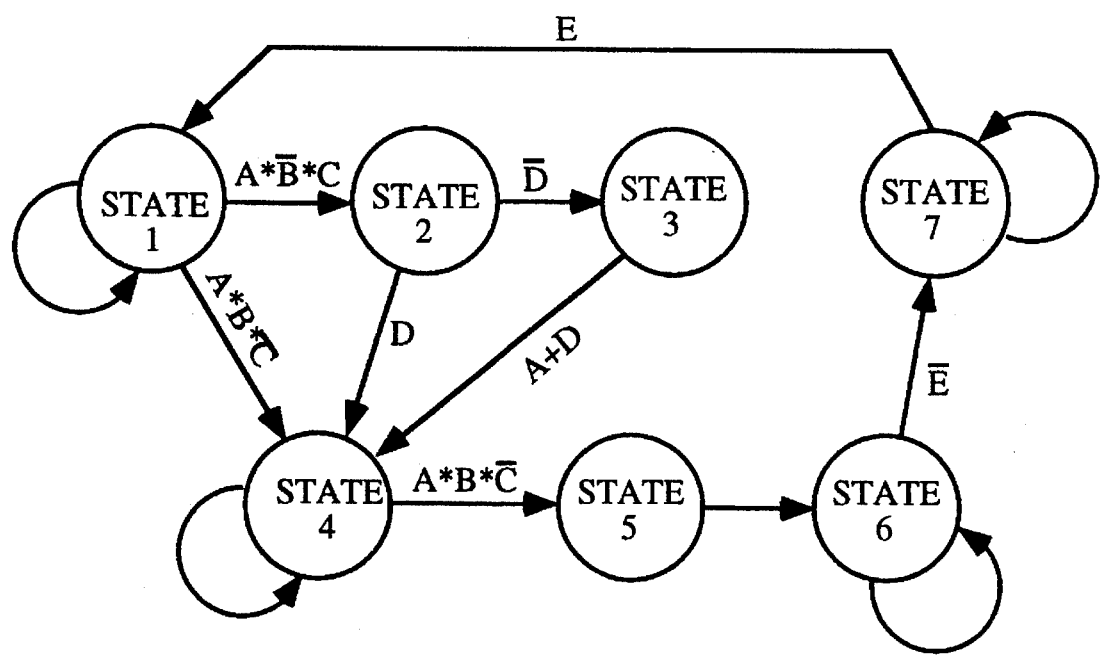
FIG. 1 shows a bubble diagram illustrating a state machine.
Figure 2:
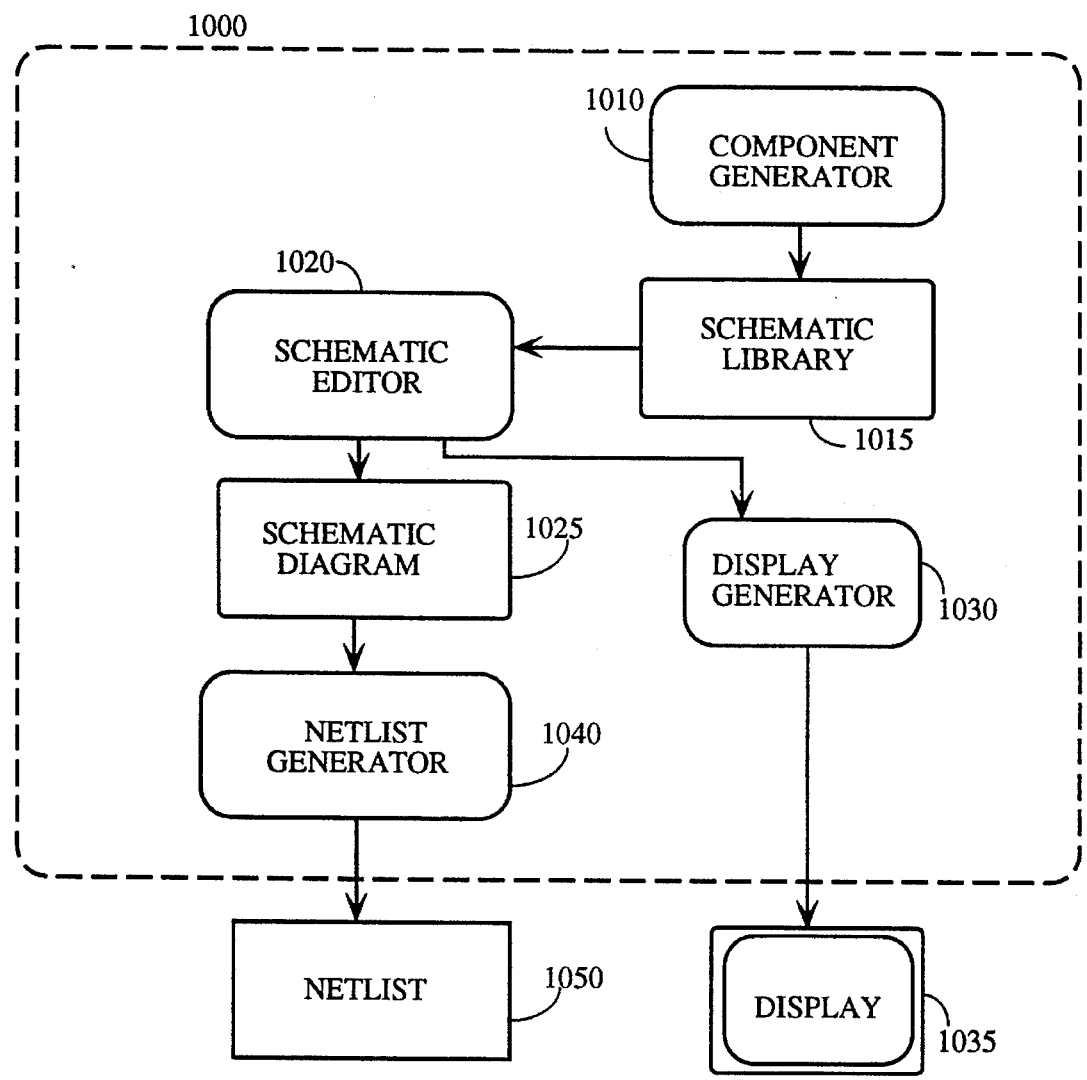
FIGS. 2 shows the main portions of a prior art schematic capture package.
Figure 3A:
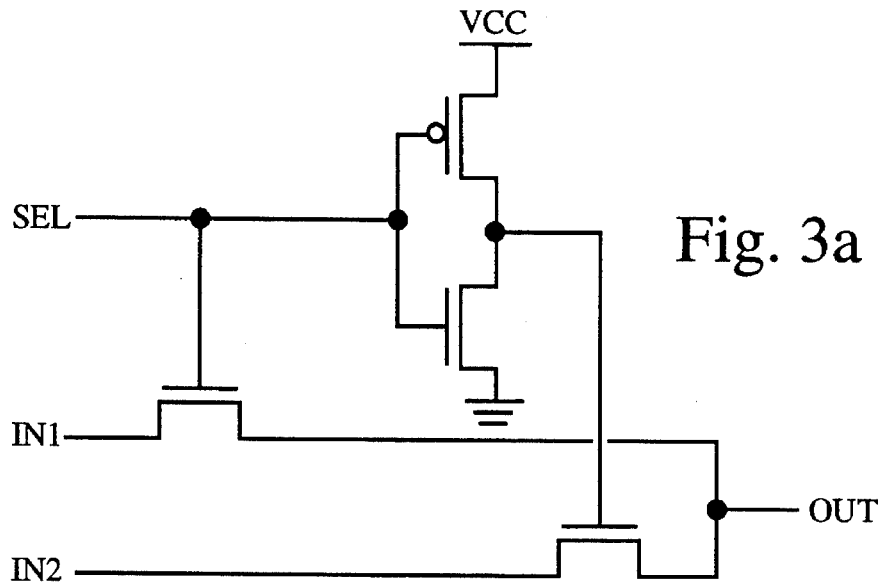
FIG. 3a through 3d various levels of schematic diagrams.
Figure 3B:
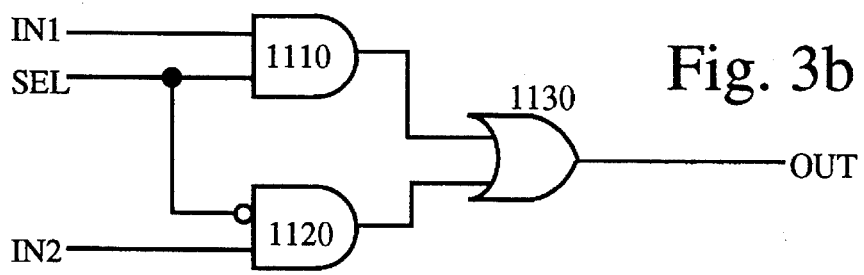
Figure 3C:
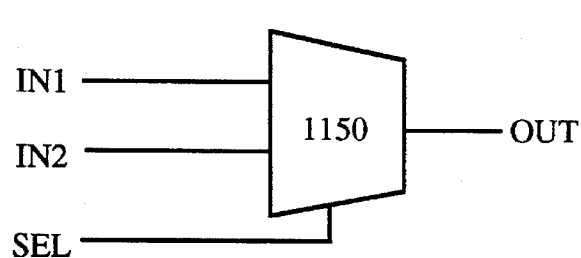
Figure 3D:
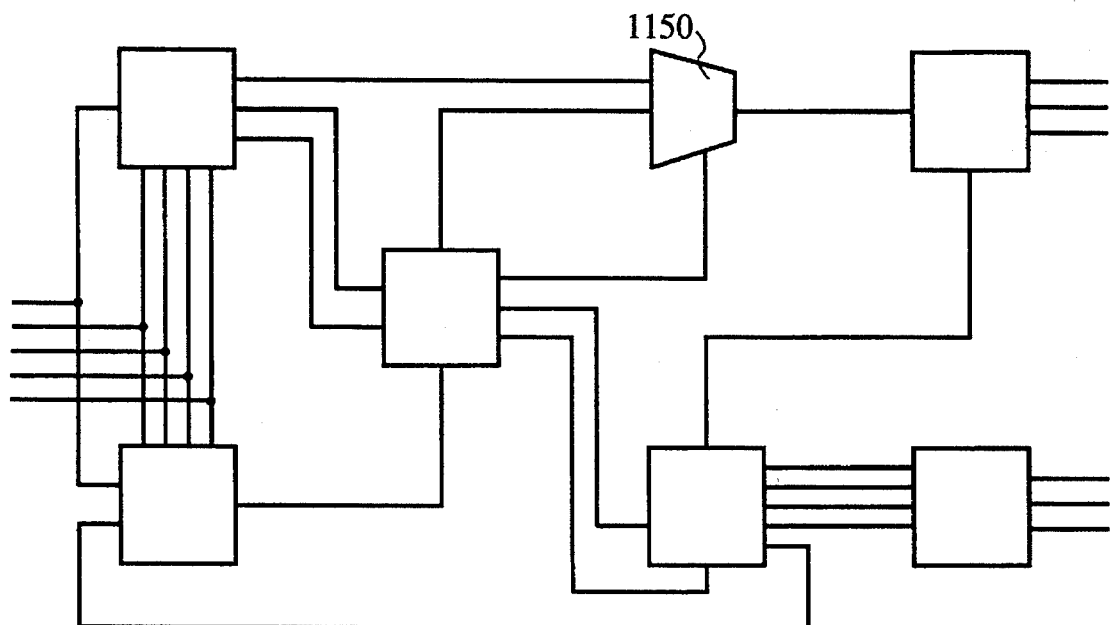
Figure 4:
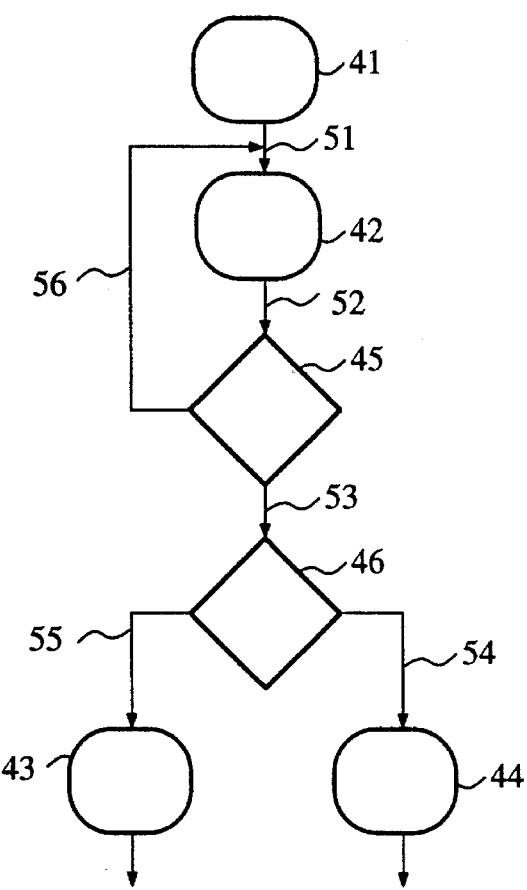
FIG. 4 shows a logic flow diagram of a state machine.

In the following description of the present invention a "circuit design" includes both state flow components and schematic components. State flow components include state components and other components indicating decision branches and flow control. Schematic components include combinatorial circuits and general purpose sequential logic circuits, including counters, registers and flip-flops.

System Overview

In accordance with the present invention, a system and method for entering circuit designs into a computer is disclosed which allows both schematic diagram symbols and state flow diagram symbols to be displayed together on a computer video terminal and interpreted together by a schematic capture program. In one embodiment of the present invention, a commercially-available schematic capture package is modified to include a library of state flow components. Like a schematic component, a state flow component includes two parts: a state flow diagram symbol which is displayed on a video monitor, and an underlying circuit design which defines the function of the state flow component. The state flow diagram symbols can be arranged on a video terminal to represent a state flow diagram. At least one of the state flow diagram symbols includes input and/or output terminals which can be connected to the terminals of conventional schematic components. The library of state flow components can be accessed by the schematic capture package along with a library of schematic components, thereby allowing a circuit design to be created which is displayed as a combination of a schematic diagram symbols and flow diagram symbols. Further, the interaction of the state flow components and the schematic components are displayed using typical interconnect lines (signal paths) connected between the terminals of one or more state flow symbols and the terminals of one or more schematic symbols.

An advantage of the present invention is that an existing schematic capture package can translate the state flow diagram to a computer usable form (for example, a netlist) using the same software as is used to translate other schematic symbols. Therefore, existing schematic capture packages can be modified to incorporate the present invention simply by adding the library of state flow components, as described below.

Another advantage of the present invention is that the circuit designer need not purchase new software, but need only modify an existing schematic capture package to include the library of basic state flow components described below. Further, the circuit designer can expand the library of basic state flow components to include higher level state flow components, as discussed below.

One Embodiment of the Invention

In one embodiment, Xilinx, Inc., XC4000-series field programmable gate arrays (FPGAs) (described in THE XC4000 DATA BOOK, (copyright 1992) published by xilinx, Inc., of 2100 Logic Drive, San Jose, Calif., 95124) are programmed in accordance with the present invention. A feature of Xilinx FPGAs which works well with the present invention is the abundance of D flip-flops. As discussed in the background section, when state components are represented by flip-flops in the one-hot encoding (OHE) method, one flip flop is used to represent each state. Therefore, state flow components associated with the individual states of a state machine can be implemented by a flip-flop and associated logic.

System Context

The system incorporating the present invention can be implemented using Workview™ 4.1 schematic capture package, Series I, including Viewdraw™-LCA Version 4.0 modified to include Xilinx XACT® software which includes an X-BLOX™ symbol library. workview™ is available from ViewLogic Systems of Marlboro, Mass. The Xilinx XACT® software and X-BLOX™ library are available from xilinx, Inc.

The Workview™ software package runs on any IBM-compatible computer including a 386 microprocessor using DOS 3.0 or higher. The recommended configuration uses 16 megabytes of RAM to run the necessary software, and requires user interfaces including a VGA display monitor, a manually operated keyboard, a mouse and preferably 60 megabytes of hard-disk memory.

X-BLOX™ is a library of symbols which simplify the entry of the flow diagram, described below. The operation and installation of the X-BLOX™ package into Workview™ is taught in the X-BLOX™ Design Tool User Guide, available from Xilinx, Inc.

Major Component Overview

Figure 5:
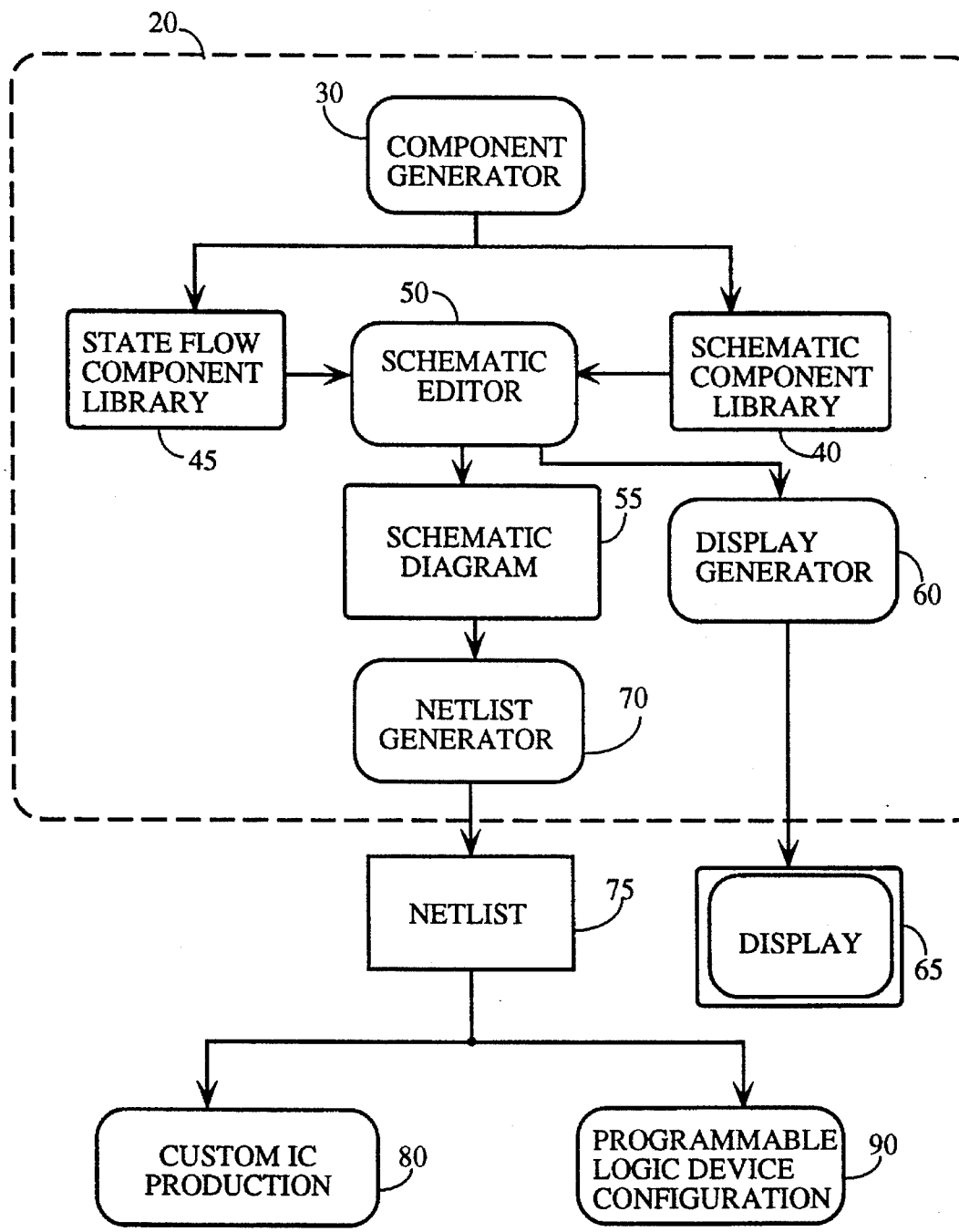
FIG. 5 shows a block diagram of a system incorporating the present invention.

As shown in FIG. 5, a CAE system incorporating the present invention includes a library of state flow components 45 in a schematic capture package 20. The schematic capture package 20 is comprised of a component generator 30, a schematic editor 50, a display generator 60 and a netlist generator 70.

The component generator 30 is used to create user-defined schematic components and state flow components. The user-defined components are stored in the schematic component library 40 and the state flow component library 45. The component generator 30 may be combined with the schematic editor 50.

The schematic components library 40 is typically provided as a part of a schematic capture package 20, but additional schematic components can also be added by a user. A source of additional schematic components is from programmable logic device manufacturers. For instance, the X-BLOX™ software from Xilinx, Inc., provides a library of schematic components, which include a D flip-flop, a counter and a register, all of which include placement and routing instructions to be implemented in the xC4000-series FPGA. X-BLOX™ components in the Xilinx library have features related to the representation of buses which are used to simplify the state flow components, as discussed below.

The schematic editor 50 is used to enter schematic components from the schematic component library 40 and state flow components from the state flow component library 45 into the circuit design file 55. In addition, the schematic editor 50 is used to enter bus flow lines connecting the state flow components to form a flow diagram representing a first portion of a circuit design. The schematic editor 50 is also used to enter signal lines connecting the schematic components to produce a schematic diagram representing a second portion of the circuit design. The schematic editor 50 is also used to connect state flow components to schematic components.

The display generator 60 reads the circuit design file 55 and generates signals which drive a video display 65. The image generated by the video display 65 provides feedback to the user such that the user can modify the contents of the circuit design file 55 until it contains a desired circuit design.

After the desired circuit design is entered into the circuit design file 55, the netlist generator 70 reads the circuit design file 55 and converts the circuit design into a netlist 75. The netlist 75 is used to produce custom ICs 80 or to configure programmable logic devices 90 to implement the desired circuit design.

Basic State Flow Components

In one embodiment of the present invention, four basic state flow components, START, STATE, IF and JOIN2, are provided in a library, and can be arranged to form state flow diagrams. The basic state flow components provide the minimum amount of flow diagram logic necessary to implement most state machines.

The basic state flow components are entered into a library for use with the Workview™ schematic capture package using methods described in the XILINX USER GUIDE AND TUTORIALS, published by Xilinx, Inc. (1991). Further information regarding X-BLOX™ schematic components used to define the state flow components is provided in the X-BLOX™ Design Tool User Guide, available from Xilinx, Inc.

START Component

Figure 6A:
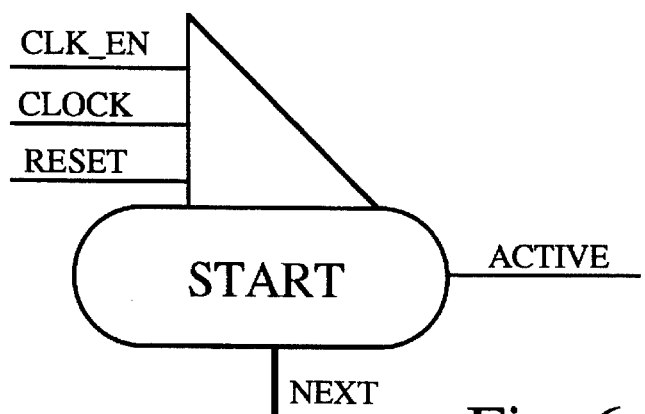
FIG. 6a shows a symbol for a START component in accordance with the present invention.

FIG. 6a shows a symbol for a START component. The START component determines the initial state of a state machine. That is, when the computer is powered up or when a state machine is reset, the only active state of the state machine is the START state indicated by the START component. Each flow diagram incorporating the basic flow components according to the present invention includes one START component.

Figure 6B:
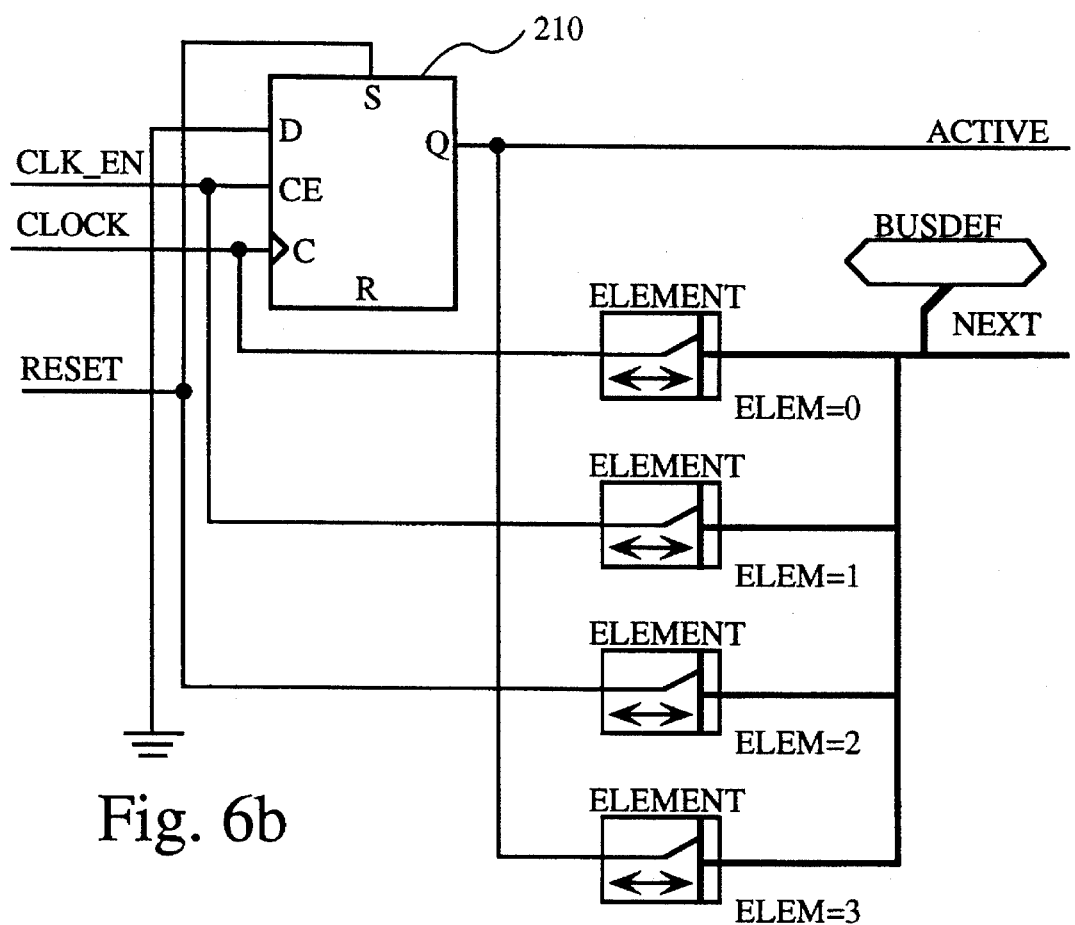
FIG. 6b shows the equivalent circuit for the START symbol of FIG. 6a using schematic components provided in the X-BLOX™ symbol library available from Xilinx, Inc.

FIG. 6b shows the circuit for the START component. As shown in FIG. 6b, the START component comprises a D flip-flop 210. Signal paths CLK_EN, CLOCK and RESET are connected to the clock enable (CE), clock (C) and set (S) terminals of D flip-flop 210. The D input terminal of D flip-flop 210 is connected to ground. The Q output terminal of D flip-flop 210 is connected to the ACTIVE signal path, which is used to connect the START component to schematic components. The START component further includes a NEXT flow bus which is defined using the BUS DEF and ELEMENT schematic components provided by the X-BLOX™ library. The BUS DEF component identifies the number of signal lines associated with the NEXT flow bus. The ELEMENT components identify individual signal lines "ELEM=0", "ELEM=1", "ELEM=2" and "ELEM=3", of the NEXT flow bus. In this embodiment, the ELEM=0 signal line is connected to receive the CLOCK signal, the ELEM=1 signal line is connected to receive the CLK_EN signal, the ELEM=2 signal line is connected to receive the RESET signal, and the ELEM=3 signal line is connected to receive the ACTIVE signal generated from the Q output terminal of D flip-flop 210.

In operation, a START component transmits a high output signal on the ACTIVE signal line when the RESET signal line is high. The high ACTIVE signal is also applied to the ELEM=3 signal line of the NEXT flow bus. When RESET goes low, the Q output signal remains high for the remainder of the clock cycle, after which time the Q output signal goes low. Note that because the D input terminal of D flip-flop 210 is connected to ground, a START component can only generate a high Q output to the ACTIVE signal line upon reset of the system.

STATE Component

Figure 7A:
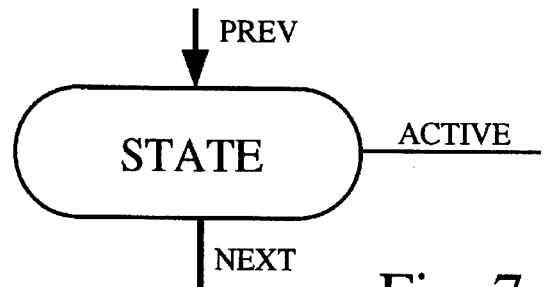
FIGS. 7a and 7b show a symbol and equivalent circuit for a STATE component in accordance with the present invention.
Figure 7B:
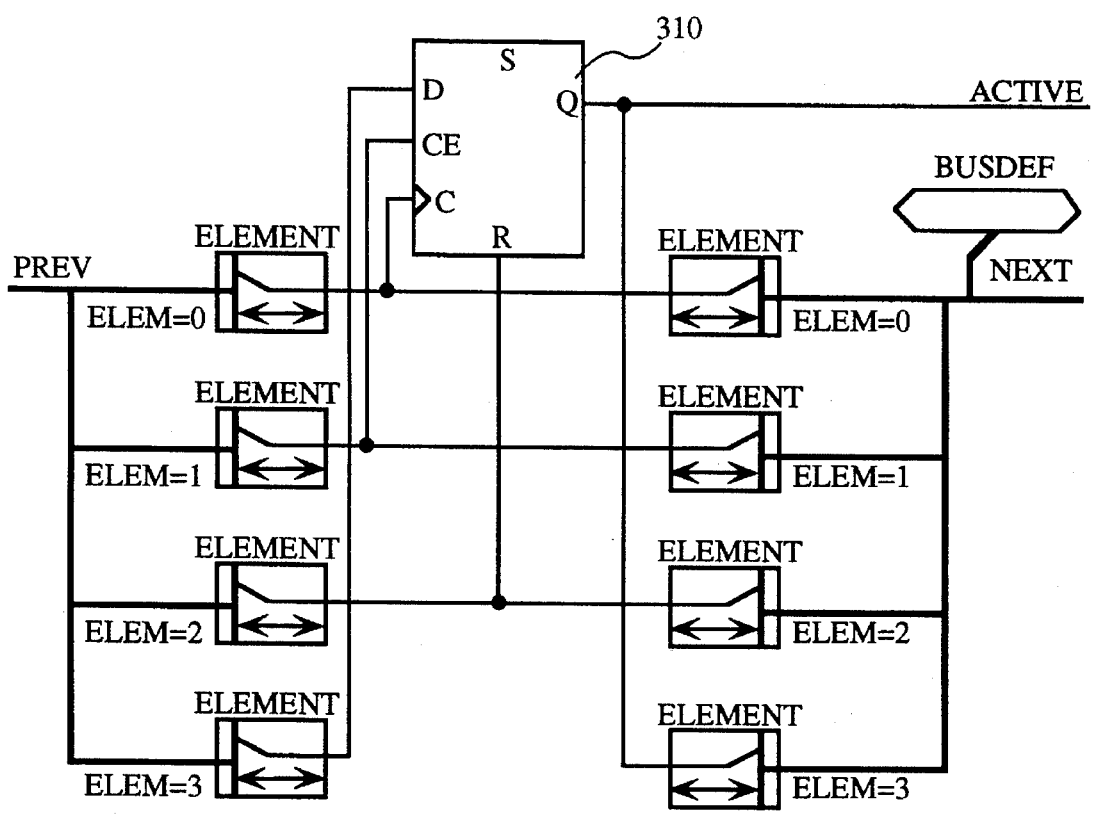

FIGS. 7a and 7b show the symbol and circuit, respectively, for a STATE component. A STATE component represents a finite state of a state machine. STATE components are connected to the flow bus of a state flow diagram and generate a high ACTIVE signal when activated by another state flow component.

Similar to the START component, the STATE component comprises a D flip-flop 310 connected to the flow bus such that the CLOCK signal transmitted on the ELEM=0 signal line is connected to the C (clock) input terminal, the CLK_EN signal transmitted on the ELEM=1 signal line is connected to the CE (clock enable) input terminal, the RESET signal transmitted on the ELEM=2 signal line is connected to the R (reset) terminal, and the ELEM=3 signal line is connected to the D input terminal. Unlike the START component, the STATE component includes both PREV and NEXT flow bus connections, which are used to connect the STATE component between two other state flow components. In addition, because the RESET signal is connected to the R input terminal, the STATE component outputs a low signal on the Q output terminal when reset. After the reset signal goes low, when a high signal is applied to the D input terminal from the ELEM=3 signal line from the PREV flow bus connection, the STATE component outputs a high signal on the Q output terminal upon a rising CLOCK signal transition. Similar to the START component, the STATE component also includes an ACTIVE signal line connected to the Q output terminal of D flip-flop 310. The ACTIVE signal line is connected to the ELEM=3 signal line of the NEXT flow bus connection, and can also be connected to schematic signal lines.

In operation, the STATE component applies an inactive (low) signal on the ACTIVE signal line until a high signal is applied to the D input terminal of D flip-flop 310 from the ELEM=3 signal line of the PREV flow bus. When activated, the STATE component applies a high output signal on the ACTIVE signal line for one cycle of the clock, while the clock enable signal CLK_EN is asserted. After the clock cycle, the STATE component will either output a low cycle if the D input remains low, or a high output if the D input remains high.

JOIN Components

Figure 8A:
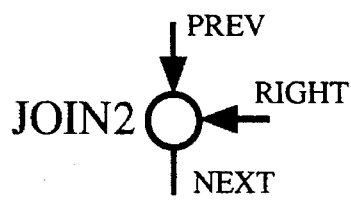
FIGS. 8a and FIG. 8b show a symbol and equivalent circuit for a JOIN component in accordance with the present invention.
Figure 8C:
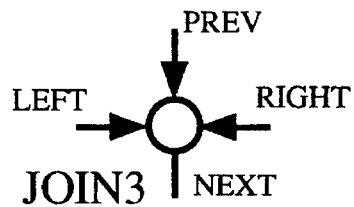
FIG. 8c shows another JOIN component.

FIGS. 8a and 8c illustrate two JOIN state flow components, JOIN2 and JOIN3. The JOIN components are used as junction points to combine signals from two or more flow buses into one flow bus. The JOIN components facilitate branching of a state flow diagram by providing means for joining two or more flow bus branches.

Figure 8B:
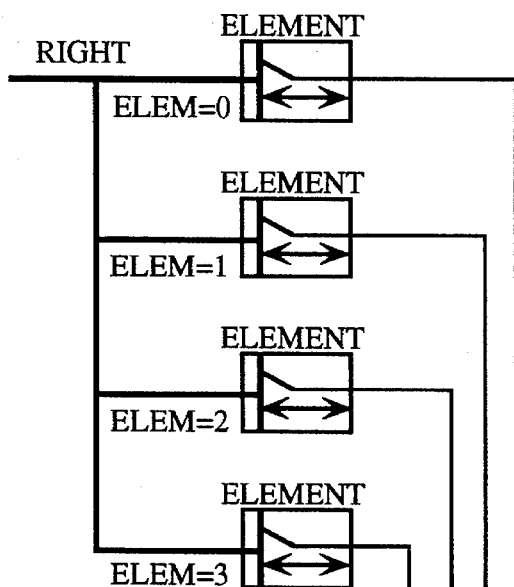
Figure 8B:
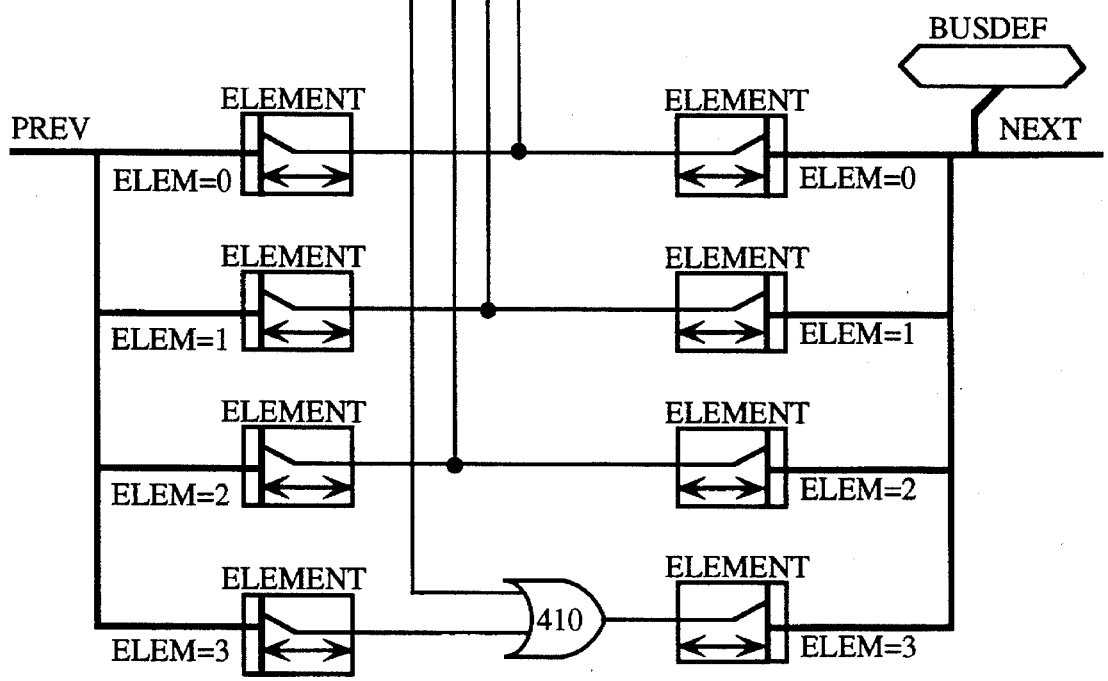

As shown in FIG. 8b, the two-input JOIN2 component of FIG. 8a is comprised of an OR gate 410 connected to the ELEM=3 signal lines of two input flow buses. In the illustrated example, the input flow buses are identified as PREV and RIGHT. The output of OR gate 410 is connected to the ELEM=3 signal line of a NEXT flow bus. In addition, the ELEM=0 signal lines, the ELEM=1 signal lines, and the ELEM=2 signal lines from the PREV and RIGHT flow buses are connected to the ELEM=0 signal line, the ELEM=1 signal line, and the ELEM=2 signal line of the NEXT flow bus, respectively. In operation, a high signal on the ELEM=3 signal lines of either the PREV or RIGHT flow buses is applied to the ELEM=3 signal line of the NEXT flow bus.

Note that there is contention if two signal input lines having different signals are joined together as shown for the ELEM=0, ELEM=1 and ELEM=2 lines of the RIGHT and PREV buses. However, in the present embodiment, these lines carry the same signal on both buses; ELEM=0 carries the clock signal, ELEM=1 carries the clock enable signal, and ELEM=2 carries the reset signal. An implementation can be provided in which only the ELEM=3 line of the RIGHT bus is connected, and this implementation will be preferred for designs in which the clock signal or other signals are gated, producing some delay, and where contention is possible. However, if the ELEM=0 through ELEM=2 signal lines from the RIGHT flow bus are not provided, situations may occur in which a clock signal is not provided to components downstream. Therefore, in the embodiment of FIG. 8b, all lines of the RIGHT flow bus are connected in the JOIN2 symbol implementation. The user must take care to use a symbol appropriate for the particular design.

FIG. 8c shows a three-input JOIN3 symbol which receives signals from three flow buses: PREV, LEFT and RIGHT. The underlying circuitry of the three-input JOIN3 symbol is similar to the two-input JOIN2 symbol shown in FIGS. 8a and 8b with the addition of a third ELEM=3 signal line to the OR gate 410. Therefore, a high signal on the ELEM=3 signal lines of either the PREV, RIGHT or LEFT flow buses is applied to the ELEM=3 signal line of the NEXT flow bus.

IF Component

Figure 9A:
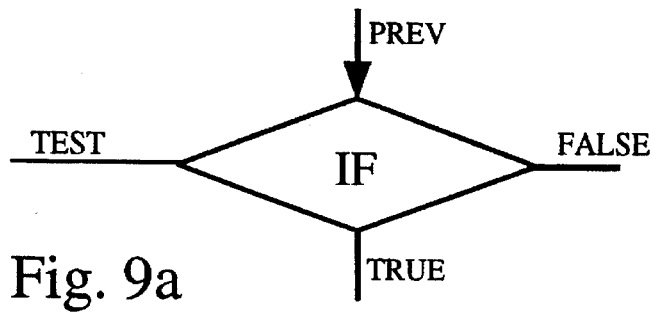
FIGS. 9a and 9b show a symbol and equivalent circuit for an IF component.
Figure 9B:
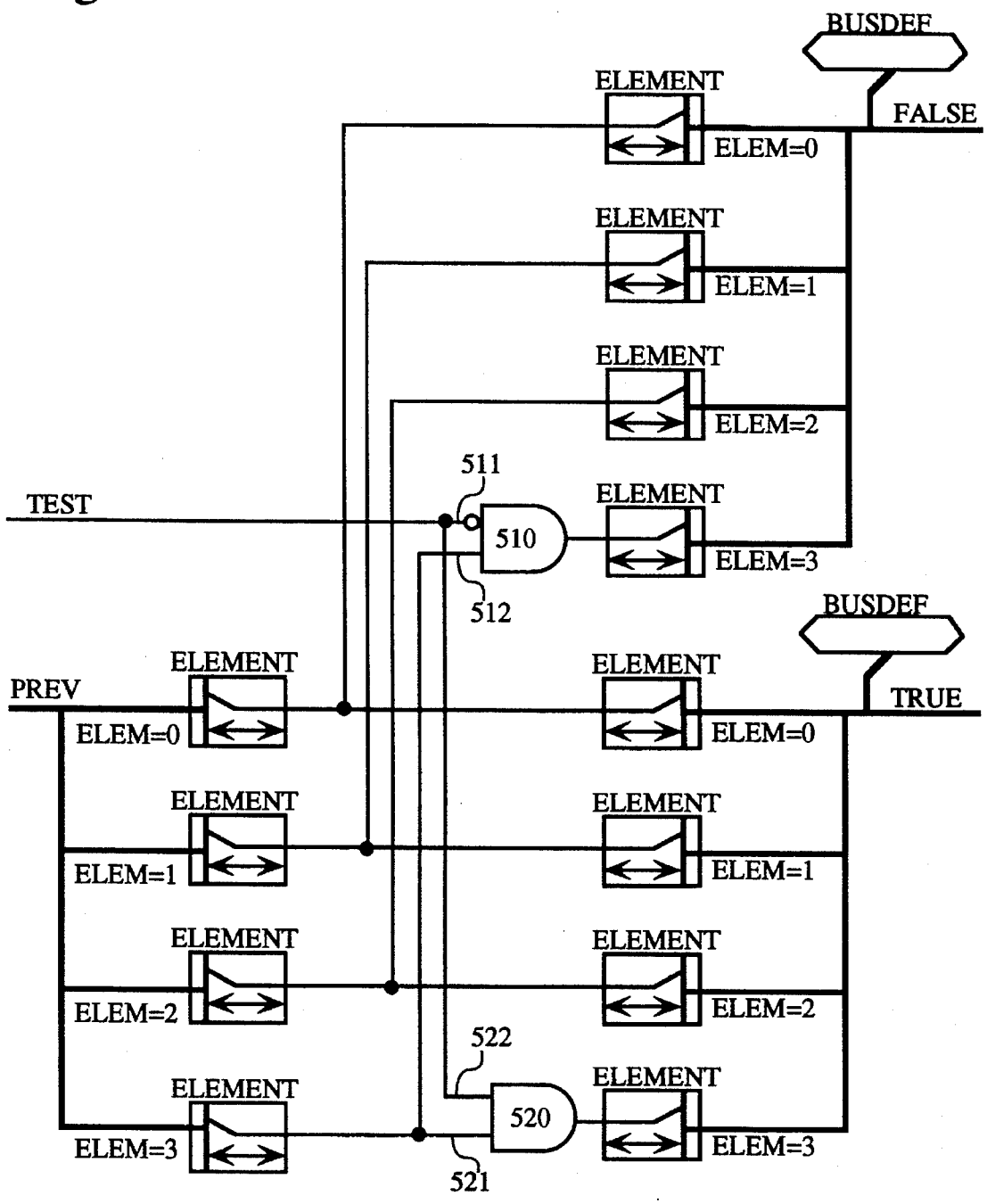

FIGS. 9a and 9b illustrate a fourth basic state flow component IF. The IF component acts as a decision branch in a state flow diagram. That is, the IF component passes state signals along one of two flow buses in response to a control signal.

As shown in FIG. 9a, the symbol for the IF component is a diamond having a corner into which points the PREV flow bus, a corner into which extends the TEST input terminal, a corner from which extends the FALSE flow bus and a corner from which extends the TRUE flow bus.

As shown in FIG. 9b, the IF component includes PREV, FALSE and TRUE bus lines, and further includes a first AND gate 510 and second AND gate 520. The ELEM=0, ELEM=1 and ELEM=2 signal lines from the PREV flow bus are applied to the ELEM=0, ELEM=1 and ELEM=2 signal lines, respectively, of both the TRUE and FALSE flow buses. The first AND gate 510 includes an inverting input terminal 511 and a non-inverting input terminal 512. A TEST signal line, which transmits a high or low signal from either another state flow component or a schematic component, is connected to the inverting input terminal 511 of the first AND gate 510, and to the second (non-inverting) input terminal 522 of the second AND gate 520. In addition, the ELEM=3 signal line from the PREV flow bus is applied to the non-inverting input terminal 512 of the first AND gate 510 and the first input terminal 521 of the second AND gate 520. The output terminal of the first AND gate 510 is connected to the ELEM=3 signal line of the FALSE flow bus, and the output terminal of the second AND gate 520 is connected to the ELEM=3 signal line of the TRUE flow bus.

The IF component operates to direct the progression of logic from a START or STATE component to another STATE component. As shown in FIG. 9b, when the ELEM=3 signal line from the PREV flow bus is high and the TEST signal line is high, the second AND gate 520 applies a high signal to the ELEM=3 signal line of the TRUE flow bus. Likewise, if the ELEM=3 signal line from the PREV flow bus is high and the TEST signal line is low, the first AND gate 510 applies a high signal to the ELEM=3 signal line of the FALSE flow bus. Signals from the ELEM=0, ELEM=1, and ELEM=2 lines of the PREV flow bus are applied to the corresponding lines of both the TRUE and FALSE flow buses. However, at most one of the TRUE and FALSE flow buses will have a high value on its ELEM=3 line indicating an active state.

Operation Using Basic State Flow components

With a system including the library of state flow components described above, a circuit design including both schematic components arranged in a schematic diagram and state flow components arranged in a flow diagram can be entered into a computer memory file using a prior art schematic capture package. The state flow components are arranged in the form of a state flow diagram to functionally describe a selected state machine, and schematic components are arranged in the form of a schematic diagram adjacent to the state flow diagram. State enable signals are connected to selected combinatorial component input terminals by drawing connective paths between the ACTIVE terminal of the STATE or START component and the selected input terminal. This process will be better understood by referring to the following example.

UART Example

Figure 10A:
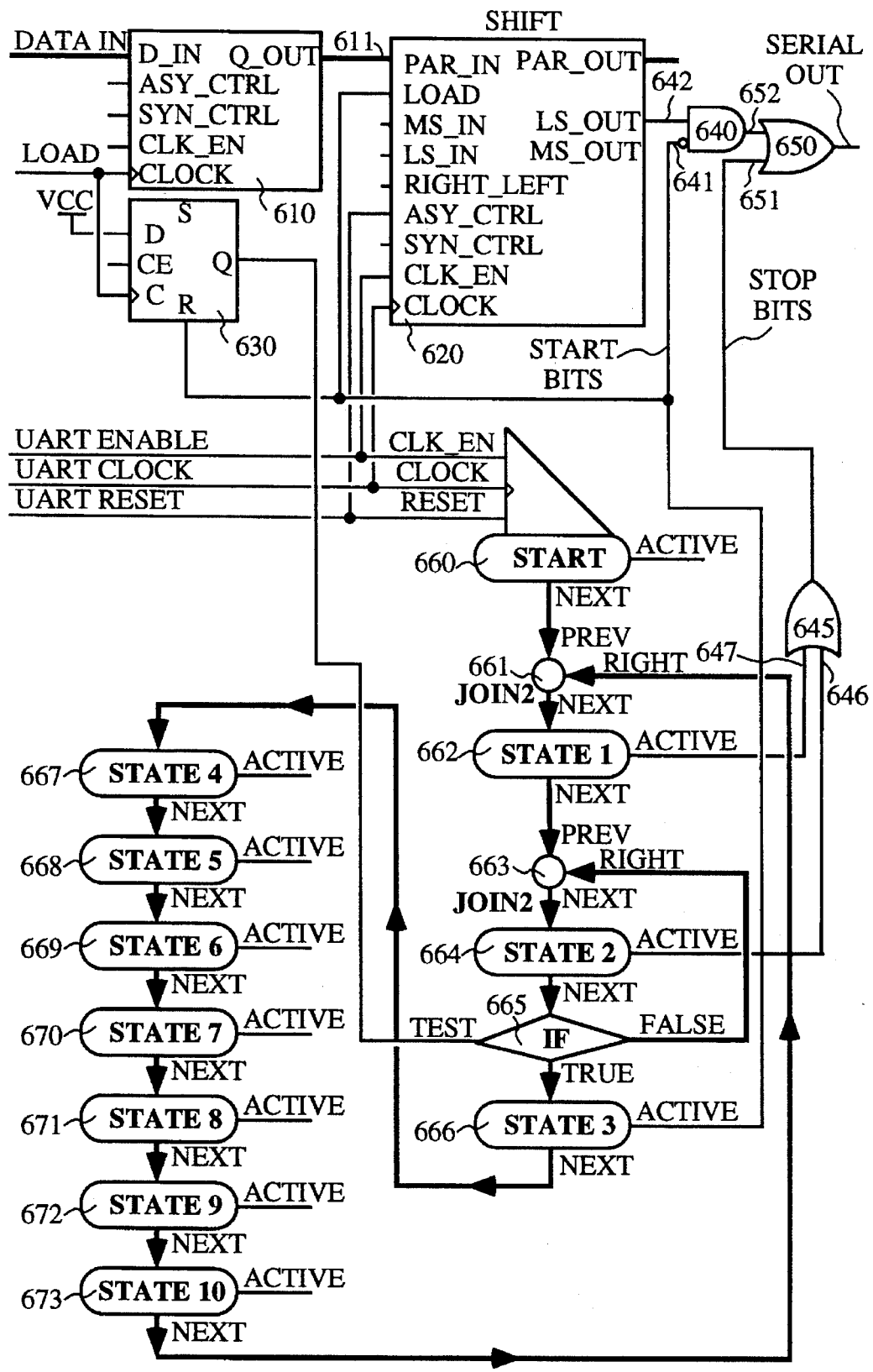
FIG. 10a shows an example of a UART design including a state flow diagram and a schematic diagram.

As shown in FIG. 10a, a state flow diagram for a 7-bit UART transmitter circuit design includes one START component, several STATE components, one IF component, and two JOIN2 components.

The schematic components include a data register 610, a shift register 620, a D flip-flop 630, an AND gate 640, a first OR gate 645 and a second OR gate 650. The data register 610 includes a data input terminal D_IN, a clock input terminal CLOCK and an output terminal Q_OUT. The shift register 620 includes a parallel load data input terminal PAR_IN, a load enable input terminal LOAD, an asynchronous reset input terminal ASYNC_CTRL, a clock enable input terminal CLK_EN and a clock input terminal CLOCK, and several output terminals including a least significant bit serial output terminal LS_OUT. The D flip-flop 630 includes D, C and RD input terminals, and a Q output terminal. Note that the unused input and output terminals associated with the data register 610, shift register 620 and D flip-flop 630 are indicated even though they are not used in this example because they are provided with the corresponding schematic components provided in the X-BLOX™ library. The AND gate 640 includes an inverting input terminal 641 and a non-inverting input 642. The first OR gate 645 includes a first input terminal 646 and a second input terminal 647. The second OR gate 650 includes a first input terminal 651 and a second input terminal 652.

The state flow components in this example include the START component 660, two JOIN2 components 661 and 663, an IF component 665 and ten STATE components 662, 664 and 666 through 673. The input and output terminals of each of the state flow components are described above in reference to FIGS. 6a through 9b.

The state flow diagram is entered into a computer memory file using X-BLOX™-defined schematic components and the state flow components described above. The schematic components and the state flow components are entered and connected as follows. First, data register 610, shift register 620, D flip-flop 630, AND gate 640, OR gate 645 and OR gate 650 are accessed from the X-BLOX™ library and positioned on a video display screen in the relative positions shown in FIG. 10a. Next, the state flow components are accessed from the state flow component library and arranged as follows: the NEXT flow bus of START component 660 is connected to the PREV flow bus of JOIN2 component 661; the NEXT flow bus of JOIN2 component 661 is connected to the PREV flow bus of STATE component 662; the NEXT flow bus of STATE component 662 is connected to the PREV flow bus of JOIN2 component 663; the NEXT flow bus of JOIN2 component 663 is connected to the PREV flow bus of STATE component 664; the NEXT flow bus of STATE component 664 is connected to the PREV flow bus of IF component 665; the TRUE flow bus of IF component 665 is connected to the PREV flow bus of STATE component 666; the FALSE flow bus of IF component 665 is connected to the RIGHT flow bus of JOIN2 component 663; STATE components 667 through 673 are connected in series from state component 666. Finally, the NEXT flow bus of STATE component 673 is connected to the RIGHT flow bus of JOIN2 component 661.

As the schematic components and state flow components are entered, connector lines (signal paths) are connected between the schematic components and between at least one state flow component and at least one schematic component as follows. A DATA IN data bus (which represents seven data signal lines) is connected to the D_IN terminals of data register 610. A LOAD input line is connected to the CLOCK input terminal of data register 610 and the C input terminal of D flip-flop 630. A logical high signal (VCC) is connected to the D input of D flip-flop 630. A UART ENABLE signal line is connected to the CLK_EN input terminal of START component 660 and to the CLK_EN input terminal of shift register 620. A UART CLOCK signal line is connected to the CLOCK input terminal of START component 660 and to the CLOCK input terminal of shift to register 620. A UART RESET signal line is connected to the RESET terminal of START component 660 and to the ASYNC_CTRL input terminal of shift register 620. The DATA IN bus, LOAD, VCC, UART ENABLE, UART CLOCK and UART RESET signal lines are recognized by the schematic capture package as being connected to external signal sources. Internal signal lines are connected as follows. A parallel data bus 611 including seven signal lines is connected between the Q_OUT terminal of data register 610 and the PAR_IN terminal of shift register 620. In addition, schematic signal lines connect the following: from the Q output terminal of D flip-flop 630 to the TEST input of IF component 665, from the LS_OUT terminal of shift register 620 to the non-inverting input of AND gate 640, from the ACTIVE output line of STATE component 662 to the second input terminal of OR gate 645, from the ACTIVE output line of STATE component 664 to the first input terminal of OR gate 645, from the ACTIVE output line of STATE component 666 to the Reset input terminal of D flip-flop 630, the LOAD input of shift register 620 and the inverting input of AND gate 640, from the output terminal of AND gate 640 to input terminal 652 of OR gate 650, and from the output terminal of OR gate 645 to the first input terminal of OR gate 650. Finally, a SERIAL OUT line is connected to the output terminal of OR gate 650, which is recognized by the schematic capture program as being connected to an external target.

The 7-bit UART transmitter circuit design operates as follows. Upon power up or a UART RESET high signal, START component 660 generates a high output signal which is passed on the flow bus through JOIN2 component 661 to STATE component 662 and at the next clock cycle to STATE component 664. The resulting high signals applied to the ACTIVE output signal lines of STATE component 662 and STATE component 664 generate a high signal on the first and second input terminals, respectively, of OR gate 645, which in turn during at least two clock cycles in which STATE1 and STATE2 are active applies a high signal from its output terminal to the first input terminal of OR gate 650. Note that the ACTIVE output signal line from STATE component 664 remains high until a high TEST signal is applied to IF component 665 While the TEST signal is low, IF component 665 continues to apply the high signal from STATE component 664 to the FALSE flow bus, thus maintaining the system in STATE 2 on subsequent clock cycles. The resulting high signal generated from the output terminal of OR gate 650 results in a high SERIAL OUT signal, which constitutes a sequence of initial "stop bits" of the UART transmission. A seven-bit signal is then loaded on the DATA IN signal bus from external logic (such as a host computer) to the D_IN terminal of data register 610, and a high signal from the LOAD signal line is applied to the CLOCK input terminal of data register 610 and the C input terminal of D flip-flop 630. In response, the seven bits are transmitted from the Q_OUT terminal of data register 610 to the PAR_IN terminal of shift register 620, and the D flip-flop applies a high signal to the TEST input terminal of IF component 665. In response to the high TEST signal, IF component 665 applies the high signal from STATE component 664 to STATE component 666. When STATE component 666 applies a high signal to its ACTIVE output line, the high signal is applied to the Reset terminal of D flip-flop 630 (causing the Q output to go low), to the LOAD terminal of shift register 620 (causing seven bit data to be transferred from the PAR_IN port to internal memory of shift register 620, and the least significant of the seven bits to be applied to the LS_OUT terminal). The high signal from STATE component 666 is also applied to the inverting input terminal 641 of AND gate 640 causing the SERIAL_OUT signal to go low, which constitutes the "start bit" of the UART transmission. As control passes through STATE components 667 through 673, each of the seven bits is applied to the non-inverting input terminal of AND gate 640. Note that because the inverting input signal applied from STATE component 666 is low, thereby enabling AND gate 640, the seven bits are duplicated on the SERIAL OUT signal line. After the seven bits have been transmitted, control is passed from STATE component 673 through JOIN2 component 661 to STATE component 662, thereby resetting the UART transmitter circuit for transmission of an additional seven bits.

Figure 10B:
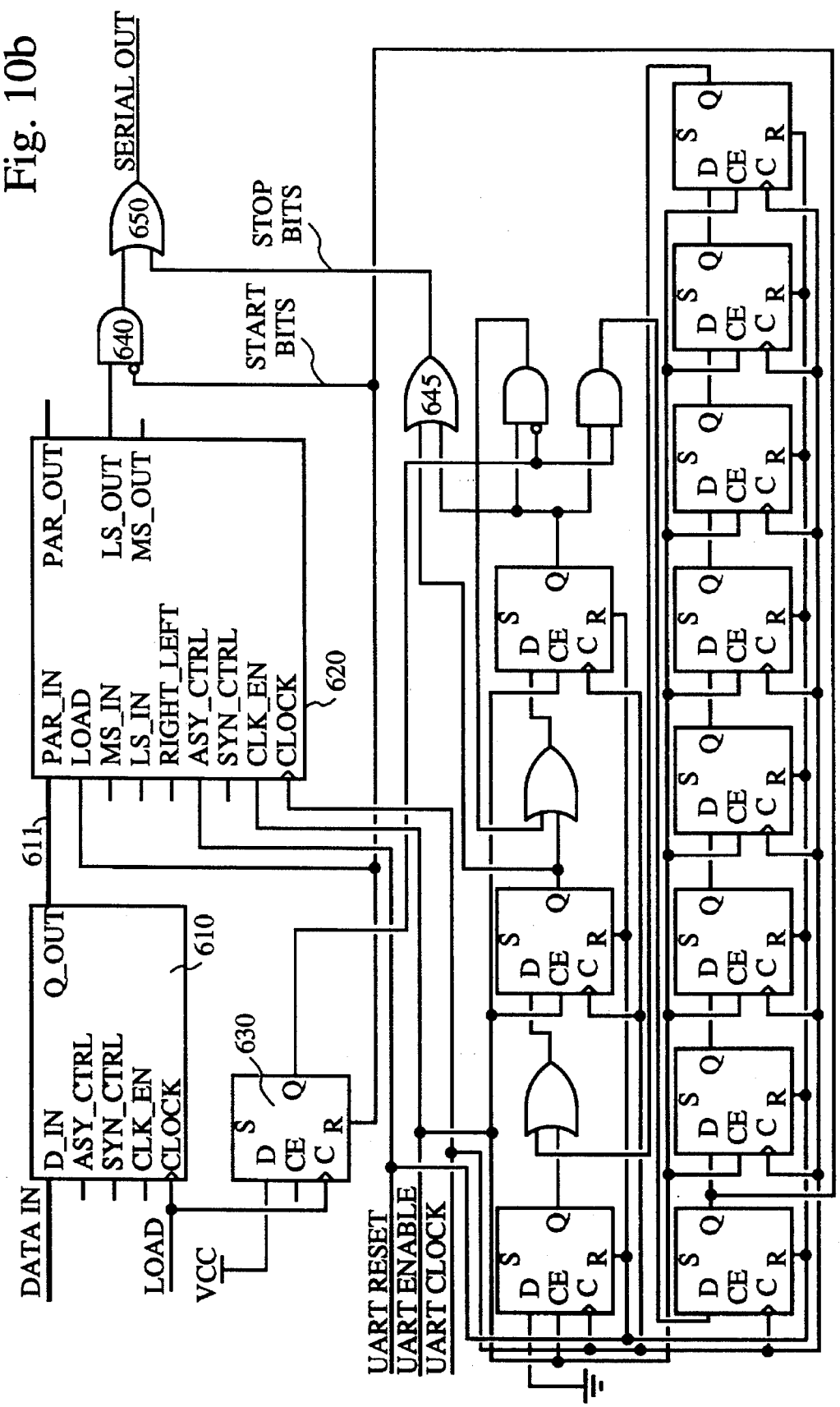

FIG. 10b illustrates a pure schematic diagram implementing the UART transmitter circuit of FIG. 10a. Note that the combination of state flow components and schematic components in FIG. 10a is easier to understand than the purely schematic components of FIG. 10b.

The example of FIG. 10a is provided to illustrate the use of four state flow components START, STATE, IF and JOIN. Several modifications to the UART transmitter would make more efficient use of the resources of a target FPGA. As described below, the component PAUSE is introduced to reduce the number of flip-flops required when using only the four components shown in FIG. 10a.

PAUSE Component

Figure 11A:
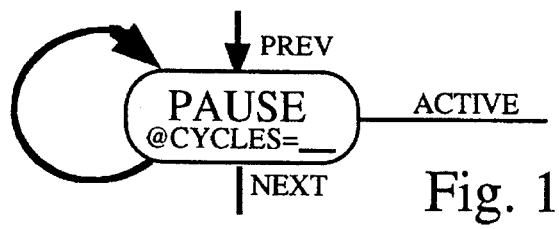
FIGS. 11a and 11b show a symbol and equivalent circuit for a PAUSE component.
Figure 11B:
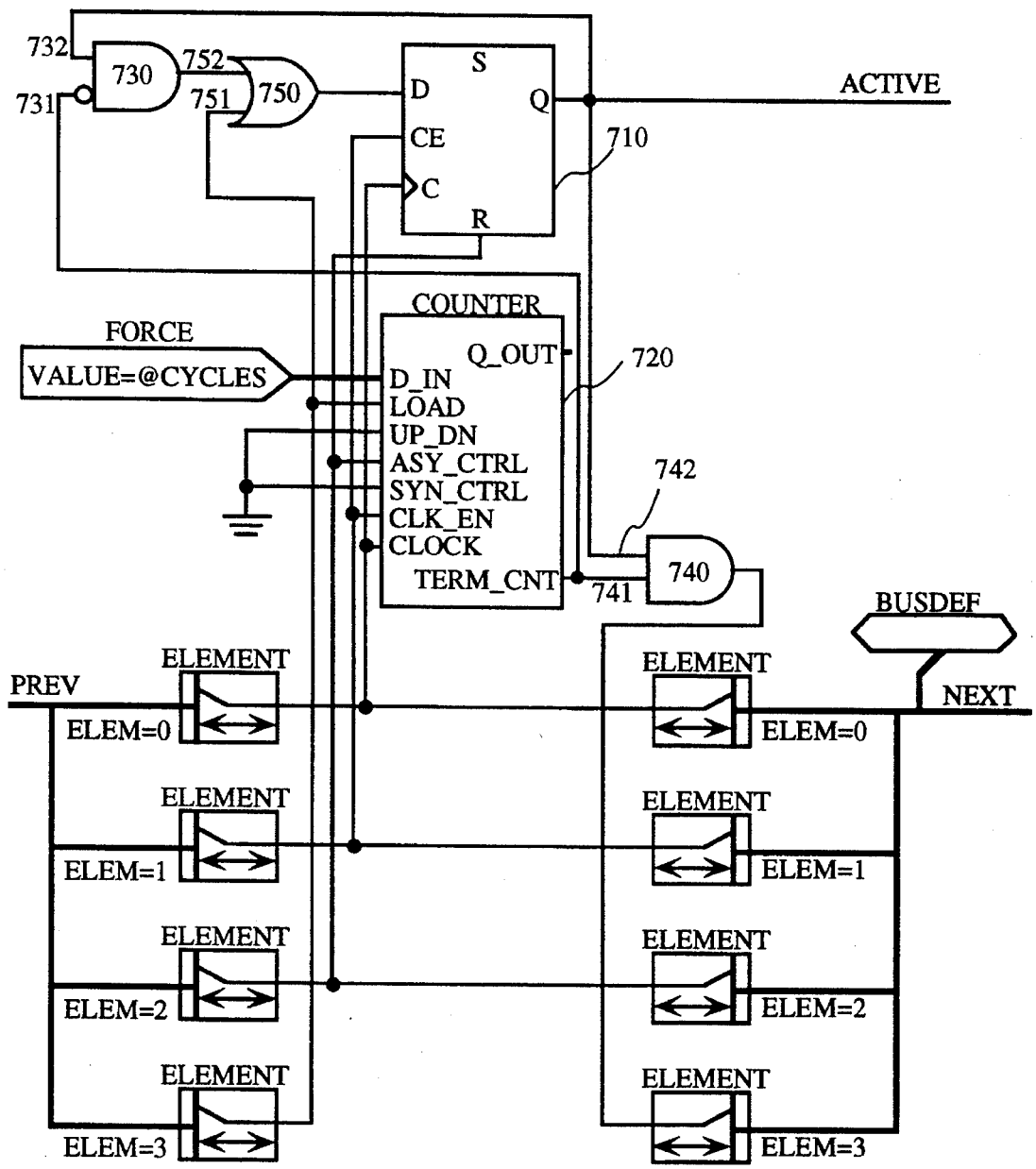

FIGS. 11a and 11b illustrate a PAUSE component which generates a multicycle state condition. That is, the PAUSE component generates a high ACTIVE signal for more than one clock cycle.

As shown in FIG. 11b, the PAUSE component is implemented using a D flip flop 710, a counter 720, a first AND gate 730, a second AND gate 740, and an OR gate 750. AND gate 730 includes an inverted input 731 and a non-inverted input 732. The ELEM=0 signal line from the PREV flow bus is connected to the CLOCK input terminal of counter 720, to the C input terminal of D flip-flop 710 and to the ELEM=0 signal line of the NEXT flow bus. The ELEM=1 signal line from the PREV flow bus is connected to the CLK_EN input of counter 720, the CE input terminal of D flip-flop 710 and to the adjoining ELEM=1 signal line of the NEXT flow bus.

The ELEM=2 signal line of the PREV flow bus is connected to the ASYNC_CTRL input terminal of counter 720, the R input terminal of D flip-flop 710 and to the ELEM=2 signal line of the NEXT flow bus. The ELEM=3 signal line of the PREV flow bus is connected to the LOAD input terminal of counter 720 and input terminal 751 of OR gate 750. The FORCE input bus applies a multiple line signal to the parallel D_IN terminal of counter 720. The FORCE symbol is defined in a manner similar to the BUS DEF symbol, and is explained further in the X-BLOX™ Design Tool User Guide, mentioned above. The @CYCLES input value assigned to the FORCE symbol indicates a binary number applied over the FORCE bus to counter 720. The TERM_CNT output terminal of counter 740 is connected to the inverting input terminal 731 of AND gate 730 and to input 741 of AND gate 740. The output of AND gate 730 is applied to input 752 of OR gate 750. The output of OR gate 750 is applied to the D input of D flip-flop 710. The Q output of D flip-flop 710 is applied to the ACTIVE output line, to non-inverting input terminal 732 of AND gate 730 and to an input terminal of AND gate 740. The output terminal of AND gate 740 is applied to the NEXT flow bus ELEM=3 line.

Operation of the PAUSE component begins when the ELEM=3 signal line of bus PREV goes high, (i.e., meaning when a previous STATE element is activated). The high ELEM=3 signal is applied to the LOAD input of counter 720, and the first input of OR gate 750, resulting in a high signal applied to the D input terminal of D flip-flop 710 for a duration of one clock cycle. At the next rising clock transition, D flip-flop 710 becomes SET, resulting in a high Q output signal, and counter 720 is loaded with the value defined by the FORCE @CYCLES variable. Assuming the @CYCLES is not zero, a low signal is applied to the TERM_CNT output terminal of counter 720 for the number of clock cycles specified by the @CYCLES value (Counter 720 counts down from the specified value until counter 720 reaches zero). The low TERM_CNT signal is applied to AND gate 740, which in turn applies a low signal on the ELEM=3 signal line of the NEXT flow bus. The low TERM_CNT signal is also applied to the inverting input terminal 731 of AND gate 730. The high Q output of D flip-flop 710 is applied to the ACTIVE signal line and to the non-inverting input terminal 732 of AND gate 730, thereby causing a high input signal to be applied to the D input terminal of D flip-flop 710 through OR gate 750. At the end of the clock cycle, the input signal on the ELEM=3 signal line of the PREV flow bus becomes low, thereby applying a low signal to the LOAD input terminal of counter 720. This low signal causes counter 720 to operate in a "down count" mode during subsequent clock cycles; that is, the counter decrements from the @CYCLES value by one each clock cycle until the counter reaches zero. In addition, although the ELEM=3 signal line is low, a high signal continues to be applied to the D input of D flip-flop 710 from OR gate 750 because of the high Q output signal, thereby causing the Q output to continue to emit a high signal. Note that while the Q output signal is high and the TERM_CNT signal is low, AND gate 740 applies a low signal to the ELEM=3 signal line of the NEXT flow bus. Finally, when counter 720 reaches zero, the TERM_CNT output applies a high signal to AND gate 740 and to the inverting input of AND gate 730, thereby causing AND gate 730 to apply a low signal to OR gate 750, which in turn applies a low signal to the D input of D flip-flop 750, which in turn causes the Q output of D flip-flop 750 to go low. However, before the Q output signal goes low, the high signal applied from the Q output and from TERM_CNT of counter 720 causes AND gate 740 to apply a high signal to the ELEM=3 signal line of the NEXT flow bus.

Figure 11C:
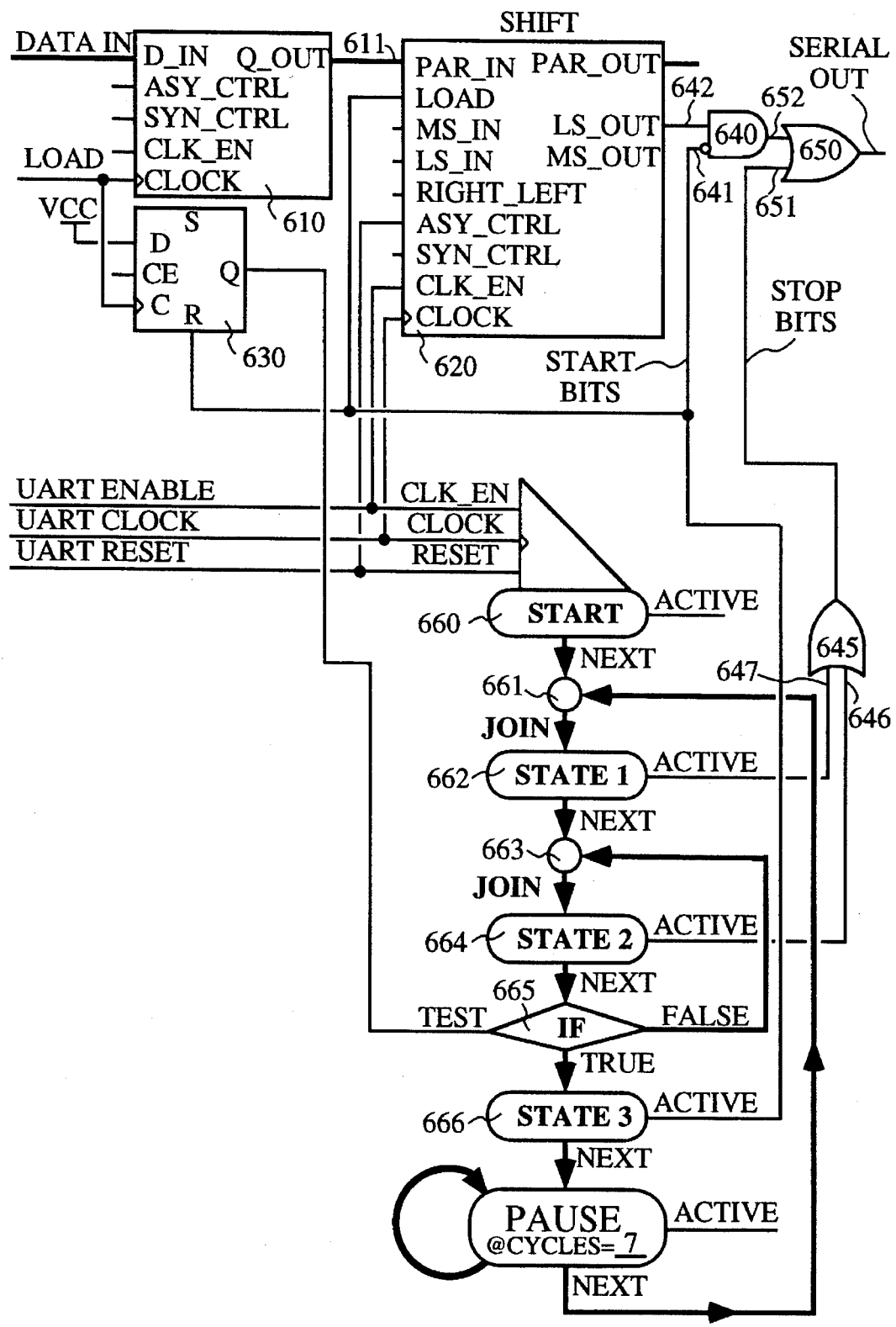

As shown in FIG. 11c, the PAUSE component can be incorporated into the flow diagram of FIG. 10a to replace STATE components 666 to 673, thereby providing the desired delay function in a more efficient manner.

FOR Component

FIGS. 12a and 12b illustrate a FOR component which creates iterative "FOR loops". The FOR component includes two input flow paths, PREV and BACK, and two output flow paths, LOOP and NEXT. In practice, the LOOP flow path is directly or indirectly connected to the BACK flow path.

As indicated in FIG. 12b, the FOR component includes a counter 810, AND gates 820 and 830, and OR gates 840 and 850. The ELEM=0 signal line of the PREV flow bus is connected to the CLOCK input terminal of counter 810, and to the ELEM=0 signal lines of the NEXT and LOOP flow buses. The ELEM=1 signal line of the PREV flow bus is connected to the ELEM=1 signal lines of the NEXT and LOOP flow buses. The ELEM=2 signal line of the PREV flow bus is connected to the ASYNC_CTRL terminal of counter 810, and to the ELEM=2 signal lines of the NEXT and LOOP flow buses. The ELEM=3 signal line of the PREV flow bus is connected to the LOAD input terminal of counter 810, to input 841 of OR gate 840, and to input 851 of OR gate 850. In addition, the ELEM=3 signal line of the BACK flow bus is connected to input 822 of AND gate 820, to input 842 of OR gate 840, and to non-inverting input 832 of AND gate 830. The LOOP bus uses the ELEM=0, ELEM=1, AND ELEM=2 lines to control any intermediate components in the loop, such as other STATE components. However only the ELEM=3 line is provided by the BACK bus to complete the loop.

The FOR component also includes a FORCE bus applying an @CYCLES input value to the parallel D_IN input terminal of counter 810. The @CYCLES variable is set by a user when the FOR symbol is entered into a schematic, and the number is entered on the FOR symbol. The TERM_CNT output terminal of counter 810 is connected to input 821 of AND gate 820 and to the inverting input 831 of AND gate 830. The output of AND gate 820 is connected to the ELEM=3 signal line of the NEXT flow bus. The output of AND gate 830 is connected to input 851 of OR gate 850. The output of OR gate 840 is connected to the CLK_EN terminal of counter 810. Finally, the output of OR gate 850 is connected to the ELEM=3 signal line of the LOOP flow bus.

The FOR component operates as follows. When the ELEM=3 signal line of the PREV flow bus is high, the high signal is applied to the LOAD terminal of counter 810 and to input 841 of OR gate 840. The high signal applied to the LOAD terminal of counter 810 causes counter 810 to load the count value defined by the @CYCLES variable. The high signal applied to input 841 of OR gate 840 causes a high signal to be applied to the CLK_EN terminal of counter 810. In addition, the high signal on the ELEM=3 signal line of the PREV flow bus is applied to input 851 of OR gate 850, which in turn applies a high signal on the ELEM=3 signal line of the LOOP flow bus. In typical applications of the FOR component, the LOOP flow bus is connected to a state machine segment, or "loop", which is connected to the BACK flow bus. The loop to which the BACK flow bus is connected typically includes one or more state flow components. Eventually, the state machine segment applies a high signal onto the ELEM=3 signal line of the BACK flow bus, which is then applied to input 822 of AND gate 820, non-inverting input 832 of AND gate 830, and input 842 of OR gate 840. If the CLK_EN signal on the ELEM=1 line of the PREV flow bus is high, AND gate 843 responds to the high output signal from OR gate 840, causing a high signal to be applied to the CLK_EN input terminal of counter 810. (If the CLK_EN signal is low, all logic elements including counter 810 are disabled.) Since the ELEM=3 signal on the PREV flow bus is low (causing the LOAD input signal to be low), counter 810 decrements the count value at each clock cycle (note, the clock signal is on the ELEM=0 line of the PREV flow bus) as long as the CLK_EN input terminal of counter 810 is set high by the ELEM=3 signal line of the BACK flow bus. While the count value is greater than zero, the TERM_CNT output signal is low, thereby preventing AND gate 820 from applying a high signal to the ELEM=3 signal line of the NEXT flow bus. Note that inverting input 831 of AND gate 830, in combination with the high signal applied from the ELEM=3 signal line from the BACK flow bus on input 852, causes a high signal to be applied to the ELEM=3 signal line of the LOOP flow bus. When the count value equals zero, the TERM_CNT signal goes high, thereby causing AND gate 830 to apply a low signal on the ELEM=3 signal line of the LOOP flow bus, and causing AND gate 820 to apply a high signal on the ELEM=3 signal line of the NEXT flow bus. This high signal is applied for one clock cycle, and moves the state machine out of the FOR loop.

WHILE Component

Figure 12C:
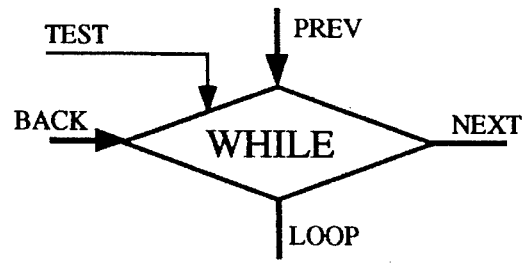
FIGS. 12c and 12d show a symbol and equivalent circuit for a WHILE component.
Figure 12D:
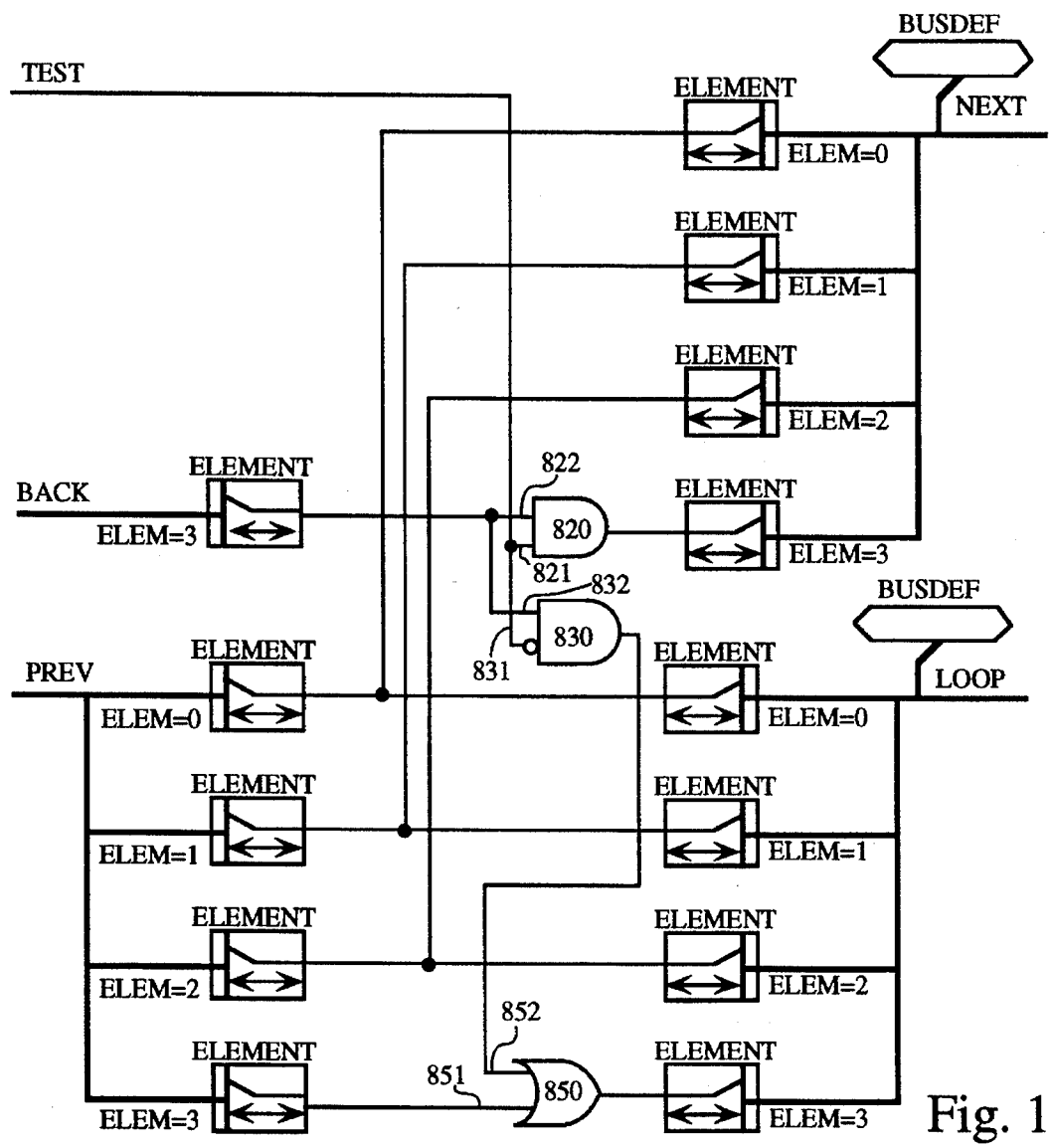

The WHILE component illustrated in FIGS. 12c and 12d is similar to the FOR component of FIGS. 12a and 12b. However, instead of entering a number of cycles over which the FOR component will loop, the WHILE component responds to a TEST signal which is typically provided from another part of the system. The WHILE component eliminates the need for counter 810 of FIG. 12b. The TEST signal which is applied to the inverting input of AND gate 830 and the noninverting input of AND gate 820 selects whether to activate the LOOP bus or the NEXT bus.

CALL Component

In other embodiments of the present invention, flow diagram subroutines are implemented by adding a fifth signal line, ELEM=4, which transmits signals "upstream" (that is, in a direction opposite to the signal directions of the ELEM=0 through ELEM=3 signal lines) along a flow bus. The fifth signal line can be used to transmit a "return" signal which indicates that a "called" subroutine has completed its intended function. Note that if any symbols which must return upstream data are used, then the STATE, IF, JOIN2, JOIN3, PAUSE, FOR, and WHILE symbols which have been described above must be modified to add the upstream data line ELEM=4.

Figure 13A:
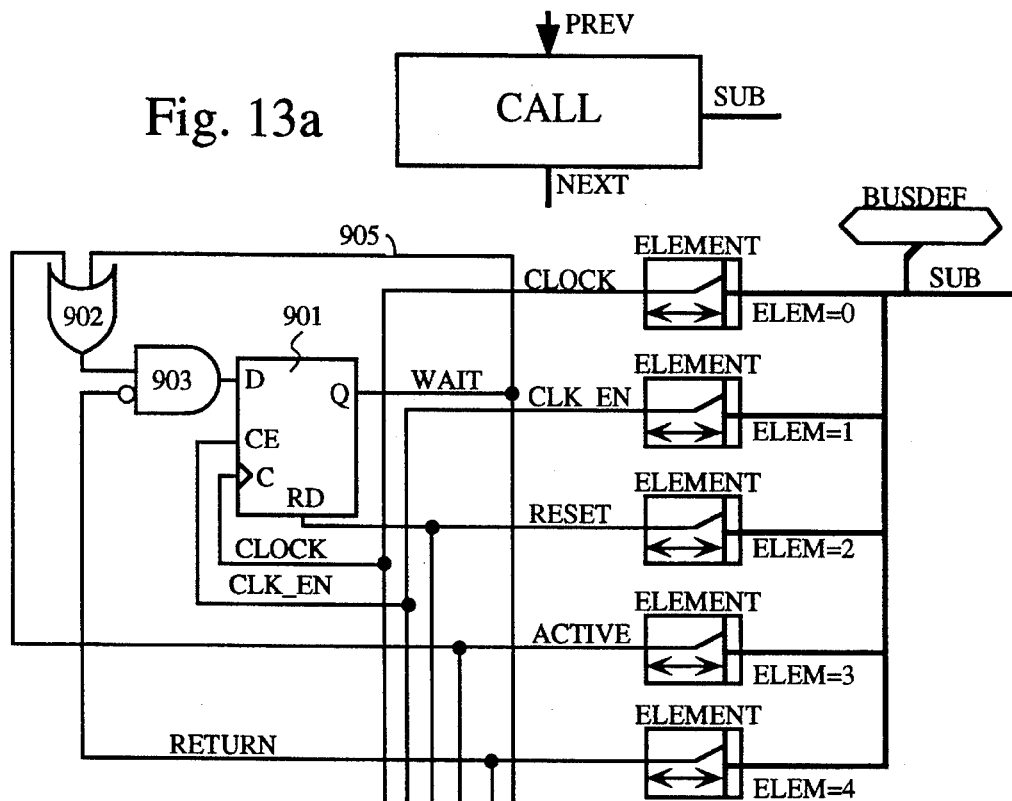
FIGS. 13a and 13b show a symbol and equivalent circuit for a CALL component.
Figure 13B:
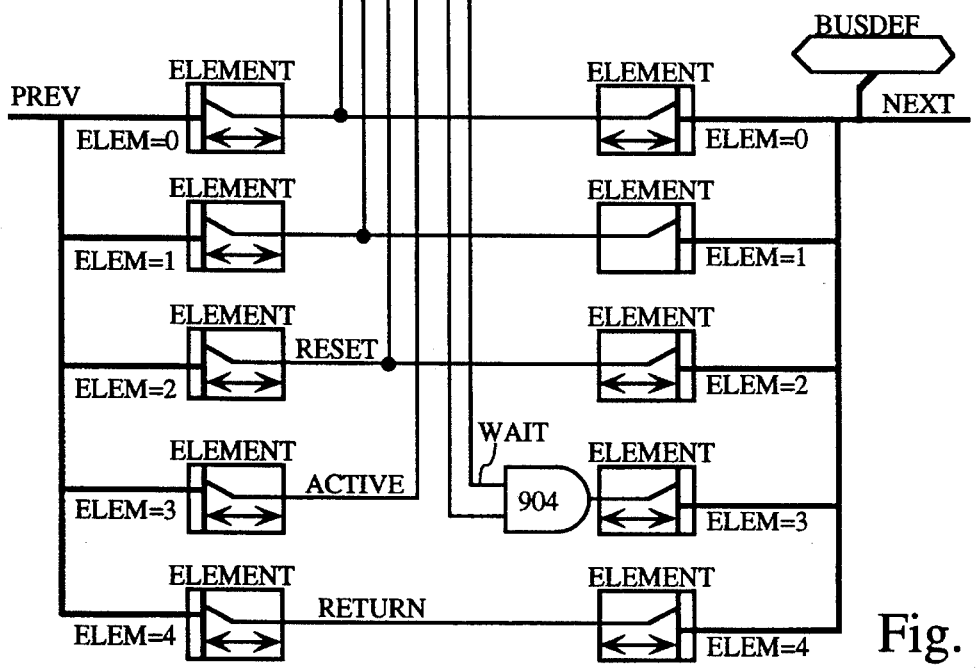

The CALL symbol is used for calling a subroutine and the RETURN symbol is used for returning from the subroutine. FIGS. 13a and 13b show a symbol and equivalent circuit for a CALL component. The CALL component circuit is similar to the IF and FOR component circuits. However, an extra line ELEM=4 is added to provide a return signal, and flow of information on the ELEM=4 line is in the opposite direction from that on the ELEM=0 to ELEM=3 lines.

The CALL component operates as follows. As with other symbols, a clock signal is provided on the ELEM=0 line of the PREV flow bus and is applied to the ELEM=0 lines of the NEXT and SUB flow buses. This clock signal is also applied to the clock input C of flip flop 901. The ELEM=1 line of the PREV flow bus carries a clock enable signal CLK_EN, which is applied to the ELEM=1 lines of the SUB and NEXT flow buses and also to the clock enable input CE of flip flop 901. As with other symbols, the ELEM=2 line of the PREV flow bus carries a reset signal, which is applied to the ELEM=2 lines of the NEXT and SUB buses and also to the RD reset terminal of flip flop 901. As with symbols described earlier, the ELEM=3 line carries the ACTIVE signal. This signal is applied directly to the ELEM=3 line of the SUB bus, so that a high signal can be used to call a subroutine through the SUB bus.

when a high ACTIVE signal appears on the ELEM=3 line of the PREV flow bus, OR gate 902 applies a high signal to AND gate 903. When the SUB bus is not providing a RETURN signal (the usual state), the ELEM=4 line of the SUB bus is low. Thus, AND gate 903 forwards the high signal from OR gate 902 to the D input of flip flop 901. At the next clock signal, the high signal is applied by the Q output of flip flop 901 to AND gate 904, and enables AND gate 904 to activate the ELEM=3 line of the NEXT bus in response to a high RETURN signal from the SUB bus. Meanwhile the high Q output of flip flop 901 is fed back on line 905 to OR gate 902. Thus AND gate 903 will maintain a high signal to the D input of flip flop 901 and thus a high Q output as long as the RETURN signal on the ELEM=4 bus of the SUB bus remains low. Thus gates 901, 902, and 903 are in a wait state ready to respond to a high RETURN signal on the ELEM=4 line of the SUB bus.

When the subroutine is complete, this RETURN signal goes high. The high RETURN signal applied to AND gate 904 produces a high signal on the ELEM=3 line of the NEXT bus. Meanwhile, AND gate 903 applies a logical 0 to the D input of flip flop 901, which on the next clock cycle appears at the Q output, thus taking the CALL component out of its wait state, and completing the CALL function.

RETURN Component

Figure 14A:
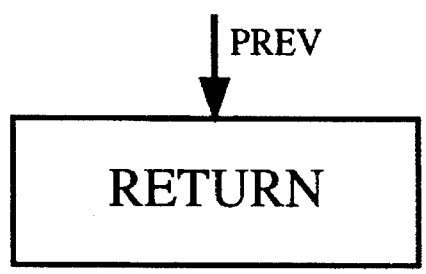
FIGS. 14a and 14b show a symbol and equivalent circuit for a RETURN component.
Figure 14B:
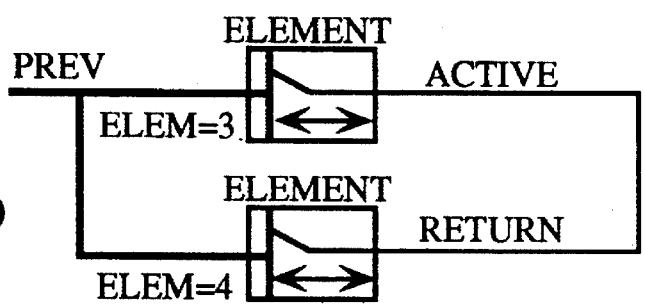

FIG. 14a shows the RETURN symbol and FIG. 14b shows its equivalent circuit in which the ELEM=3 and ELEM=4 lines of a PREV flow bus are connected together.

Example UART Transmitter Using FOR, CALL, PAUSE, AND RETURN Components

Figure 15:
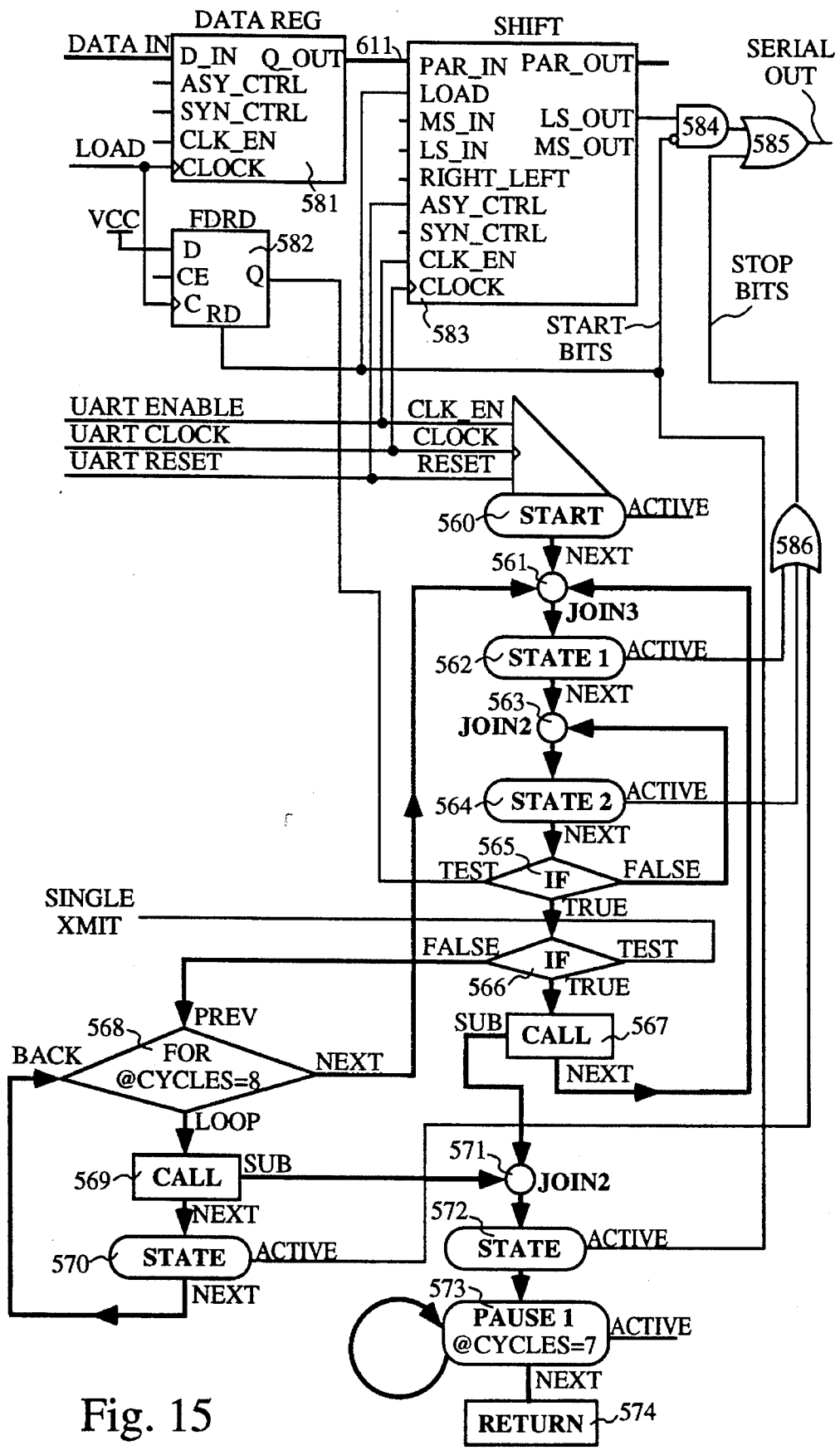
FIG. 15 shows a UART transmitter used in a subroutine with the CALL and RETURN symbols.

FIG. 15 shows a UART transmitter in which the control logic is represented by state machine components. The UART transmitter has the ability to add START and STOP bits to a data stream, and can be controlled to transmit either a single byte in response to a LOAD signal or to transmit multiple (in this example, eight) bytes in response to a LOAD signal. One subroutine is used, therefore one RETURN symbol is used. However, the subroutine is called from two different points in the flow diagram, therefore two CALL symbols are used.

Upon power-up or reset, a high UART reset signal activates START component 560. This high UART reset signal is also applied to the asynchronous ASY_CTRL input of shift register 583, thereby resetting shift register 583. In response to a high LOAD signal, data register 581 loads a seven bit value from the DATA_IN line connected to its D_IN input port. Thus, at the next clock cycle this value appears at the Q_OUT terminal of data register 581. Also, in response to the high LOAD signal at its clock terminal, FDRD flip-flop 582 places the high VCC signal at its D input port onto its Q output terminal. This high signal is applied to IF component 565, causing the IF component to direct an input signal to its TRUE output bus. When the UART ENABLE signal goes high, shift register 583 is enabled to respond to further clock signals. Thus, a UART clock signal following the UART reset and UART enable signals causes shift register 583 to load data from the Q output of data register 581 into its parallel input port. Shift register 583 will be used in its serial output mode providing output signals from its least-significant-value output port LS_OUT. Providing the seven data bits on its output port will take seven clock cycles of the UART clock signal. The state machine portion of FIG. 15 counts these seven clock signals and also inserts start and stop bits at the beginning and end of these seven data bits.

The state machine may be set to transmit only a single byte of data or to transmit multiple bytes of data. Consider first the case in which a single byte of data will be transmitted. On the first UART clock cycle after the UART reset, JOIN3 component 561 activates STATE1 component 562. On the second UART clock cycle after the reset signal, JOIN2 component 563 activates STATE2 component 564. If the LOAD signal has not yet been applied, IF component 565 will have a low value on its TEST input and its FALSE bus will apply the ACTIVE signal from STATE2 component 564 to JOIN2 component 563, thus returning the state machine to the state represented by STATE2 component 564. This cycling continues until a high LOAD signal causes FDRD flip-flop 582 to apply a high Q output signal to the TEST input of IF component 565. When the LOAD signal is applied, data on the DATA_IN line are loaded into data register 581. Assuming that the SINGLE XMIT line carries a high signal, the signal to the TEST input of IF component 566 is high, and a TRUE bus ACTIVE output signal will be received by call component 567, which calls a subroutine through JOIN2 component 571, moving the state machine to STATE component 572. While the machine is in STATE 572, a start bit is added to the data stream by applying a high active signal to the inverted input terminal of AND gate 584, causing AND gate 584 to apply a low output signal to OR gate 585.

Since OR gate 586 is not receiving a high input from any of the active signals of states 562, 564, or 570, OR gate 586 applies a low output signal to the other input terminal of OR gate 585. Thus, the SERIAL_OUT line carries a low output signal which serves as a start bit for the data to follow. In the next clock cycle, the state machine moves from STATE component 572 to PAUSE component 573, where the state remains for the next seven cycles while seven data bits are being transmitted. Meanwhile, the data shifted in parallel into shift register 583 are shifted out in series through AND gate 584 and OR gate 585. Since STATE component 572 is not currently active, the low output signal from STATE component 572 applied to the inverting input terminal of AND gate 584 causes AND gate 584 to forward the signal received from shift register 583 to the upper terminal of OR gate 585. Since the lower terminal of OR gate 585 is receiving a low input signal from OR gate 586, the data on its upper input terminal are forwarded to the SERIAL_OUT terminal and transmitted. After seven data bits have been transmitted, PAUSE component 573 moves the state machine to its next stage, which is RETURN component 574. As stated above, RETURN component 574 simply forwards the high signal received from PAUSE component 573 back through the return path to CALL component 567. As discussed above in connection with FIGS. 13a and 13b, when the CALL component calls a subroutine, the Q output of flip flop 901 places a high signal on one input terminal of AND gate 904. In this manner, AND gate 904 waits for a high RETURN signal to activate the ELEM=3 line of its NEXT bus. Thus, a high RETURN signal on the ELEM=4 line of the SUB bus produces a high ELEM=3 signal on the NEXT flow bus, thus moving the state machine to the next state. This high RETURN signal is also applied to the inverting input terminal of AND gate 903 and produces a low signal to the D input terminal of flip flop 901. Thus, on the next clock cycle, a low Q output signal appears at the upper input of AND gate 904, which causes the ELEM=3 line of the next bus to go low again and which places the CALL component into a state of not waiting for a RETURN signal. The low Q output of flip flop 901 in combination with a low ELEM=3 signal from the PREV flow bus causes OR gate 902 to apply a low signal to AND gate 903. Thus, the Q output of FDRD flip-flop 901 is low, and the call component is no longer waiting for a return signal from a subroutine.

Returning now to FIG. 15, CALL component 567 forwards a high signal on its NEXT flow bus through JOIN3 component 561 to STATE1 component 562. This results in a high ACTIVE output signal on the ELEM=3 line of STATE component 562, which in turn results in a high signal being applied by OR gate 586 to OR gate 585, which in turn results in a high STOP bit applied to the SERIAL_OUT line by OR gate 585. On the next clock cycle, the state machine moves through JOIN2 component 563 to STATE component 564, which again applies a high output signal to OR gate 586, which is in turn forwarded to OR gate 585 to generate a second STOP bit. The machine remains at STATE2 component 564 with further high STOP bits until another LOAD signal is applied to the clock inputs of data register 581 and FDRD flip-flop 582.

To transmit eight bits in a single burst, the SINGLE XMIT line is held low. Thus, when a high LOAD signal causes a high TEST signal to be applied to IF component 565 and the state moves to IF component 566, IF component 566 forwards an ACTIVE signal on its FALSE bus to FOR component 568 (discussed above in connection with FIGS. 12a and 12b). In the example of FIG. 15, the user has set the FOR component 568 to repeat for 8 cycles. Thus for 8 consecutive times, the system will move from FOR component 568 to CALL component 569, which calls the subroutine through JOIN2 component 571, which at STATE component 572 adds a START bit (low) to the data stream, then moves to PAUSE component 573, which pauses for seven cycles while the seven data bits are being transmitted, and RETURNS. The RETURN signal is transmitted back through JOIN2 component 571 to both CALL components 567 and 569. But only CALL component 569, which called the subroutine, is waiting for the RETURN signal (as discussed above). When CALL component 569 receives the RETURN signal, it activates STATE component 570 (i.e., causes STATE component 570 to send a high signal from its ACTIVE terminal), which causes OR gate 586 to send a high STOP bit to OR gate 585 which is forwarded to the SERIAL_OUT port. After 8 subroutine calls, FOR component 568 activates its NEXT bus, which applies a high ACTIVE signal to JOIN3 component 561 and moves the system to STATE1 component 562. STATE1 component 562 causes OR gate 586 to send another high STOP bit. The system moves to STATE2 component 564, where it remains due to the loop from IF component 565 until another LOAD signal is received.

STOP Component

Figure 16A:
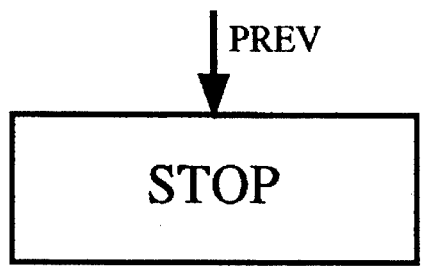
FIGS. 16a and 16b show a symbol and equivalent circuit for a STOP component.
Figure 16B:
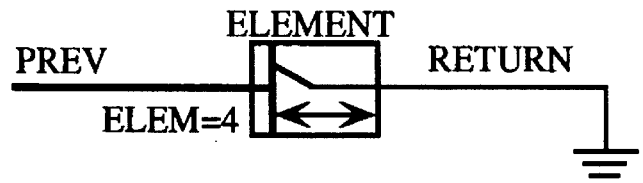

A STOP component, shown in FIGS. 16a and 16b provides simply a ground connection to the ELEM=4 line. In this manner, any component connected to a STOP component carries a constant low signal on its RETURN line Thus a RETURN line connected to a STOP component never activates another state in the state machine.

Multiple States Active

The present invention also provides additional capability in a complex circuit design. For example, in one embodiment a specialized state machine having several independent logic paths is implemented using coding similar to one-hot encoding. As with one-hot encoding, a high flip flop output from a state machine component indicates the state is active. However, more than one flip flop output may be high simultaneously, indicating that more than one state is active. To implement several parallel paths in accordance with the present invention simply requires connecting a flow bus from one state flow symbol output to two or more state flow symbol inputs. The result is a branching of the state sequence such that each branch has an active state. In such a case, each branch typically controls an independent part of the circuit design. For example, a state machine which accesses external data can have an independent branch for a cache controller and another branch for the primary algorithm. There may be a need for and a provision for synchronization between the two or more branches. Several methods will be described for activating multiple states of a state machine.

SPAWN Component

Figure 17A:
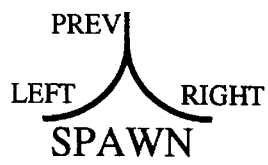
FIGS. 17a and 17b show a symbol and equivalent circuit for a SPAWN component.
Figure 17B:
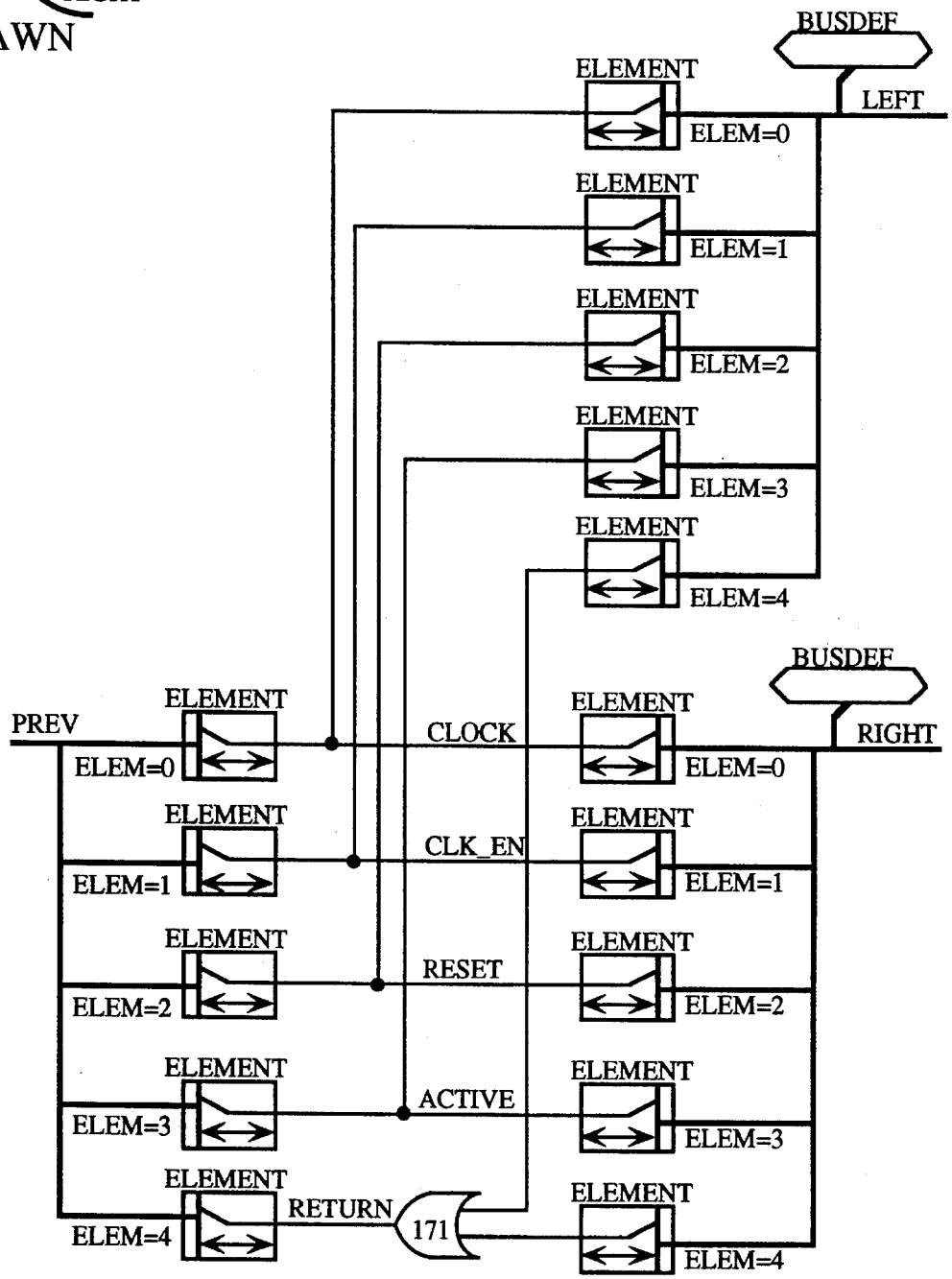

The SPAWN component allows for branching to two simultaneously active states. FIG. 17a shows a SPAWN symbol and FIG. 17b shows the equivalent circuit of a SPAWN component. Like the CALL component, the SPAWN component uses an ELEM=4 bus line for carrying up-stream information. OR gate 171 returns the logical OR of the signals on the ELEM=4 buses of the LEFT and RIGHT buses. This SPAWN component facilitates implementation of branching state machines, in which separate branches can operate in parallel.

Branching state machines provide a powerful mechanism for controlling separate but linked parts of a system. For example, a coprocessor with on-chip cache can benefit from the use of a branching state machine by spawning off a new branch whenever a memory fetch takes place. One spawned branch can implement a cache algorithm, while another branch continues processing the instruction stream. Active outputs of the cache branch are input to the processing branch at places where the processing branch must synchronize with the cache branch. Upon terminating its task, the cache branch "falls off the end" of the state diagram. That is, the last state of the cache branch has nothing, or a STOP symbol, connected to its NEXT flow bus.

When a SPAWN symbol is used, the system no longer has the characteristic of having only one state active at one time. Care must be taken to insure that the separate branches are truly independent and do not corrupt each other's integrity. In particular, a common subroutine should not be called from multiple branches. Also the designer must avoid feeding a JOIN symbol from different branches unless the system is designed to accommodate this. Otherwise, more than one state may be active within a single branch, and this may produce an unpredictable or unanticipated result if the designer has not planned for multiple active states in the design.

UART Example using SPAWN

Figure 18:
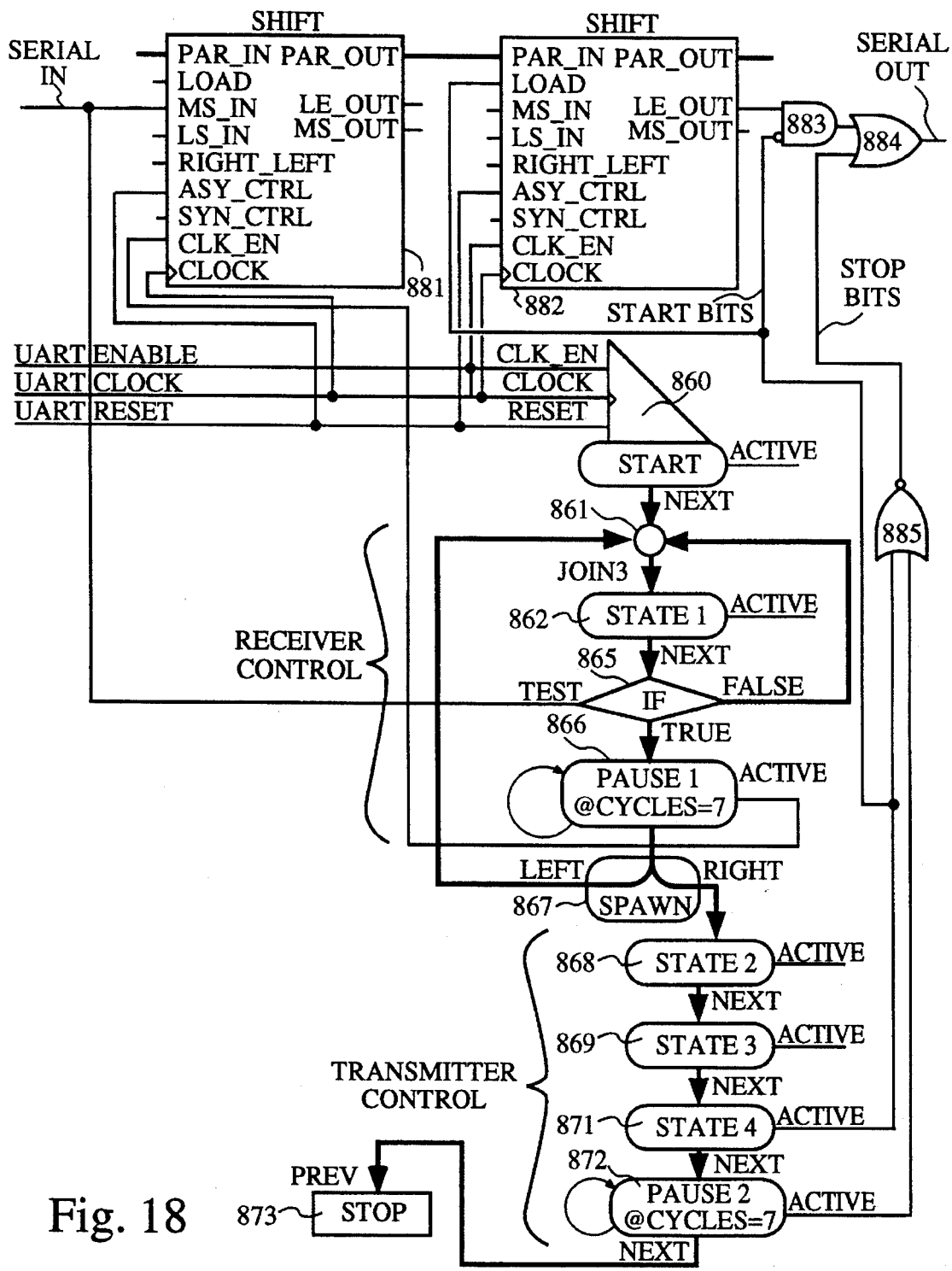
FIG. 18 shows a UART transmitter-receiver which uses the SPAWN symbol to provide a separate branch to transmit data in parallel with receiving data.

FIG. 18 shows an example using the SPAWN component along with START, STATE, IF, PAUSE, and STOP state flow symbols discussed earlier. In this example, a UART receiver spawns off a new branch to transmit the received data. This allows the receiver to work in parallel with the transmitter as would be required in continuous data flow. Upon power-up or reset, START component 860 is asserted. At the next cycle of the UART clock, the system shifts through JOIN3 component 861 to STATE component 862. Shift register 881 receives data serially on its MS_IN port, and sends data in parallel on its PAR_OUT port.

As is well known, UART receivers are synchronized to data being received from a remote terminal as well as to a local clock signal. Thus the logic for controlling a UART receiver responds to received data as well as to a local clock signal. As long as the data signal on the SERIAL_IN port is a logical 1, no start bit will be recognized, and IF component 865 activates its FALSE bus so that the state machine remains at STATE component 862.

However, if the SERIAL_IN signal goes to a logical 0, IF component 865 activates the TRUE bus, moving the state machine to PAUSE component 866. In addition to pausing for 7 cycles of the UART clock, PAUSE component on its ACTIVE output line enables shift register 881 to receive the UART clock signal on its CLOCK terminal. This CLK_EN signal enables the next 7 clock signals so that the next 7 values on the SERIAL_IN terminal are read into the MS_IN port of shift register 881.

After these seven bits have been read into shift register 881, PAUSE component 866 disables shift register 881 so that serial bits do not continue to be read in. PAUSE component 866 also provides a high signal to SPAWN component 867 SPAWN component 867 provides two output signals. On its LEFT flow bus, SPAWN component provides this high signal to JOIN3 component 861, activating STATE1 component 862. On its RIGHT flow bus, SPAWN component 867 activates STATE2 component 868.

STATE2 component 868 is the first of several components which control the transmitting function of the UART. In the next two UART CLOCK cycles, the transmit branch of the system moves through STATE3 component 869 to STATE4 component 871. The ACTIVE (high) output of STATE4 component 871 causes shift register 882 to load data which are present on its PAR_IN input port. This ACTIVE signal also produces a low output from AND gate 883, and causes NOR gate 885 to provide a low signal to OR gate 884. This results in a low SERIAL_OUT signal from OR gate 884, which serves as a START bit for the transmitted signal. At the next clock cycle, the transmit branch moves to PAUSE component 872, which provides a high ACTIVE signal to NOR gate 885 for the next seven cycles. The high signal to NOR gate 885 produces a low input to OR gate 884 so that data received on the upper input terminal of OR gate 884 from AND gate 883 are passed to the SERIAL_OUT line for transmission by OR gate 884. When the 7 cycles have been completed, the transmit branch of the state machine is terminated by STOP component 873.

As the transmit branch of the state machine moves to STATE2 component 868, the receive branch of the state machine moves to STATE1 component 862. IF component 865 maintains the receive branch at STATE1 component 862 waiting for the value on the SERIAL_IN line to go from logical 1 to logical 0 in order to again move to PAUSE component 866 for receiving another 7 bits of data. If data are being transmitted steadily on the SERIAL_IN port, both receive and transmit branches of the state machine will be active simultaneously, with a byte of data moving from shift register 881 to shift register 882 as controlled by the START and STOP bits of the SERIAL_IN data stream and the UART clock through PAUSE component 866. Since the RIGHT branch of the SPAWN symbol terminates in a STOP symbol, no discrepancies result from having two simultaneously active states.

Pipeline Controller Having Several Active States

Another example of a state machine having more than one active state is a pipeline controller. Pipelined logic comprises several stages of logic in which one stage is separated from the next by a flip flop and the flip flops are commonly clocked so that an output signal from a first stage enters a second stage at the same time an output signal from the second stage enters a third stage. That way, a long, time-consuming, string of logic operations may be divided into pieces and the pieces operated simultaneously like stages in an assembly line, with samples being processed at a throughput rate determined by the time interval required by the slowest piece, not the time interval required to compute the entire string.

Such a pipelined system may be controlled by a "pipelined" state machine. In such a state machine there is one active state controlling each stage of the pipeline design. Thus with pipelining there are several simultaneously active states on one data path through one state machine. Pipelined state machines can be implemented by providing flow bus connections which allow control signals to be entered at selected points on the flow bus. To activate more than one state, an arrangement similar to the JOIN symbols of FIGS. 8a–8c can be used. Instead of the RIGHT bus of FIG. 8b, a single input line is provided, and connected to OR gate 410. Then when either this single input line carries a high signal or when line ELEM=3 of the PREV bus carries a high signal, the ELEM=3 line of the NEXT bus goes high. Thus the single input line may be used to activate a second state.

ACTIVATE and TAP Symbols

Figure 19A:
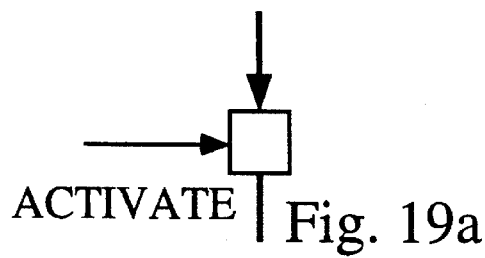
FIGS. 19a through 19d show symbols and circuits for the ACTIVATE and TAP components.

The ACTIVATE component induces a state to become active by an event external to the state diagram. This symbol may be used to cause a state machine to have more than one active state at one time. FIGS. 19a and 19b show an ACTIVATE symbol and its corresponding circuit. A signal from a single line, the ACTIVATE line, is combined by OR gate 191 with the ELEM=3 line of the PREV bus. Thus, if either is high, a high signal is applied to the ELEM=3 line of the NEXT flow bus. In another embodiment, the ACTIVATE circuit includes an ELEM=4 line which carries a RETURN signal, as discussed above.

Figure 19C:
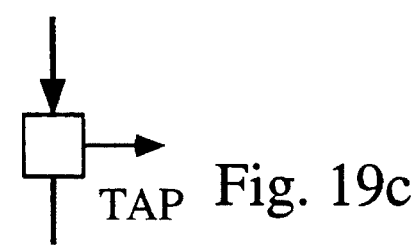
Figure 19B:
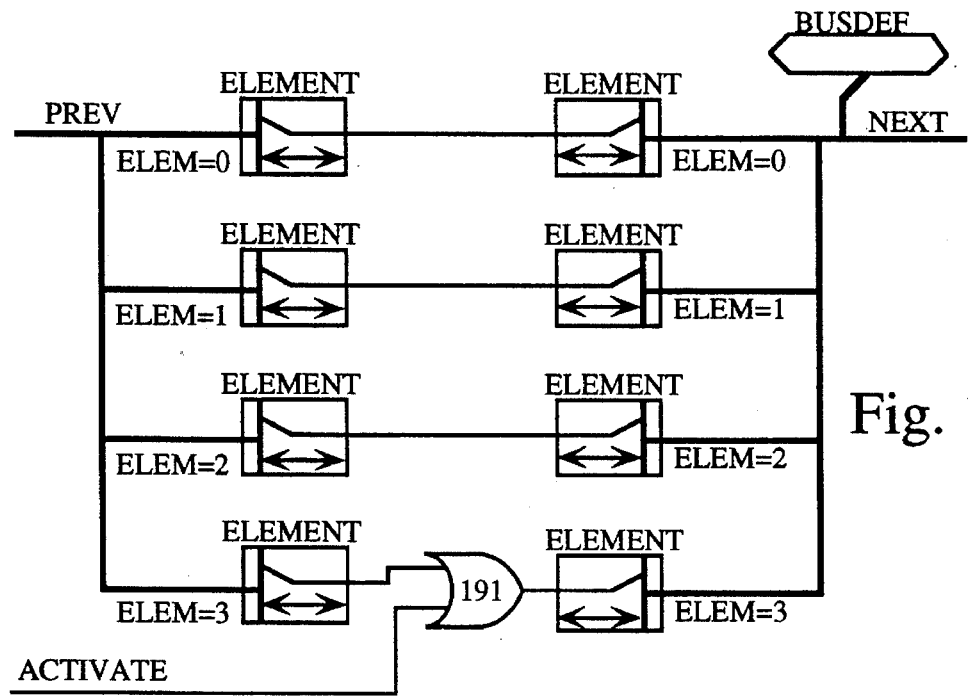
Figure 19D:
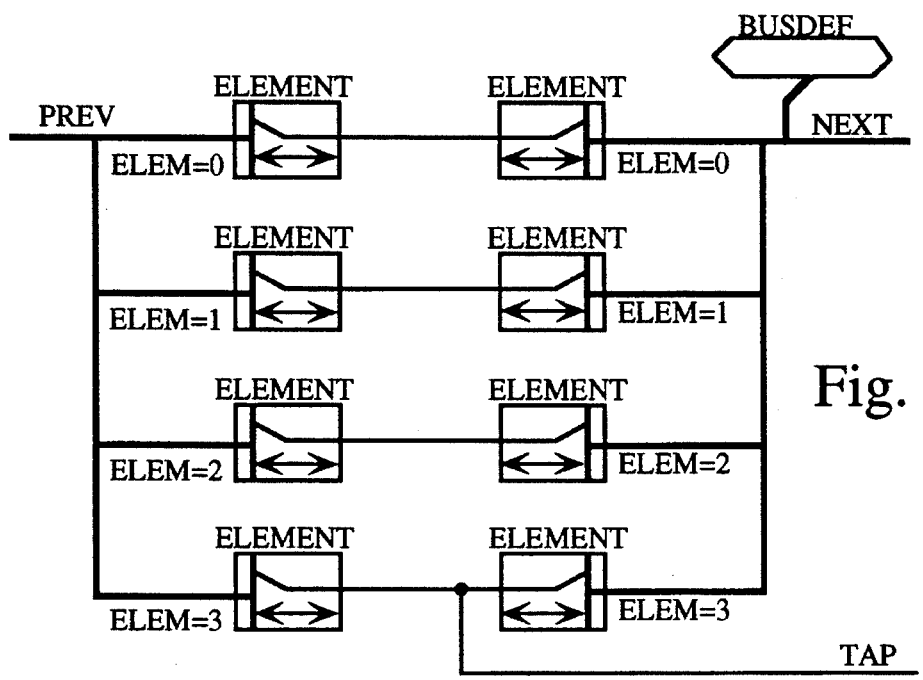

The TAP symbol and its corresponding circuit are shown in FIGS. 19c and 19d. The TAP symbol complements the ACTIVATE symbol by providing a TAP output signal from the ELEM=3 line. The symbol is useful for synchronizing functions, for example generating a synchronous load signal for an external register. If the external register needs to be loaded at the same time a specific state becomes active, without regard to any previous state, then that state is preceded in the state flow diagram with a TAP symbol, and the TAP symbol's ACTIVATE output signal is used as the register load command input signal.

Example Design Using Reentrant State Machine

When using a reentrant state machine (a machine with multiple states active, and with state activation from more than one source), it is important to control the relationship between active states so that no logical conflict occurs. The following example illustrates the problem and its solution.

The example is a design of a system for real time compression of a digital video stream from 10 bits to 8 bits. The design requirements are such that a simple linear conversion (i.e. simply dividing the numbers by 4) is unacceptable. Most of the interesting information in the signal lies near the middle of the range of the incoming numbers, around the value 512. Also, it is unacceptable to simply throw away values near the limits of the range, near 0 and 1024, since this would result in noticeable image distortion. The desired solution is to use a non-linear transfer function where values near the center are uncompressed, but values above and below the center by some amount are compressed.

Figure 20:
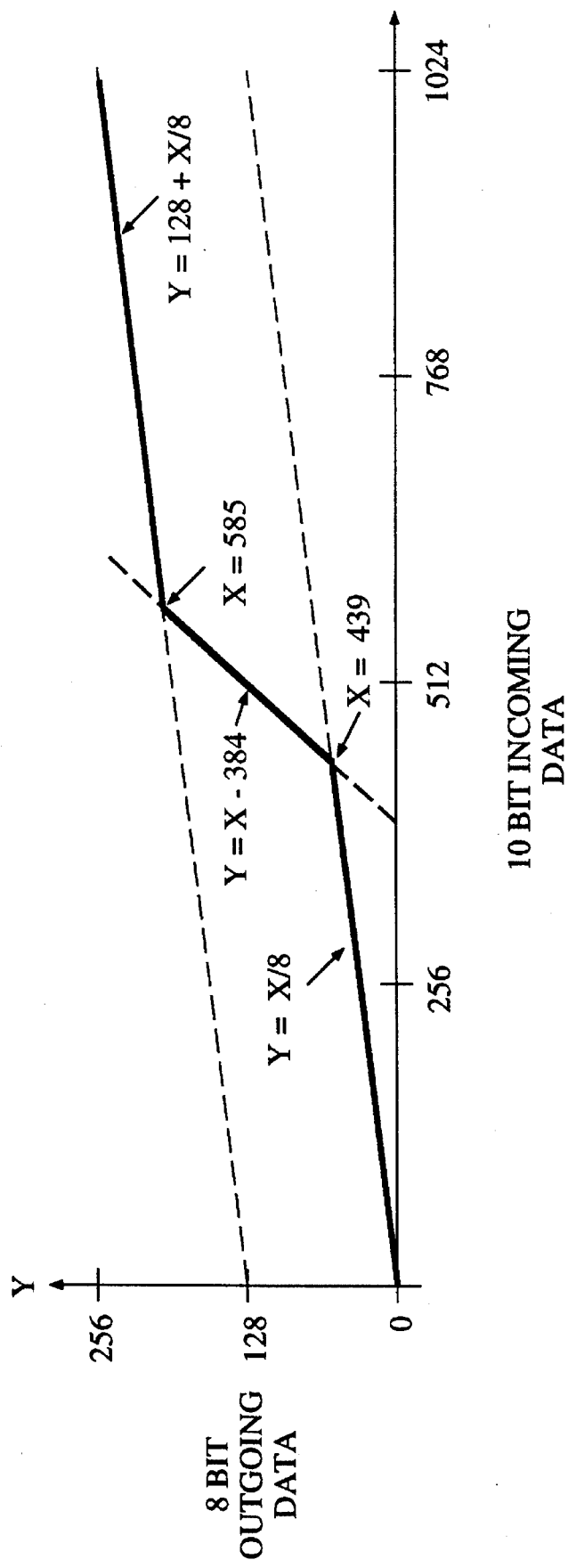
FIG. 20 shows an example data compression transfer function which can use a state machine having multiple active branches.

FIG. 20 shows an acceptable transfer function. The x axis represents values before transfer and the y axis represents values after transfer. Values between x=0 and x=439 will be divided by 8. That is, the formula y=x/8 will be used. Values between x=440 and x=585 will have 384 subtracted, that is the formula y=x−384 will be used. And values between x=586 and x=1024 will be converted by the formula y=128+ x/8.

The design uses pipelining to achieve high throughput, and uses a state machine with multiple active states, maintaining the data between stages of the pipeline in lock step.

Figure 21:
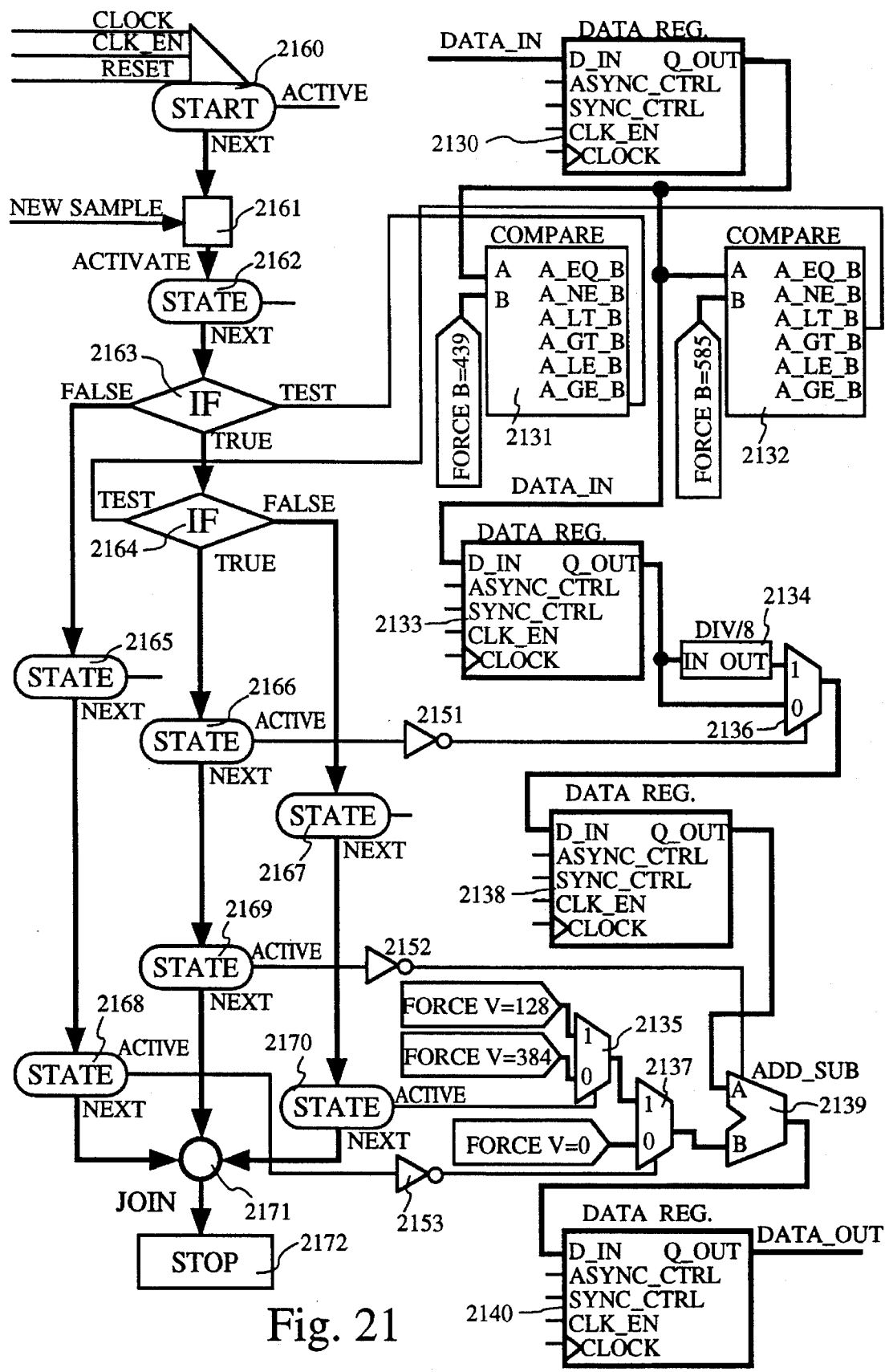
FIG. 21 shows a state machine solution to the problem of FIG. 20 in which multiple active branches are used.

FIG. 21 shows a state machine and other hardware used in the design of the data compression device. On the left side of the figure are components of the state machine portion of the design, and along the right side are logic elements which are controlled by the state machine. Not shown in the diagram is a global clock line which provides a CLOCK signal to data registers 2130, 2133, 2138, and 2140. The same CLOCK signal which is propagated from the CLOCK input of START component 2160 through the various ACTIVATE, STATE, IF, and JOIN components of the state machine portion of the design also feeds the data register CLOCK inputs. The line is omitted in order to simplify the drawing, but is, of course, important for proper operation of the circuit.

When a new sample of data is to be compressed, a high NEW SAMPLE signal is applied to ACTIVATE component 2161 at the same time the sample data are applied to the DATA_IN line of data register 2130. As discussed in connection with FIG. 19b, the ACTIVATE component forwards this high signal asynchronously to its NEXT bus. Thus on the first clock cycle, a high ELEM=3 signal appears on the PREV bus of STATE component 2162.

At the second clock cycle, STATE component 2162 applies a high ELEM=3 signal to its NEXT bus as data register 2130 is applying the received data to its Q_OUT terminal. On this second clock cycle, comparators 2131 and 2132 test the data to determine whether the data value is greater than or equal to 439 and less than 585, respectively. Results of these tests are applied to the TEST inputs of IF components 2163 and 2164, respectively (see FIG. 20). If the data value is in the low range, a low value on the A_GE_B terminal of comparator 2131 results in IF component 2163 activating its FALSE bus which in turn activates STATE component 2165. Otherwise, IF component 2163 activates IF component 2164. If comparator 2132 indicates the data value at A is less than 585 (therefore in the middle range) the high signal on the A_LT_B output terminal applied as a TEST signal to IF component 2164 activates the TRUE bus, thus applying a high ELEM=3 signal to the PREV bus of STATE component 2166. A low signal on the A_LT_B output terminal of comparator 2132 causes IF component 2164 to activate its FALSE bus, which applies a high ELEM=3 signal to STATE component 2167. Meanwhile the data value is applied to the D_IN terminal of data register 2133.

At the third clock cycle, one of the three STATE components 2165, 2166, and 2167 applies a high value to the ELEM=3 line of its NEXT bus. If STATE component 2166 was activated (because the data value was in the middle range), a high ACTIVE output from STATE component 2166 is also applied to inverter 2151, resulting in a low control signal to multiplexer 2136. This low signal causes multiplexer 2136 to place the original data value on its output terminal, which is applied to the D_IN terminal of data register 2138. Otherwise, if STATE component 2166 was not activated, inverter 2151 applies a high value to multiplexer 2136. In this case, a new value calculated by element 2134, which is the original data value divided by 8, is placed on the output terminal of multiplexer 136. (Recall that the data compression algorithm being implemented divides by 8 the values at the upper and lower parts of the range.) This quotient is applied to the D_IN terminal of data register 2138.

At the fourth clock cycle, one of STATE components 2168, 2169 and 2170 is activated, again depending upon the range of the data value to be compressed. If the data value is in the low range, STATE component 2168 causes multiplexer 2137 to place a zero value on its output bus. If the data value is in the high or middle range, STATE component 2168 will not be activated and will cause multiplexer to place onto its output bus the value on its upper input bus. If the data value is in the high range, STATE component 2170 causes multiplexer 2135 to place the value "128" on its output bus. This value is then forwarded by multiplexer 2137 to the B input terminal of ADD_SUB accumulator 2139. If the data value is in the middle range, STATE component 2170 provides a low control value to multiplexer 2135 so that multiplexer 2135 places the value "384" on its output bus, this value being forwarded by multiplexer 2137 to ADD_SUB accumulator 2139. Also if the data value is in the middle range, STATE component 2169 causes ADD_SUB accumulator to operate in its subtract mode, subtracting the value on its B input terminal (384) from the value on its A input terminal (the original data value). The difference is placed on the output terminal of ADD_SUB accumulator 2139, and thus on the D_IN terminal of data register 2140. The other possible results can be understood from the above description.

At the fifth clock cycle, data register 2140 applies the value on its D_IN bus to the DATA_OUT bus as the compressed data signal.

While a first data value is progressing through the system, subsequent values may also be simultaneously progressing through the system. In this case, while a first data value is being processed by the logic between data register 2138 and data register 2140 under the control of STATE components 2168, 2169, and 2170, a second data value is being processed by the logic between data registers 2133 and 2138 as controlled by STATE components 2165, 2166, and 2167, and a third data value is being processed by the logic between data registers 2130 and 2133 under the control of STATE component 2162 and IF components 2163 and 2164. A fourth data value may be waiting at the DATA_IN input of data register 2130 for the next clock cycle. Thus with pipelining, even though the calculation requires five clock cycles, a new data value may appear at the DATA_OUT terminal every clock cycle. And because the three paths through the state machine are synchronized with each other and with the data registers of the pipeline, there is no conflict between multiple active states.

In another implementation of the design, comparators 2131 and 2132 are eliminated by replacing IF components 2163 and 2164 with the comparator-IF components discussed below in connection with FIGS. 24a and 24b.

Invalid State Elimination

Invalid states occur under certain conditions including but not limited to power glitches, improper power-up actions, or race conditions on asynchronous inputs. The most likely producer of invalid states in a state machine is activation of both branches of a conditional branch component. Another is failure to become inactive when the next state is activated. A state machine implementation which fails to account for invalid states may get into an infinite loop or provide unpredictable results. The method and symbols of the present invention offer the user several options of eliminating invalid states if they should occur.

The state machine components described above use a high flip flop output to represent an active state. In the reentrant state machines such as shown in FIG. 21, several states may legitimately be active simultaneously. The invalid state elimination structure and method allow only one active state. Therefore, the invalid state elimination structure and method would not be used for such a design. However, in many state machines, only one state should be active, and the invalid state elimination method and structure assure this result.

Two structures and methods for eliminating invalid states will be described. The first form of protection provides recovery from multiple states being active in a loop and prevents descendants of an active state from becoming active simultaneously with the active state. A second form of protection prevents activation of both branches of a conditional branch component. In one embodiment, both forms of protection are used, though each may be used separately.

Figure 22A:
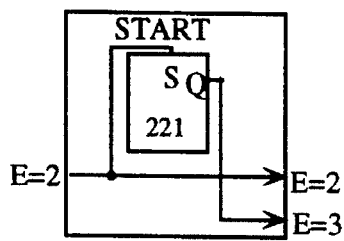
FIGS. 22a through 22h show simplified circuit diagrams of START, STATE, JOIN2, and IF components which do and do not have logic for eliminating invalid states.
Figure 22C:
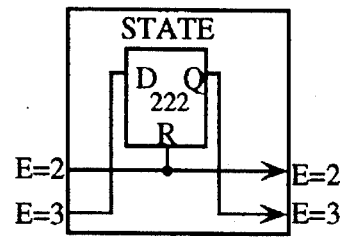

The invalid state elimination logic will be described in connection with FIGS. 22a through 23. To implement both methods of invalid state elimination logic, three new signal lines are added to the flow bus of components, and additional logic is added to the RESET (ELEM=2) path of the STATE component. An XR signal line prevents more than one branch of a decision tree from becoming active. An R1 reset line causes STATE flip flops beyond the next state to be reset. An ER signal allows the Q output of the first STATE-IS component past a JOIN2-IS component to force a reset on all states beyond itself. This assures that all loops are restricted to a single active state.

For comparison, FIGS. 22a, 22c, 22e and 22g illustrate in simplified form the circuits of FIGS. 6b, 7b, 8b, and 9b respectively. In their simplified forms, FIGS. 22a, 22c, 22e and 22g do not show the clock and clock enable lines. Also, the bus is not shown, rather the individual bus lines are illustrated. FIGS. 22b, 22d, 22f, and 22h illustrate, in this same simplified form, components which can be included in a library of components to provide recovery from invalid active states. Like FIGS. 22a, 22c, 22e and 22g, FIGS. 22b, 22d, 22f, and 22h do not show the clock or clock enable lines, which are of course present in the actual circuit.

Figure 22B:
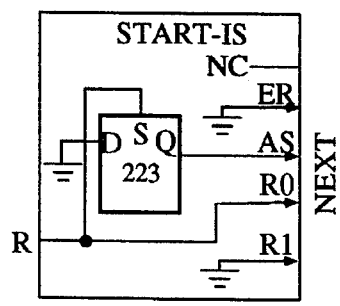
Figure 22D:
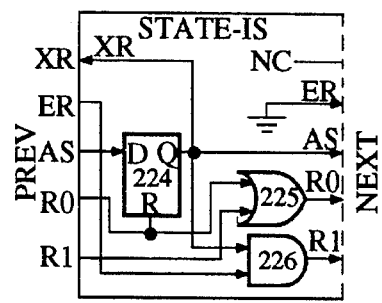
Figure 22E:
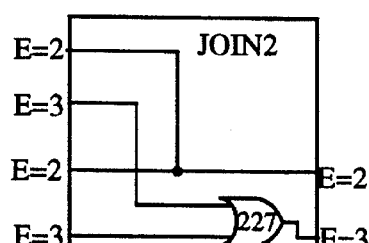
Figure 22G:
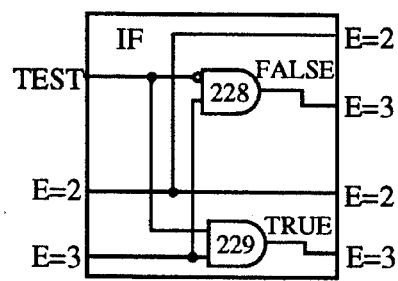

FIG. 22d illustrates a STATE-IS component. Note that the STATE-IS component of FIG. 22d uses different nomenclature from the STATE component of FIG. 22c. Specifically, the active state AS line corresponds to the E=3 line of FIG. 22c. Also, In FIG. 22d, two reset lines R0 and R1 and logic for eliminating invalid active states replace the E=2 line of FIG. 22c. OR gate 225 receives the two reset signals R0 and R1 from its PREV bus and generates an R0 reset signal on its NEXT bus. AND gate 226 receives the Q output signal and a reset enabling signal ER from its PREV bus, and generates the second reset signal R1 on its NEXT bus. Finally, the Q output signal from flip flop 224 is fed back as the XR signal to the PREV bus.

Figure 22F:
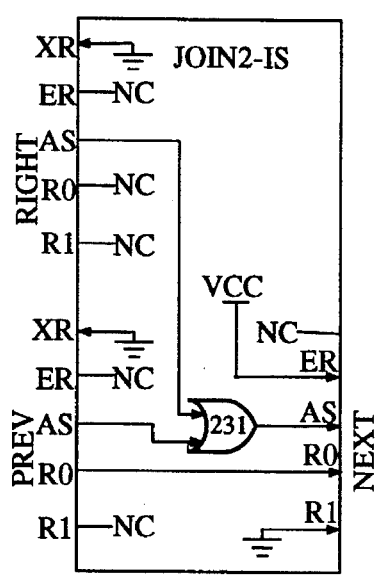
Figure 22H:
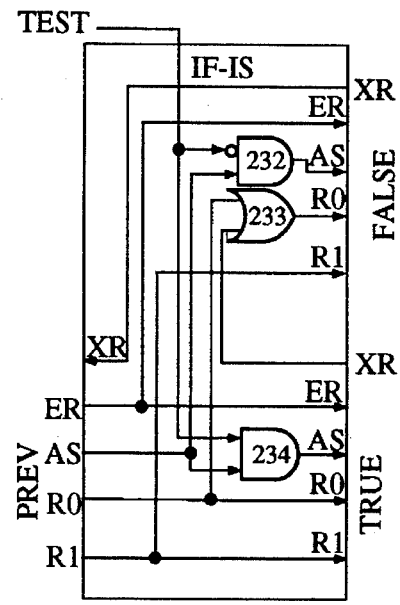

FIG. 22h illustrates an IF-IS component. The IF-IS component can be connected to work with the STATE-IS component of FIG. 22d. Like the IF component of FIG. 22g which uses AND gates 228 and 229 to select which of the TRUE and FALSE E=3 lines to activate, the IF-IS component of FIG. 22h uses AND gates 232 and 234 to select which AS output line to activate. To prevent both outputs of an IF component from becoming active, the IF-IS component of FIG. 22h applies an XR signal (which will be applied by the Q output of a STATE-IS symbol attached to the TRUE bus, see FIG. 22d) to OR gate 233. OR gate 233 also receives the R0 reset signal from a previous component and generates an R0 output signal on its FALSE bus if either the R0 input signal is high or if the XR signal is high.

FIG. 22b shows a START-IS component. This START-IS component is to be used with the STATE-IS, IF-IS, and JOIN2-IS components. The START-IS component receives a reset signal R from another part of the system and in response generates a high AS output signal Q from flip flop 223 to start the state machine. This R signal is also applied to the R0 output terminal, and thus resets all STATE_IS components in the state machine.

FIG. 22f shows a JOIN2-IS component to be used with the STATE-IS and IF-IS components. Like FIG. 22e, the JOIN2-IS component of FIG. 22f uses OR gate 231 to provide a high AS output signal if either of the AS input signals is high. The JOIN2-IS component of FIG. 22f does not forward the RIGHT R0 reset signal. Nor does it forward the R1 reset signal from either the RIGHT or PREV input buses.

Operation of this elimination logic is as follows. Referring to FIG. 22d, a high signal on the R0 reset line resets flip flop 224, thereby producing a low Q output signal. The high R0 signal is also propagated by OR gate 225 to the NEXT bus so that one high R0 signal produces a low Q output signal in any flip flops downstream. The Q output signal, in addition to driving the active state AS line, is also applied to AND gate 226. The other input to AND gate 226 comes from the ER line of the PREV input bus. If there is a JOIN2-IS component driving the PREV bus, or one or more IF-IS components preceded by a JOIN2-IS component, then the ER line will be forced high, allowing the Q output signal of the STATE-IS component next downstream to appear at the output of its AND gate 226. If, however, the PREV bus is driven from a STATE-IS component, then the ER line of the PREV bus is low, forcing a low R1 output of AND gate 226. Thus the Q output of flip flop 224 in one STATE-IS component causes reset of all flip flops 224 in downstream STATE-IS components beyond the immediate next STATE-IS component, and further to the first JOIN2-IS component. Thus in any loop, there is a state which, when active, forces all other states in that loop to be inactive.

The Q output terminal of flip flop 224 further provides the XR feedback reset signal. This XR feedback signal eliminates invalid states resulting from an IF component. Thus, when the IF-IS component is connected at its TRUE bus to a STATE-IS component such as shown in FIG. 22d, a high Q output signal which generates a high XR output signal causes the IF-IS component to generate a high R0 output signal on its FALSE bus. This high R0 signal causes a STATE-IS component connected to the FALSE bus of the IF-IS component to be reset to generate a low Q output signal, thereby indicating an inactive state. Thus STATE-IS components connected to both the TRUE and FALSE buses of the IF-IS component will never both be active simultaneously. Note that the IF-IS component also passes the XR signal applied to its FALSE flow bus back to its PREV flow bus to facilitate nesting of IF-IS components (explained in connection with FIG. 23).

It is important that the R0 and R1 lines of the JOIN2-IS component not propagate to the NEXT bus of the JOIN2-IS component. In fact, this discontinuity prevents the invalid state elimination logic from looping a reset signal back to the state which should legitimately be active. Instead, the JOIN2-IS component applies a high signal VCC to its output ER line. This high ER line enables the next STATE-IS component to force other STATE-IS components downstream to be reset. Therefore, a loop in which two STATE-IS components and a JOIN2-IS component are placed can recover from multiple active states.

In another embodiment, a global control line (not shown) is added to the flow buses, and when pulled low, disables the invalid state elimination logic. Such a line is useful for a system in which some multiply active states are desirable. Indeed many other embodiments of these functions will become obvious to those skilled in the art in light of the description here.

Example Using Invalid State Elimination Logic

Figure 23:
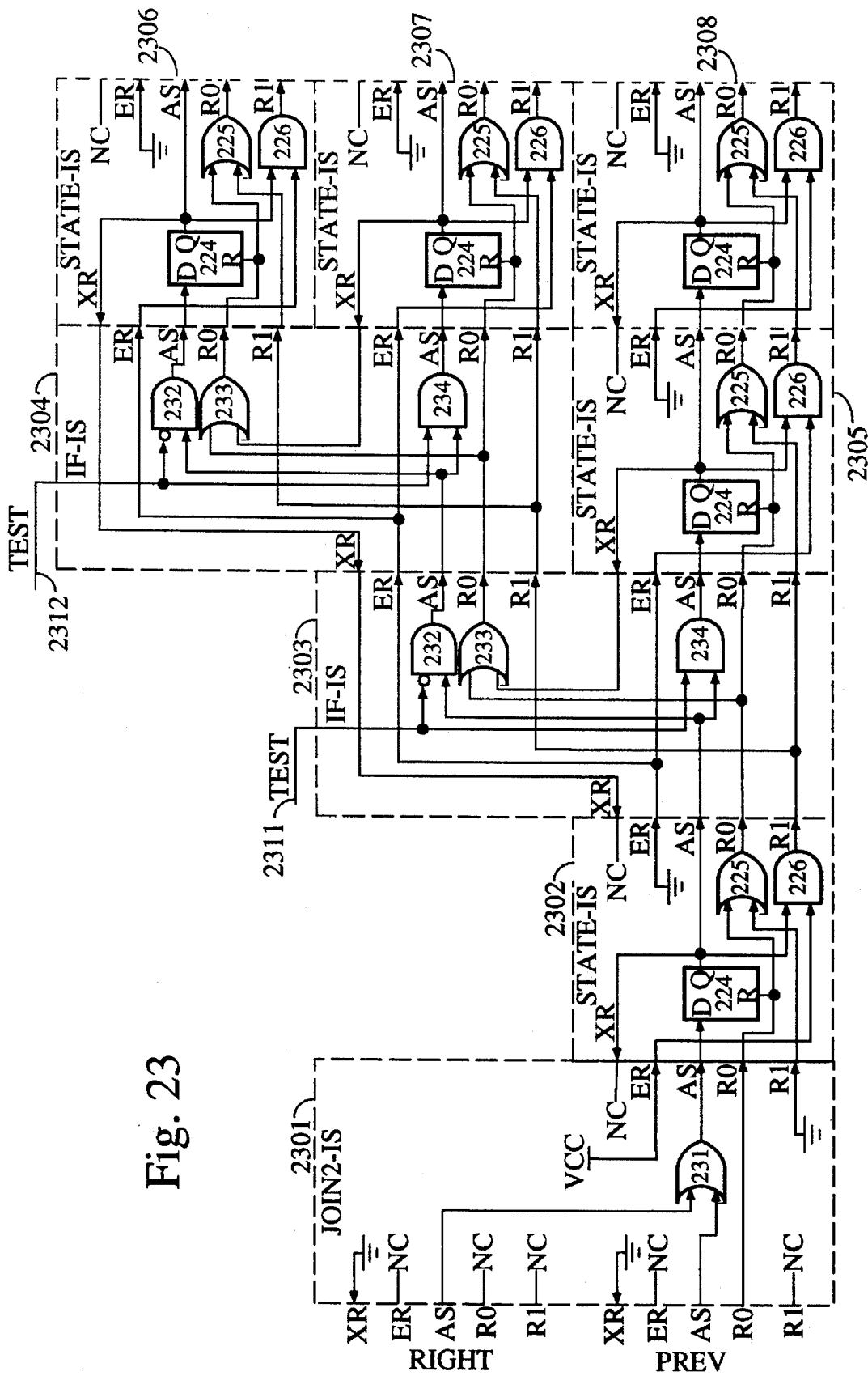
FIG. 23 shows a portion of a state flow diagram using components which have logic for eliminating invalid states.

FIG. 23 shows an illustrative portion of a state diagram in which invalid state elimination components are used. JOIN2-IS component 2301 combines active state AS signals from its RIGHT and PREV flow buses to activate STATE-IS component 2302. Nested IF-IS components 2303 and 2304 select one of STATE-IS components 2305, 2306, and 2307 as determined by TEST signals 2311 and 2312.

As shown in FIG. 23, JOIN2-IS component 2301 forwards the R0 reset signal from its PREV bus to its NEXT bus but does not forward reset signals on its R1 reset line. Thus a RESET signal from a START-IS component (not shown) propagates through JOIN2-IS component 2301. Note that a high R0 reset signal will cause a reset of flip flop 224 of STATE-IS component 2302 and will cause OR gate 225 of STATE-IS component 2302 to send a high R0 reset signal to IF-IS component 2303. This high R0 reset signal in turn applies high R0 signals to both its TRUE and FALSE output buses. (Locations of the TRUE and FALSE output buses are shown in FIG. 22h.) This high R0 signal further propagates through STATE-IS components 2305, 2306, 2307, and 2308. Thus all STATE-IS flip flops are reset in response to a high R0 reset signal.

Since JOIN-IS component 2301 applies a high ER signal to AND gate 226 of STATE-IS component 2302, a high Q output signal from flip flop 224 of STATE-IS component 2302 causes AND gate 226 to apply a high R1 output signal through IF-IS components 2303 and 2304 to OR gates 225 of STATE-IS components 2305, 2306, and 2307. As can be seen with STATE-IS component 2308, the JOIN-IS component causes a RESET of flip flops in STATE-IS components (such as 2308) which are downstream by two from a STATE-IS component (such as 2302) which generates a high R1 output signal.

Looking next at IF-IS components 2303 and 2304, assume that TEST line 2311 carries a low signal and TEST line 2312 carries a high signal, but not quite high enough. This means a high Q output signal for STATE-IS component 2302 will activate STATE-IS component 2307. In the event that the high TEST signal on line 2312 did not properly produce a low input to AND gate 232 of IF-IS component 2304, and the AS line improperly applied a high D input to flip flop 224 of STATE-IS component 2306, the high Q output from STATE-IS component 2307 applied by the XR line to OR gate 233 of IF-IS component 2304 would reset flip flop 224 of STATE-IS component 2306 (as well as any other STATE-IS components downstream, not shown), thus preventing an erroneous result from an insufficiently high TEST signal on line 2312.

Additional Components

For additional flexibility, components having certain additional features are included in a library. Instead of some of the values being entered by a user, components can take values from input buses, to allow a value to be generated within the system and used as a test value. Further, a test bus related to one or a few components can be merged with a flow bus related to the entire system, as will be discussed below in connection with the VECTOR components.

Comparator IF Component

Figure 24A:
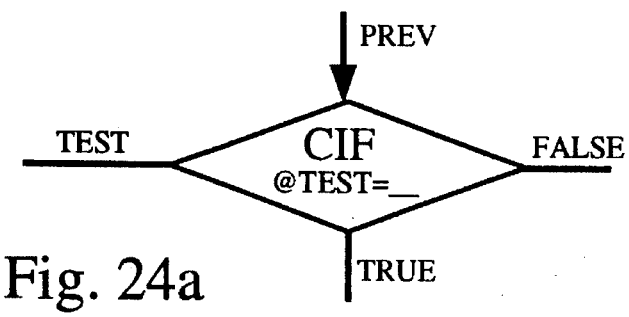
FIGS. 24a and 24b show a symbol and equivalent circuit for a comparator IF component.
Figure 24B:
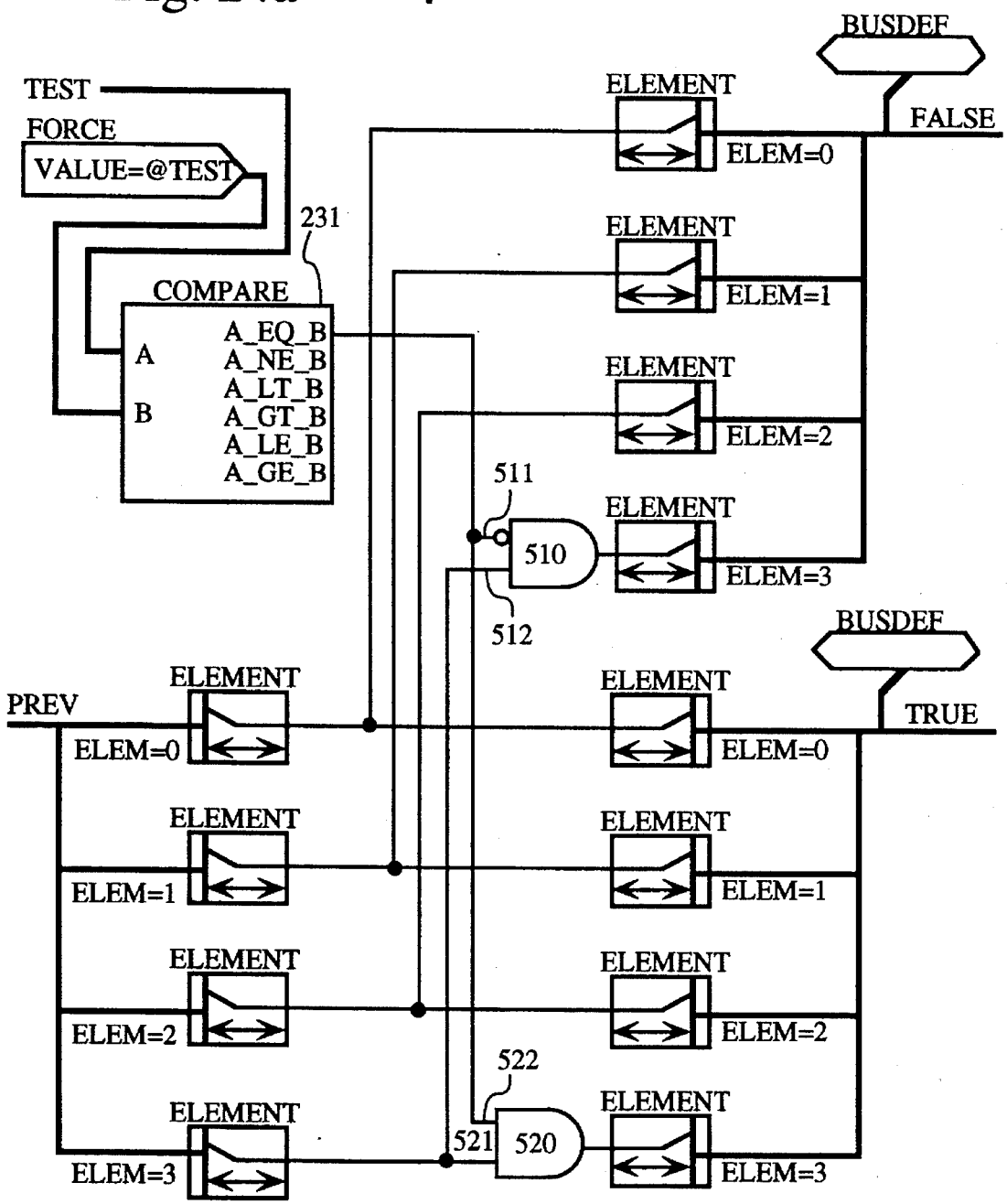

FIGS. 24a and 24b show a symbol and circuit for a comparator if or CIF component. This component is similar to the IF component shown in FIGS. 9a and 9b. However, the CIF of FIGS. 24a and 24b branches to the TRUE bus only if a value on a TEST bus matches a value entered on the CIF symbol. As shown in FIG. 24b, COMPARE block 231 compares a value on the A input bus to a value on the B input bus and can be connected to provide several outputs. For example, on the A_EQ_B output terminal, COMPARE block 231 provides a high output when A equals B. On the A_NE_B output terminal a high output is provided when A is not equal to B. On the A_LT_B output terminal the signal is high when A is less than B. Other inequalities cause high signals on the remaining terminals. As shown, AND gates 510 and 520 are connected to the A_EQ_B output terminal and thus receive a high signal when A is equal to B.

Clearly many other IF-type components can also be provided by including components having different connections. For example a "greater than" comparator component is implemented by connecting AND gates 510 and 520 to the A_GT_B output terminal of COMPARE block 231.

Coded CALL Component and SUBROUTINE Component

A more advanced method of handling subroutine calls is needed in a system which will place more than one call to the same subroutine at one time. FIGS. 25a and 25d show a coded call CCALL component and its circuit which can be used when the subroutine is to be called from more than one location in the state machine. The CCALL components are used in conjunction with a SUBROUTINE component and possibly with a type of join component such as the 2-BUS JOIN component shown in FIGS. 25b and 25e. FIGS. 25c and 25f show the SUBROUTINE component and its circuit.

FIGS. 25d, 25e, and 25f are arranged to show how the signal lines of these components may be connected in a circuit if the three symbols show in FIGS. 25a, 25b, and 25c are used together. For simplicity, clock and clock enable lines are not shown. In a system using these symbols, each CCALL component which calls a particular subroutine will be assigned a different code number. Thus the FORCE VALUE=@CODE symbol 253 of CCALL circuit 2501 will have a different value from each other CCALL circuit used in the same system with the same SUBROUTINE component 2503. A high ACTIVE signal applied to CCALL component 2501 causes AND bus 251 to apply the value in cell 253 to its output terminal. This value is applied through OR bus 256 of 2-BUS JOIN2 component 2502 to the DATA_IN port of SRAM 258 in SUBROUTINE component 2503. The ACTIVE signal applied to CCALL component 2501 is also propagated through OR gate 257 of 2-BUS JOIN2 component 2502 to the ACTIVE line of SUBROUTINE component 2503, which increments a counter 259 and pushes the DATA_IN value onto a stack in SRAM 258. The ACTIVE signal is propagated by SUBROUTINE component 2503 to the body of the subroutine, not shown, which commences performing its task.

The designer must take care that a subroutine is not called from one branch of a state machine while it is responding to a call from another branch of the state machine. If a second call to the subroutine occurs while the body of the subroutine is still responding to the first call, the code associated with the CCALL component invoking that call of the subroutine will again be pushed onto the stack in SRAM 258 as counter 259 is incremented. Since a stack is a last-in-first-out device, the state machine will return to the wrong branch of the state diagram. However, it is acceptable for a subroutine to call itself, as discussed below in connection with FIG. 26.

After the body of the subroutine has completed its task, a high RETURN signal is propagated back through SUBROUTINE component 2503 and 2-BUS JOIN2 component 2502 to CCALL component 2501. The RETURN signal decrements COUNTER 259 in SUBROUTINE component 2503, and thus causes SRAM 258 of SUBROUTINE component 2503 to remove the code of CCALL component 2501 from the STACK and apply the value on its DATA_OUT port through 2-BUS JOIN2 component 2502 to the B input port of COMPARE circuit 252 of CCALL component 2501. The value will be propagated through 2-BUS JOIN2 component 2502 to other components such as another CCALL component, not shown, which will carry a different code. If the value at B in CCALL component 2501 matches the value at A, a high signal at the A_EQ_B terminal of COMPARE circuit 252 is applied to an input of AND gate 255, which may be connected to another STATE component, but in any case initiates further downstream activity upon completion of the subroutine.

If the value at the B port of CCALL component 2501 does not match the value at the A port, then the RETURN signal did not apply to CCALL component 2501, and downstream activity is not initiated by AND gate 255 of CCALL component 2501. That CCALL symbol with a matching code will activate its NEXT flow line, as SUBROUTINE component 2503 removes the value from its stack.

Example Recursive State Machine

Figure 26:
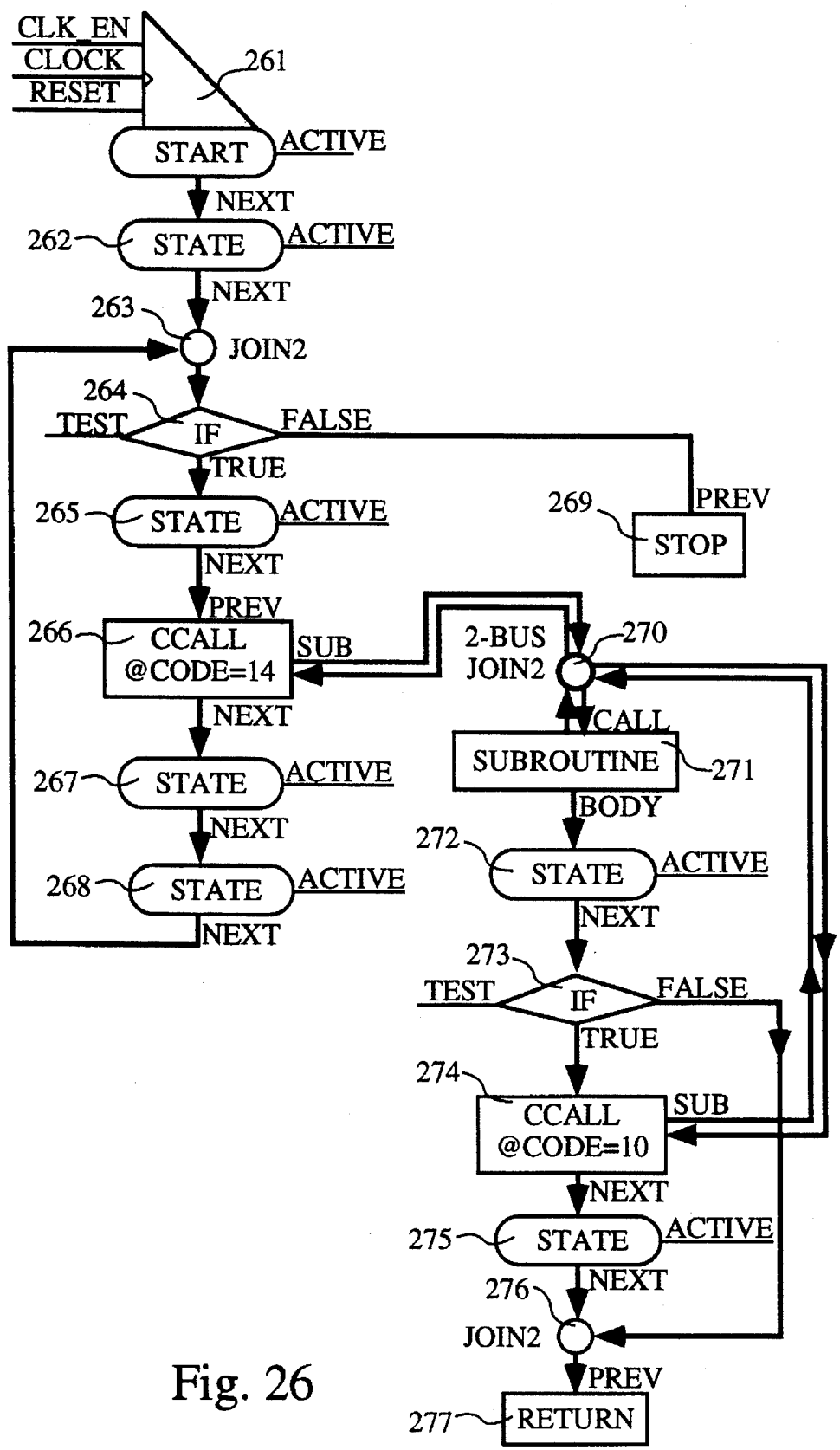
FIG. 26 shows a recursive state machine using the CCALL component, the 2-BUS JOIN2 component and the SUBROUTINE component.

FIG. 26 shows the state flow portion of a system which uses the CCALL, 2-BUS JOIN2, and SUBROUTINE components illustrated in FIGS. 25a–25f.

After receiving a RESET signal the system moves from START component 261 to STATE component 262, and at the next clock cycle through JOIN2 component 263 and IF component 264 to either STATE component 265 or STOP component 269 depending upon the high or low value of a signal on the TEST line of IF component 264. If the TEST signal is high, at the next clock signal, the system moves to STATE component 265, and at the following clock signal to CCALL component 266. CCALL component 266 has been assigned a code of 14. Therefore CCALL component 266 applies the value 14 to a portion of its SUB bus, which passes through 2-BUS JOIN2 component 270 to SUBROUTINE component 271, which stores the value 14 on its stack, and activates STATE component 272. As discussed earlier, the ACTIVE line of STATE component 272 may be connected to a logic function, which responds to the high ACTIVE signal. At the next clock cycle, IF component 273 is activated by STATE component 272. If the TEST line of IF component 273 is FALSE, JOIN2 component 276 activates RETURN component 277, which applies a high RETURN signal through JOIN2 component 276 to IF component 273, and in turn to STATE component 272, and SUBROUTINE component 271. Ad discussed in connection with FIG. 25f, SUBROUTINE component 271 decrements its counter 259 (See FIG. 25f) and applies the value in its stack to its DATA_OUT port, which is propagated through 2-BUS JOIN2 component 270 (FIG. 26) to CCALL component 266. Since the value 14 matches the value stored in the stack of SUBROUTINE component 271, CCALL component 266 applies a high ACTIVE signal to its NEXT bus, thereby activating STATE component 267. At the next clock cycle, STATE component 268 becomes active, after which the system cycles back through JOIN2 component 263 to STATE component 265.

Note that RETURN component 277 also applies a high RETURN signal through STATE component 275 to CCALL component 274. Therefore CCALL component 274 compares the value 14 on the RETURN CODE portion of its SUB bus to its own CODE, which is 10. Since these values do not match, CCALL component 274 does not send a signal on its NEXT bus to activate STATE component 75.

If the TEST signal to IF component 273 is high at the time STATE component 272 is active, IF component 273 activates (i.e., provides a high signal to) its TRUE bus in response to an ACTIVE signal on the NEXT bus of STATE component 272. This high signal on the TRUE bus in turn activates CCALL component 274. CCALL component 274 sends a code of 10 via 2-BUS JOIN2 component 270 to SUBROUTINE component 271. Subroutine component 271 stores the value in its stack, and the active state moves to STATE component 272. Assuming the TEST signal to IF component 273 is still high, CCALL component 274 sends another code of 10 via 2-BUS JOIN2 component 270 to SUBROUTINE component 271. Thus, the system continues to cycle through the loop of components 274, 270, 271, 272, 273 until the TEST signal to IF component 273 goes low. In this manner, several codes of 10 are stored in the stack of SUBROUTINE component 271, the number of codes being equal to the number of cycles through the loop.

When a low TEST signal is received by IF component 273, the FALSE bus is activated, sending a signal through JOIN2 component 276 to RETURN component 277. The high signal generated by RETURN component 277 propagates back through JOIN2 component 276, IF component 273, and STATE component 272 to SUBROUTINE component 271, where this high RETURN signal causes SUBROUTINE component 271 to place a code of 10 on its DATA_OUT line (see FIG. 25f), which is recognized as a match by CCALL component 274. Thus STATE component 275 is activated as SUBROUTINE 271 deletes one of the code 10 values from its stack. The system thus cycles through STATE component 275 for the number of times that the code 10 value was added to the stack of SUBROUTINE 271. Finally, when SUBROUTINE 271 places a value 14 on its RETURN CODE bus, CCALL component 274 does not recognize the value 14 and thus does not activate STATE 275; but CCALL component 266 does recognize the value 14, and thus activates STATE component 267. The system continues to cycle until a low TEST signal is received by IF component 264. When IF component 264 receives a low TEST signal, the system activates STOP component 269, which ends activity of the state machine.

It can be seen that two different bus configurations are used in the system of FIG. 26. A two-bus (or wide bus) configuration connects the CCALL, 2-BUS JOIN2 and SUBROUTINE components, while a bus configuration typically having five bus lines such as described in connection with FIGS. 13b, 14b, and 17b is used with the other components. Mixing of the two bus configurations is internally consistent since the CCALL, 2-BUS JOIN2 and SUBROUTINE components are connected only to each other.

Complete Library Uses Several Bus Sizes

In a complete library, a set of basic symbols usable for simple designs will be available. A further set of symbols having more sophisticated features such as the invalid state elimination feature will also be available for those desiring the more sophisticated features. Another set usable for branching state machines and reentrant designs will be available for users desiring those features. Another set usable with recursive state machines may also be available.

VECTOR Components

Even in a design using sophisticated symbols, it is preferable to use the simple symbols where possible because these require less hardware to implement. Included in a library which includes these more sophisticated symbols is preferably a VECTOR symbol which allows the bus size to change, so the simple symbols usable in one part of a design may be combined with more sophisticated symbols used in another part of the design.

FIGS. 27a and 27b show the symbol and related circuit for a VECTOR1 component in which a single line is added to a bus. FIG. 27c illustrates the circuit of FIG. 27b in simplified form in combination with STATE3 and STATE4 components having a fourline bus width and a five-line bus width, respectively.

FIGS. 27d and 27e show the symbol and related circuit for a VECTOR3 component and its circuit, which adds 3 lines ELEM=A, ELEM=B and ELEM=C from one bus to another bus having lines ELEM=0 ELEM=1, ELEM=2, and ELEM=3. The resulting NEXT bus is a seven-line bus having lines ELEM=0 through ELEM=6. VECTOR components of other widths are also provided in other embodiments.

FORR and FORI Components

Another useful pair of components, related to the FOR component, are a repeating FORR component and its related FORI component. When several FOR components are needed, all of which use the same count, it is possible to avoid having separate counters for each FOR component. Instead, one FORR component having one counter is used, and a plurality of FORI component are linked to the FORR component. Thus only one counter is needed to implement the count.

Figure 28A:
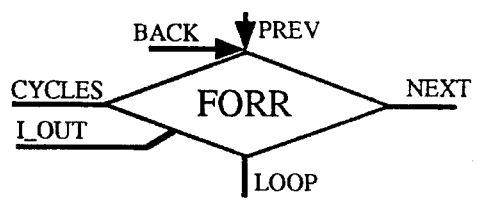
FIGS. 28a and 28b show a FORR component and its circuit.
Figure 28B:
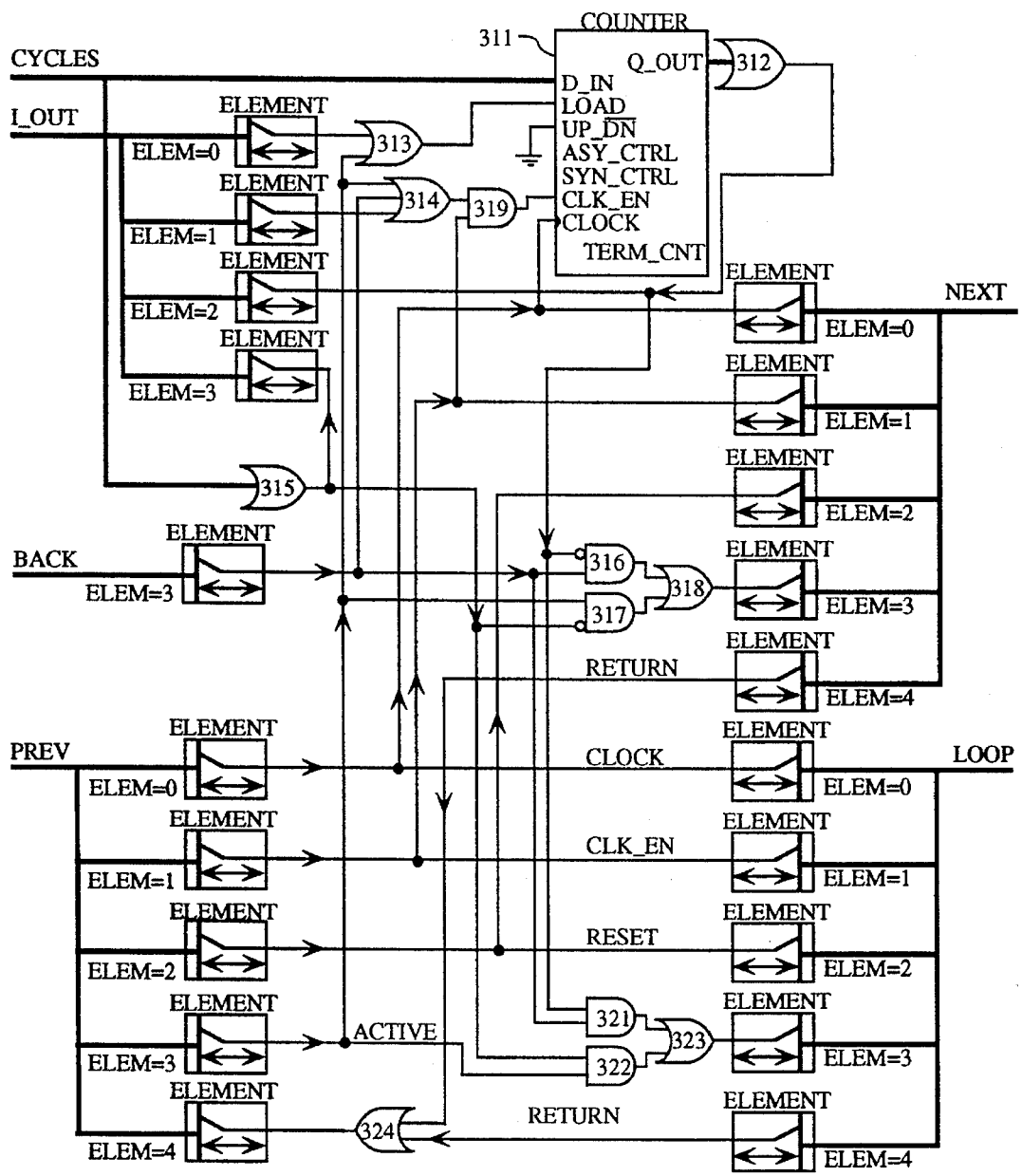
Figure 29A:
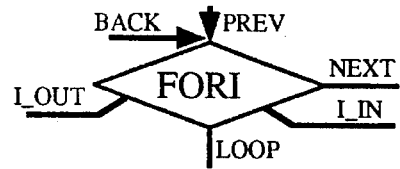
FIGS. 29a and 29b show the related FORI component and its circuit.
Figure 29B:
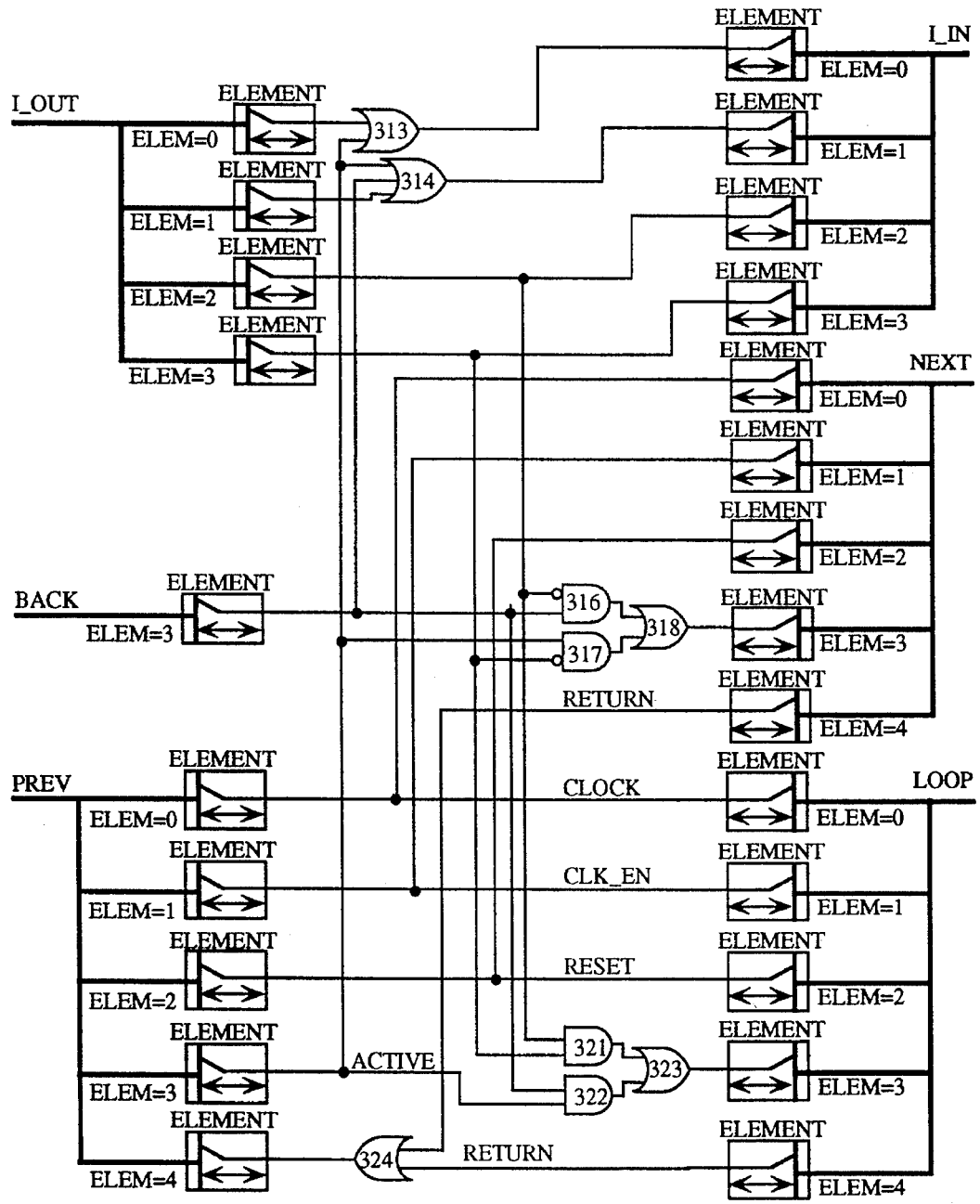

FIGS. 28a and 28b show the FORR component, and FIGS. 29a and 29b show the FORI component. The FORR component of FIG. 28a and 28b includes one more bus than the FOR component of FIGS. 12a and 12b. The I_OUT bus communicates with FORI components linked to the FORR component. In the particular embodiment of FIG. 28b, a CYCLES bus receives a count value from another part of the system. In another embodiment, the user enters a number of cycles for the for-loop, as was discussed and shown in FIGS. 12a and 12b. Logic gates having the same functions in FIGS. 28b and 29b are given the same reference numerals in the two drawings.

In operation, when multiple for-loops are to be used, each with the same count value, one FORR component is used to implement one for-loop, and all other for-loops using the same count value are implemented by FORI components linked to the FORR component counter through I_OUT and I_IN buses. Specifically, the I_IN bus of one FORI component is connected to the I_OUT bus of another FORI component or of the FORR component.

As can be seen in FIG. 28b, provided the ELEM=1 line of the PREV bus is providing a high CLK_EN signal, AND gate 319 passes the clock enable signal from OR gate 314 to the CLK_EN terminal of counter 311. A high clock enable signal is generated by OR gate 314 in response to a high ACTIVE signal on the ELEM=3 line of the PREV bus, a high ACTIVE signal on the ELEM=3 line of the BACK bus, or a high ELEM=1 signal on the I_OUT bus (the clock enable signal from a FORI component). OR gate 313 initiates loading of a new count value from the CYCLES bus. The high LOAD signal from OR gate 313 is initiated by either a high ACTIVE signal from the ELEM=3 line of the PREV bus or from the ELEM=0 line of the I_OUT bus. In either case, the high LOAD signal causes counter 311 to begin counting down for the number of clock cycles indicated on the CYCLES bus.

If the count was initiated by a high ELEM=3 value on the PREV bus of the FORR component, on the first clock signal while the ELEM=3 line of the PREV bus is high, a high signal from OR gate 315 causes AND gate 322 to generate a high signal. This high signal is passed by OR gate 323 to the ELEM=3 line of the LOOP bus. As discussed in connection with FIGS. 12a and 12b, the high signal on the ELEM=3 line of the LOOP bus results in a high ELEM=3 signal on the BACK flow bus. Thus, at the next clock cycle, a combination of the high signal from OR gate 312 and the high output of OR gate 315 which is driven by a nonzero @CYCLES value, AND gate 321 provides a high value to OR gate 323. A high value is driven by OR gate 323 until counter 311 reaches zero, whereupon OR gate 312 provides a low signal. This low signal produces a low output from AND gate 321, which in combination with a low output from AND gate 322 produces a low ELEM=3 signal on the LOOP bus. At this point AND gate 316 provides a high ELEM=3 signal on the NEXT flow bus to continue the operation.

If there is no high ELEM=3 signal on the PREV bus of the FORR component, but there is a high ELEM=3 signal on the PREV bus of a FORI component such as shown in FIG. 29b, AND gate 322 of FIG. 28b does not produce a high signal to initiate the loop in FORR component of 28b. Instead the FORI component having a high ELEM=3 signal initiates its own loop with a high signal from its own AND gate 322. The high ELEM=3 signal in the FORI component causes OR gate 313 of the FORI component to provide a high ELEM=0 signal on its I_IN bus. This high signal propagates through any other FORI components in the chain to OR gate 313 of the FORR component, where it initiates loading a count value. Since the BACK bus of the FORR component is not providing a high ELEM=3 value to AND gate 321 of the FORR component, this count value does not activate the loop in the FORR component. However the high output from OR gate 312 propagates back through the ELEM=2 line of the I_OUT bus of the FORR component and the ELEM=2 line of any intervening FORI components. This high signal is applied to AND gates 321 of any intervening FORI components. However, since the BACK buses of the intervening FORI components are not providing a high signal to AND gates 321, no response is initiated. In the FORI component which initiated the count, the BACK bus is generating a high signal, so in this component the loop remains active until the count is done.

During the time the FORI component is active, its BACK bus is providing a high signal to its OR gate 314. OR gate 314 propagates a high signal on the ELEM=1 line of the I_IN bus through any other FORI components to the CLK_EN input of counter 311, thus enabling the clock signal to operate counter 311 of the FORR component. The ELEM=3 line of the FORR component (and also any FORI components) carries a high signal as long as the CYCLES value is not zero, and allows the loop to be initiated.

When the count is done, a low signal output from OR gate 312 of the FORR component propagates through the ELEM=2 line of the I_OUT bus, applying a low input to AND gate 321 of the FORI component and of course to AND gate 321 of any other FORI components. The ELEM=3 line of the LOOP bus of the FORI component goes low. The low ELEM=2 line of the I_IN bus of the FORI component produces a high inverted input to AND gate 316 of all FORI components. The FORI component which has been active still carries a high signal on the ELEM=3 line of its BACK bus. Thus AND gate 316 sends a high signal to OR gate 318, which results in a high ELEM=3 signal on the NEXT bus of the active FORI component. Thus the FORI component has completed its task using the counter of the FORR component without activating any other FORR or FORI components in the chain. Moreover, only the single counter 311 was used, thus minimizing silicon area.

Note that because the FORR and FORI components in a chain use the same counter, this implementation must not be used when more than one component in the chain may be active at one time.

Circuits which use only a single counter can be provided for the PAUSE function, for example a PAUSER and PAUSEI pair of library elements which use only one counter in a chain.

Deleting of Unused Logic

Another option which may be used with the present invention is to delete unused logic from a user's design before implementing the design in programmable hardware. For example, a JOIN3 component may be used to join only two incoming buses. Or a state symbol having a return line may be used where no return line is needed. For another example, a VECTOR8 symbol may be included in a library and used to add 1 to 8 lines to a bus. Any unused lines would be deleted before implementing the design in hardware. This logic deleting allows a set of complex state machine components to be implemented more simply when the needs are simple, thus achieving efficient use of the hardware without requiring a large library of symbols.

The above description is meant to be illustrative only, and not limiting. For example, although the state flow symbols shown in the figures have been given particular appearances and particular names, other appearances and names can alternatively be used. Further, symbols having variations in the input and output terminals accessing the symbols may be provided.

Further, although the present invention has been described in considerable detail with reference to certain state flow components which can be combined with logic symbols, other embodiments are possible. For example, the state flow components can be incorporated into a dedicated CAE software program, instead of being added as a library to an existing schematic capture package.

Further, additional state flow components may be defined and employed. For example, the simple START symbol and circuit may be replaced by a loop start component in which activity is initiated either by a RESET signal as described previously or by an output signal of another state component applied to the D input of a flip flop. A component which combines the lines and logic of the illustrated STATE component with a VECTOR component may be provided.

Additional circuitry for eliminating invalid states can be included. Other implementations than the one shown may also be done. Logic for testing that a design will not activate two states in a loop may be provided. Therefore, the spirit and scope of the appended claims should not be limited to the description of the versions contained herein.

Further, although the present invention has been described in connection with field programmable logic array chips such as available from Xilinx, Inc., the invention is not limited to field programmable chips, or to logic array chips. Mask programmable chips such as ASIC devices and even custom chips may be designed using the structure and method described herein.

I claim:

1. In a computer system having a computer memory, a computer implemented process for generating a netlist for a circuit design comprising the computer implemented steps of:

receiving and storing in the computer memory a first portion of the circuit design using at least one state flow component, each state flow component having an associated flow diagram symbol and an underlying circuit design associated with the flow diagram symbol;

receiving and storing in the computer memory a second portion of the circuit design using at least one schematic component linked by signal path segments, each schematic component having an associated schematic symbol;

receiving and storing in the computer memory a signal path segment for transmitting a signal from one of the at least one state flow component to one of the at least one schematic component;

displaying the first portion on a video terminal as a flow diagram representing state flow information as paths between states in the first portion of the circuit design, the second portion as a schematic diagram and the signal path segment as a line connecting the schematic diagram and the flow diagram; and generating and storing in the computer memory a list of hardware units and connections incorporating the first and second portions of the circuit design and the signal path segment between the state flow component and the schematic component.

2. A process of claim 1 wherein the first portion of the circuit design is a state machine and the state flow component is a STATE component including an input bus, an output bus and an ACTIVE terminal connected to the schematic component, the STATE component generating a high output signal at the ACTIVE terminal when the state machine is in a state associated with the STATE component.

3. A process of claim 2 wherein the STATE component comprises a flip-flop which receives signals from the input bus including an input signal line and a clock signal line, transmits a high output signal from a Q output terminal one cycle of the clock signal after receiving a high signal on the input signal line, the high output signal being transmitted to both the schematic component and to a second state flow component connected to the output bus.

4. A process of claim 1 wherein the first portion of the circuit design is a state machine and the state flow component is an IF component having a PREV terminal for receiving an output signal from another state flow component, a TEST terminal for receiving a TEST signal, a FALSE output terminal for forwarding the signal from the PREV terminal when the TEST signal is low, and a TRUE output terminal for forwarding the signal from the PREV terminal when the TEST signal is high.

5. A process of claim 1 in which the first portion of the circuit design is a state machine and the state flow component is a JOIN component having at least two input buses for receiving input signals from other state flow components, and an output bus for providing a high output signal when an input signal on either of the input buses is high;

the JOIN component receiving on one of its input terminals the output signal from the first STATE component.

6. In a computer system comprising a data entry device, and a memory, a system for generating a netlist representing a circuit design, said system comprising:

computer implemented means for storing schematic components in the computer, the schematic components including associated schematic symbols displayed on a video terminal controlled by the computer, and signal paths, the schematic symbols and signal paths forming a schematic diagram representation of a first portion of the circuit design;

computer implemented means for storing state flow components connectable by flow bus lines to form a second portion of the circuit design, the state flow components including associated state flow symbols displayed on the video terminal; and flow bus lines;

said state flow symbols and flow bus lines forming a state flow diagram representing state flow information as one or more paths between states in the second portion of the circuit design; and computer implemented means for specifying at least one path linking said first and said second portions;

computer implemented means for converting the first and second portions of the circuit design into a netlist representation of the circuit design.

7. A system for programming a programmable logic device to implement a circuit design, comprising:

means for entering a first portion of the circuit design into a computer as state flow components connected by flow bus lines and for storing the first portion of the circuit design in computer memory, the state flow components including state flow symbols linked by the flow bus lines and displayed on a computer video terminal as a state flow diagram;

means for entering a second portion of the circuit design into a computer as schematic components connected by signal paths and for storing the second portion of the circuit design in computer memory, the schematic components including schematic symbols linked by the signal paths and displayed on the computer video terminal as a schematic diagram;

means for storing at least one path linking said first and said second portions; and means for generating a netlist description of the circuit design by combining the first portion and the second portion.

8. A computer readable medium storing an executable schematic capture program, said program having sequences of instructions which, when executed by a processor, cause said processor to perform the following steps:

forming a circuit diagram on a computer video terminal in response to a user selecting state flow components and schematic components from a library and connecting said state flow components by flow bus segments, each state flow component in said library including an underlying circuit design and a state flow symbol and each schematic component including an underlying circuit design and a schematic symbol; and generating a netlist incorporating underlying circuit designs of each of said state flow symbols as connected by said flow bus segments and said schematic components, said netlist including at least one connection between the one of said state flow components and one of said schematic components.

9. A medium as in claim 8 wherein selected schematic components from the library are connectable by signal path segments such that the schematic symbols associated with the selected schematic components and signal path segments are displayed on the computer video terminal as a selected schematic diagram representing a second portion of the circuit design.

10. A medium of claim 9 wherein the first portion of the circuit design includes a first state flow component having an output terminal, the second portion of the circuit design includes a first schematic component having an input terminal, and the first state flow component and the first schematic component are connected by a first signal path segment.

11. A medium of claim 10 wherein the first portion of the circuit design is a state machine and the first state flow component is a STATE component including an input terminal connected to a first flow bus segment, and an output terminal connected to a second flow bus segment and the first signal path segment, and wherein the STATE component generates a high output signal at the output terminal when the state machine is in an active state associated with the STATE component.

12. A medium of claim 11 wherein the STATE component further comprises a D flip-flop receiving signals from the first flow bus segment including an input signal line and a clock signal line, the D flip-flop transmitting the high output signal from a Q output terminal for one cycle of the clock signal after receiving a high input signal, the high output signal being transmitted to both the schematic component and to a second state flow component connected to the second flow bus segment.

13. A medium of claim 12 wherein the second state flow component is an IF component and the circuit design further includes a second STATE component connected to the IF component by a third flow bus segment, a third STATE component connected to the IF component by a fourth flow bus segment, and a second schematic component connected to the IF component by a signal line, the IF component receiving the output signal from the first STATE component and a TEST signal from the second schematic component; wherein the IF component transmits a high signal to an input terminal of the second STATE component if the TEST signal is high and the output signal from the first STATE component is high, and the IF component transmits a high signal to an input terminal of the third STATE component if the TEST signal is low and the output signal from the first STATE component is high.

14. A computer system comprising;
a display;
a processor coupled to said display;
a memory coupled to said processor;
a computer readable medium coupled to said processor, said computer readable medium containing executable program instructions which, when executed by said processor, cause said processor to perform the following steps:
receiving and storing in the memory a first portion of a circuit design using at least one state flow component, each state flow component having an associated state flow diagram symbol and an associated circuit represented by the state flow diagram symbol;
receiving and storing in the memory a second portion of the circuit design using at least one schematic component, each schematic component having an associated schematic symbol;
receiving and storing in the memory a signal path segment for transmitting a signal from one of the at least one state flow components to one of the at least one schematic components;
displaying the first portion as a state flow diagram representing state flow information, the second portion as a schematic diagram and the signal path segment as a line connecting the schematic diagram and the flow diagram; and
generating and storing in the memory a list of hardware units and connections implementing the first and second portions of the circuit design and the signal path segment between the state flow component and the schematic component.

15. The computer system of claim 14 wherein the first portion of the circuit design is a state machine and the state flow component is a STATE component including
an input bus,
an output bus and
an ACTIVE terminal connected to the schematic component, the STATE component generating a high output signal at the ACTIVE terminal when the state machine is in a state associated with the STATE component.

16. The computer system of claim 15 wherein the STATE component comprises circuit elements including a flip-flop which
receives signals from the input bus including an input signal line and a clock signal line,
transmits a high output signal from a Q output terminal one cycle of the clock signal after receiving a high signal on the input signal line, the high output signal being transmitted to both the schematic component and to a second state flow component connected to the output bus.

17. The computer system of claim 14 wherein the first portion of the circuit design is a state machine and the state flow component is an IF component having
a PREV terminal for receiving an output signal from another state flow component,
a TEST terminal for receiving a TEST signal,
a FALSE output terminal for forwarding the signal from the PREV terminal when the TEST signal is low, and
a TRUE output terminal for forwarding the signal from the PREV terminal when the TEST signal is high.

18. The computer system of claim 14 in which the first portion of the circuit design is a state machine and the state flow component is a JOIN component having
at least two input buses for receiving input signals from other state flow components, and
an output bus for providing a high output signal when an input signal on either of the input buses is high;
the JOIN component receiving on one of its input terminals the output signal from the first STATE component.

* * * * *